(12) United States Patent
Nakatani et al.

(10) Patent No.: US 9,272,898 B2
(45) Date of Patent: Mar. 1, 2016

(54) ELECTRIC DEVICE AND METHOD OF MANUFACTURING THE SAME

(71) Applicant: FUJITSU LIMITED, Kawasaki-shi, Kanagawa (JP)

(72) Inventors: Tadashi Nakatani, Kobe (JP); Hisao Okuda, Akashi (JP); Takashi Katsuki, Kobe (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/332,686

(22) Filed: Jul. 16, 2014

(65) Prior Publication Data

US 2014/0367807 A1     Dec. 18, 2014

Related U.S. Application Data

(62) Division of application No. 13/613,424, filed on Sep. 13, 2012, now Pat. No. 8,816,452.

(30) Foreign Application Priority Data

Nov. 29, 2011   (JP) .................................. 2011-259968

(51) Int. Cl.
*H01L 29/84*     (2006.01)
*B81B 3/00*      (2006.01)
(Continued)

(52) U.S. Cl.
CPC ............ *B81B 3/0067* (2013.01); *B81B 3/0021* (2013.01); *H01H 59/0009* (2013.01);
(Continued)

(58) Field of Classification Search
CPC .. B81B 3/0018; B81B 3/0021; B81B 3/0037; B81B 3/0054; B81B 3/0002; B81B 3/00; B81B 3/0035; B81B 3/002; B81B 3/0067; B81B 2203/04; B81B 2203/0118; H01L 29/84; H01L 41/0805; H01H 59/0009; H01H 2057/006
USPC ........ 257/415, E29.324, E29.325; 438/50–52
See application file for complete search history.

(56) References Cited

U.S. PATENT DOCUMENTS 5,579,149 A * 11/1996 Moret ..................... G09F 9/372
                                                  345/109
5,712,609 A *  1/1998 Mehregany et al. ............ 337/70
(Continued)

FOREIGN PATENT DOCUMENTS

CN        101226856 A       7/2008
CN        101777461 A       7/2010
(Continued)

OTHER PUBLICATIONS

Machine translation, He Zhang, Chinese Patent Pub. No. CN 102141576A, translation date: Apr. 18, 2015, Espacenet, all pages.*
(Continued)

*Primary Examiner* — Victoria K Hall
(74) *Attorney, Agent, or Firm* — Kratz, Quintos & Hanson, LLP

(57) ABSTRACT

There is provided an electric device including a base member, a beam elastically deformable to bend upward and having an outline partially defined by a slit formed in the base member, a conductive pattern provided on a top surface of the beam, a contact electrode provided above the conductive pattern, the contact electrode coming into contact with the conductive pattern, and a bridge electrode elastically deformable, the bridge electrode connecting the conductive pattern and a portion of the base member outside the outline.

7 Claims, 46 Drawing Sheets

(51) Int. Cl.
  *H01H 59/00* (2006.01)
  *H01L 41/08* (2006.01)
  *H01L 41/09* (2006.01)
  *H01H 57/00* (2006.01)

(52) U.S. Cl.
  CPC ........ *H01L41/0805* (2013.01); *H01L 41/0933* (2013.01); *B81B 2203/0118* (2013.01); *B81B 2203/04* (2013.01); *H01H 2057/006* (2013.01)

(56) References Cited

U.S. PATENT DOCUMENTS

| | | | |
|---|---|---|---|
| 6,178,033 | B1 | 1/2001 | Ford et al. |
| 6,396,368 | B1 | 5/2002 | Chow et al. |
| 7,427,797 | B2 | 9/2008 | Ohguro et al. |
| 7,540,968 | B2 | 6/2009 | Nguyen et al. |
| 7,567,018 | B2 | 7/2009 | Kawakubo et al. |
| 7,755,459 | B2 | 7/2010 | Nguyen et al. |
| 7,755,460 | B2 | 7/2010 | Nguyen et al. |
| 7,851,976 | B2 | 12/2010 | Nguyen et al. |
| 7,965,159 | B2 | 6/2011 | Nakatani et al. |
| 8,106,730 | B2 | 1/2012 | Nguyen et al. |
| 8,110,761 | B2 | 2/2012 | Nakatani et al. |
| 8,387,443 | B2 * | 3/2013 | King .............. B82Y 35/00 73/105 |
| 8,686,816 | B2 | 4/2014 | Saito |
| 2004/0173872 | A1* | 9/2004 | Park et al. ................ 257/528 |
| 2005/0206986 | A1 | 9/2005 | Akagawa et al. |
| 2005/0225921 | A1* | 10/2005 | Nakatani ............ H01H 59/0009 361/160 |
| 2005/0243396 | A1* | 11/2005 | Fujii ............... G02B 26/0841 359/224.1 |
| 2006/0119227 | A1 | 6/2006 | Ikehashi |
| 2007/0159510 | A1 | 7/2007 | Hong et al. |
| 2007/0176717 | A1* | 8/2007 | Nguyen et al. ................ 335/78 |
| 2008/0174390 | A1 | 7/2008 | Nguyen et al. |
| 2008/0210531 | A1 | 9/2008 | Nakatani et al. |
| 2010/0108480 | A1* | 5/2010 | Nakatani et al. ............ 200/181 |
| 2011/0108400 | A1 | 5/2011 | Hong et al. |
| 2011/0228372 | A1* | 9/2011 | Kato ........................ 359/221.2 |

FOREIGN PATENT DOCUMENTS

| | | | | |
|---|---|---|---|---|
| CN | 102141576 A | * | 8/2011 | ............. G01P 15/18 |
| JP | 2004-281412 A | | 10/2004 | |
| JP | 2007-188866 A | | 7/2007 | |
| JP | 2008-177043 A | | 7/2008 | |
| JP | 2010-108836 A | | 5/2010 | |

OTHER PUBLICATIONS

T. Nakatani et al., PZT-Actuated Reliable RF-MEMS Switch Using Single-Crystal Silicon Asymmetric Beam, 2011, Engineers Australia, Proceedings of the Asia-Pacific Microwave Conference 2011, pp. 554-557, all pages.*

T. Nakatani et al., Single Crystal Silicon Cantilever-Based RF MEMS Switches Using Surface Processing on SOI, 2005, IEEE, pp. 187-190, all pages.*

Chinese Office Action with English translation dated Sep. 12, 2014.

Nakatani et al.: "PZT-actuated reliable RF-MEMS switch using single-crystal silicon asymmetric beam", Proceedings of the Asia-Pacific Microwave Conference 2011, Dec. 5-8, 2011, pp. 554-557.

Nakatani et al.: "Single crystal silicon cantilever-based RF-MEMS switches using surface processing on SOI", 18th IEEE International Conference on Micro Electro Mechanical Systems, 2005, Jan. 30,-Feb. 3, 2005, pp. 187-190.

Japanese Office Action for the Corresponding JP Application No. 2011-259968, mailed on Mar. 24, 2015 with partial translation.

Second Chinese Office Action for the Corresponding CN Application No. 201210400808.X, mailed on May 7, 2015 with full translation.

Office Action of Chinese Patent Application No. 201210400808.X dated Oct. 30, 2015. Full translation of the Office Action.

* cited by examiner

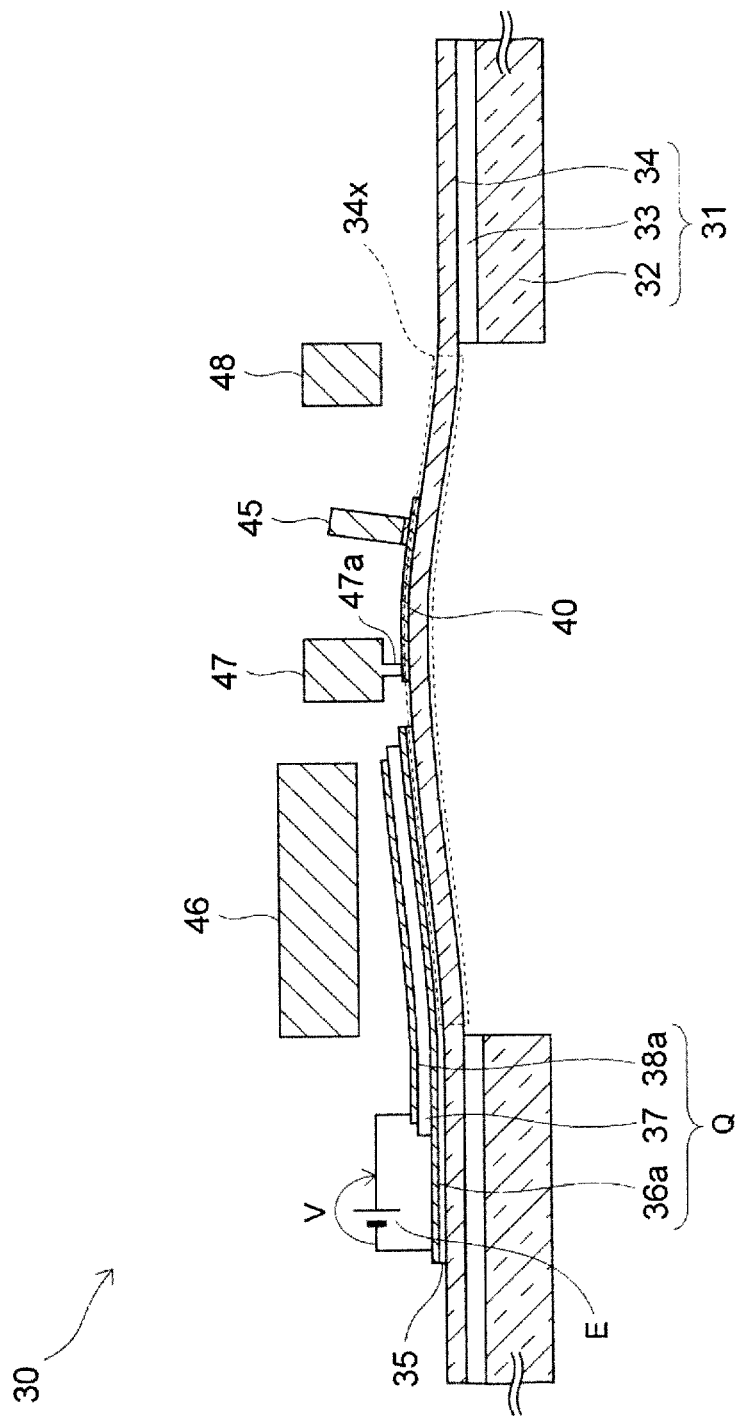

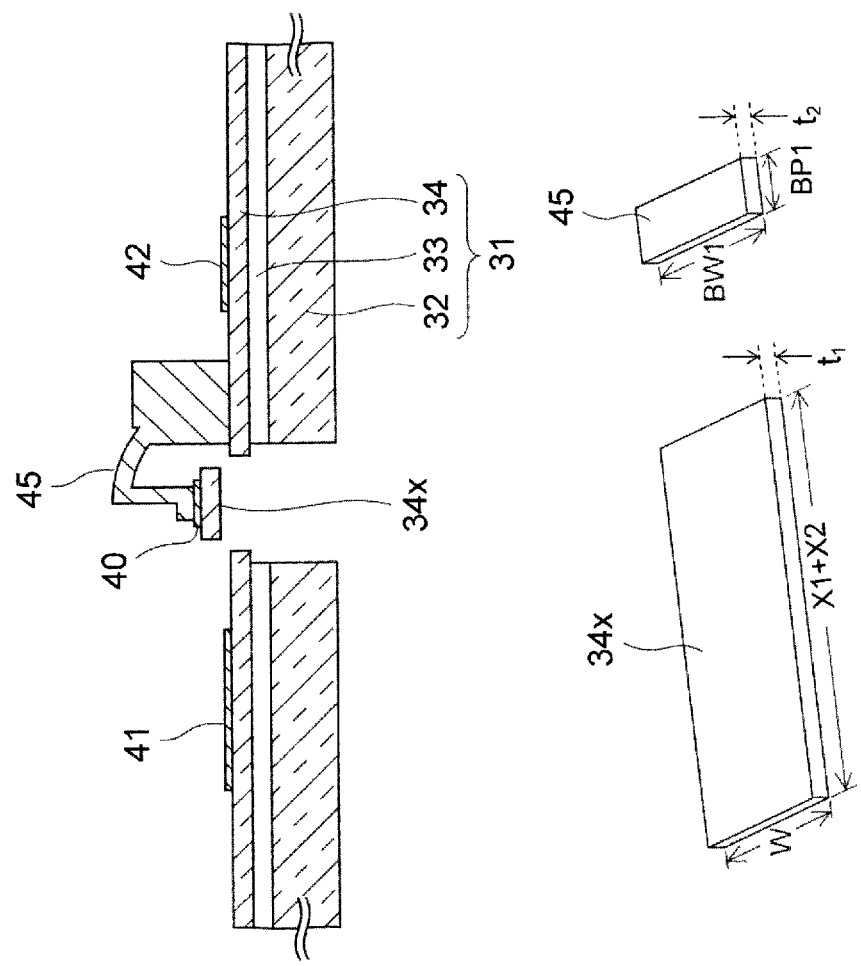

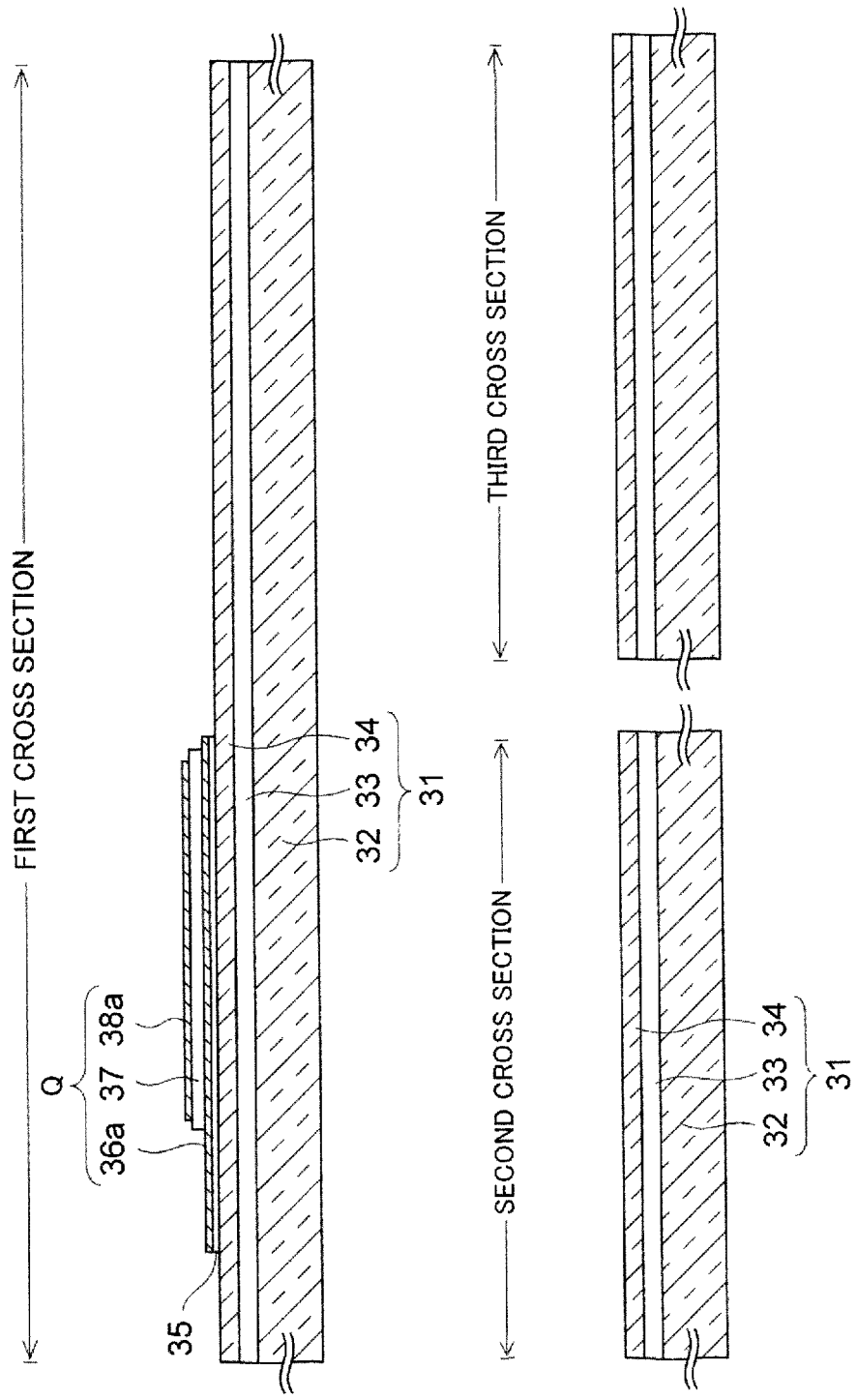

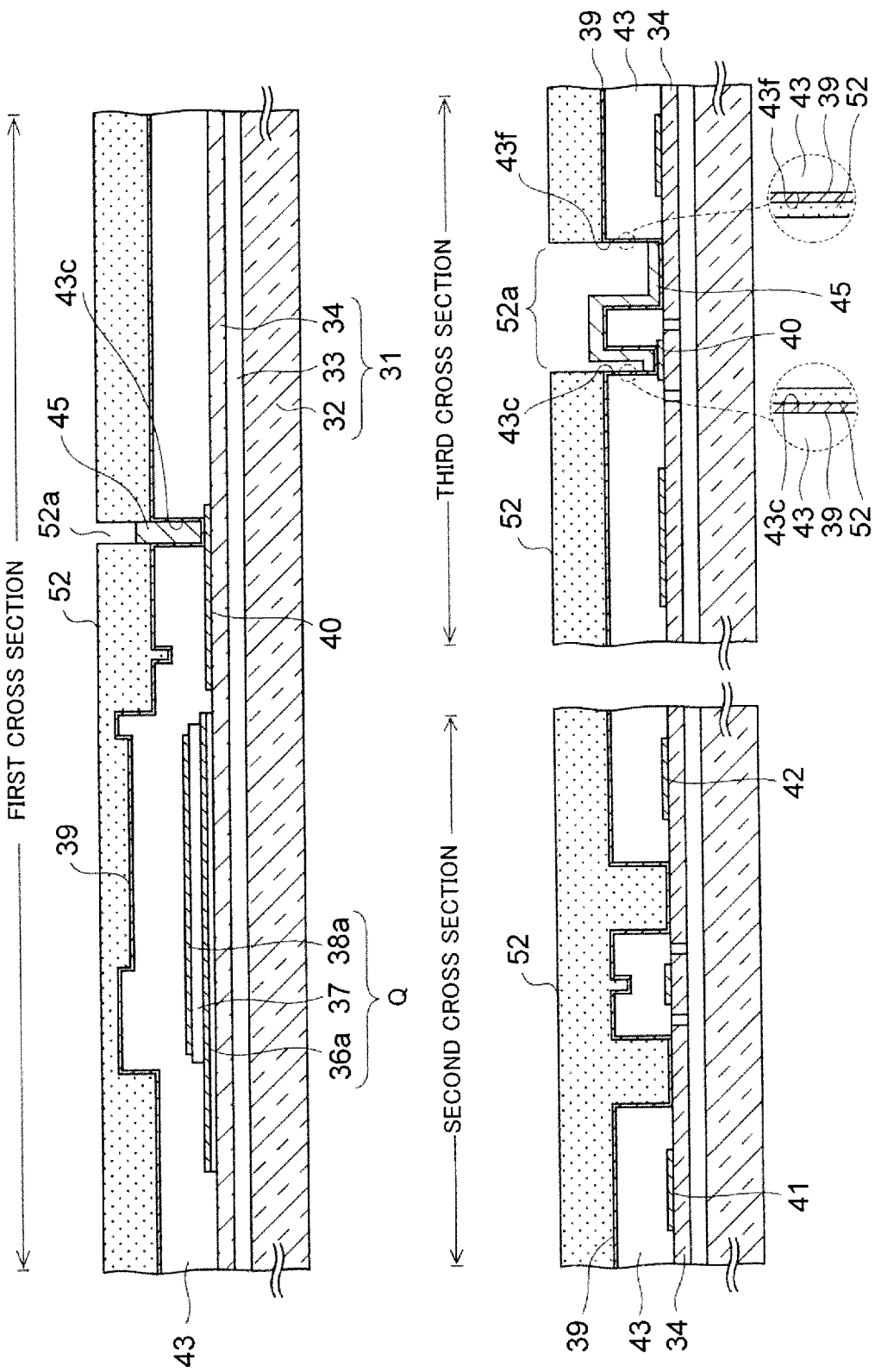

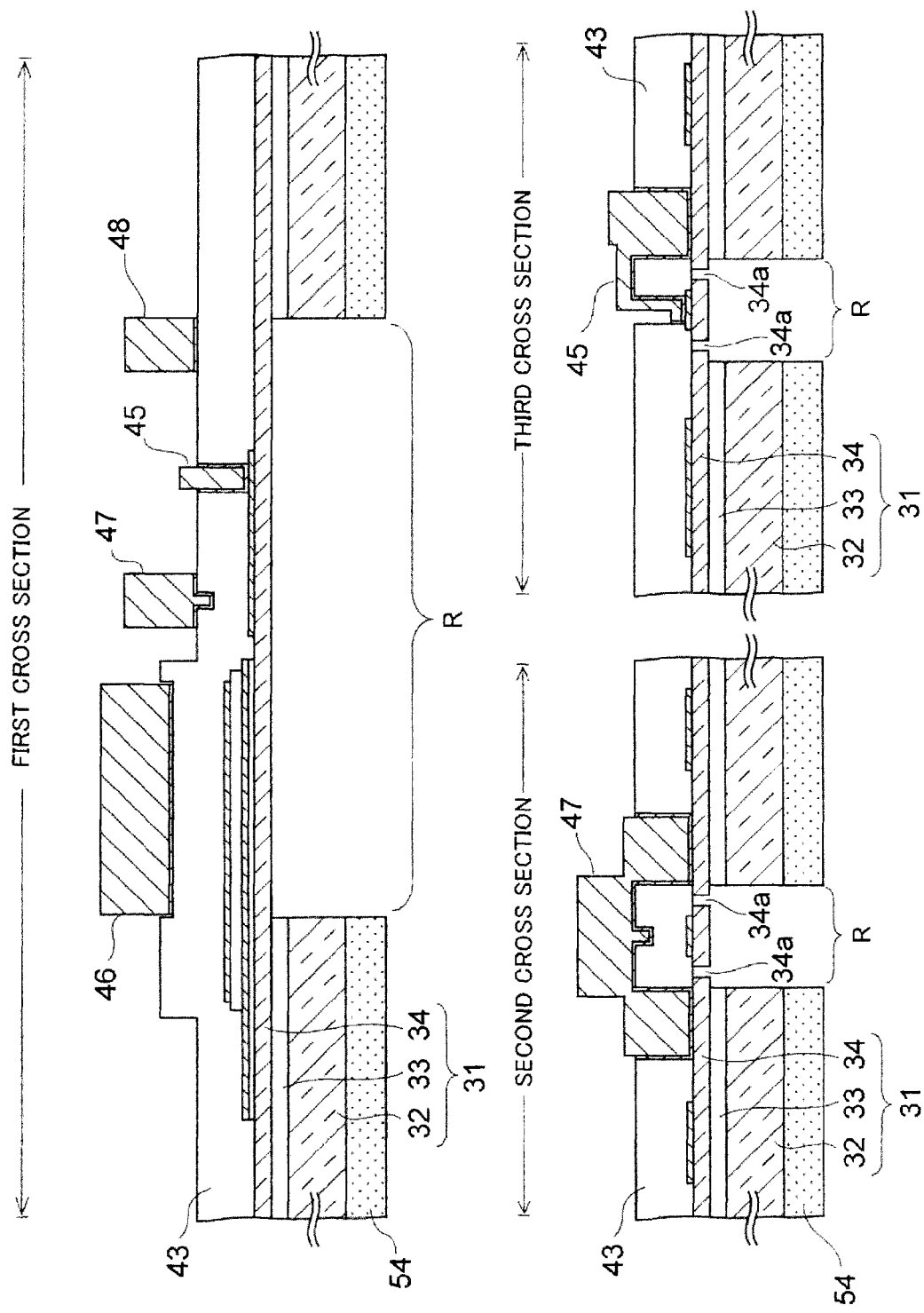

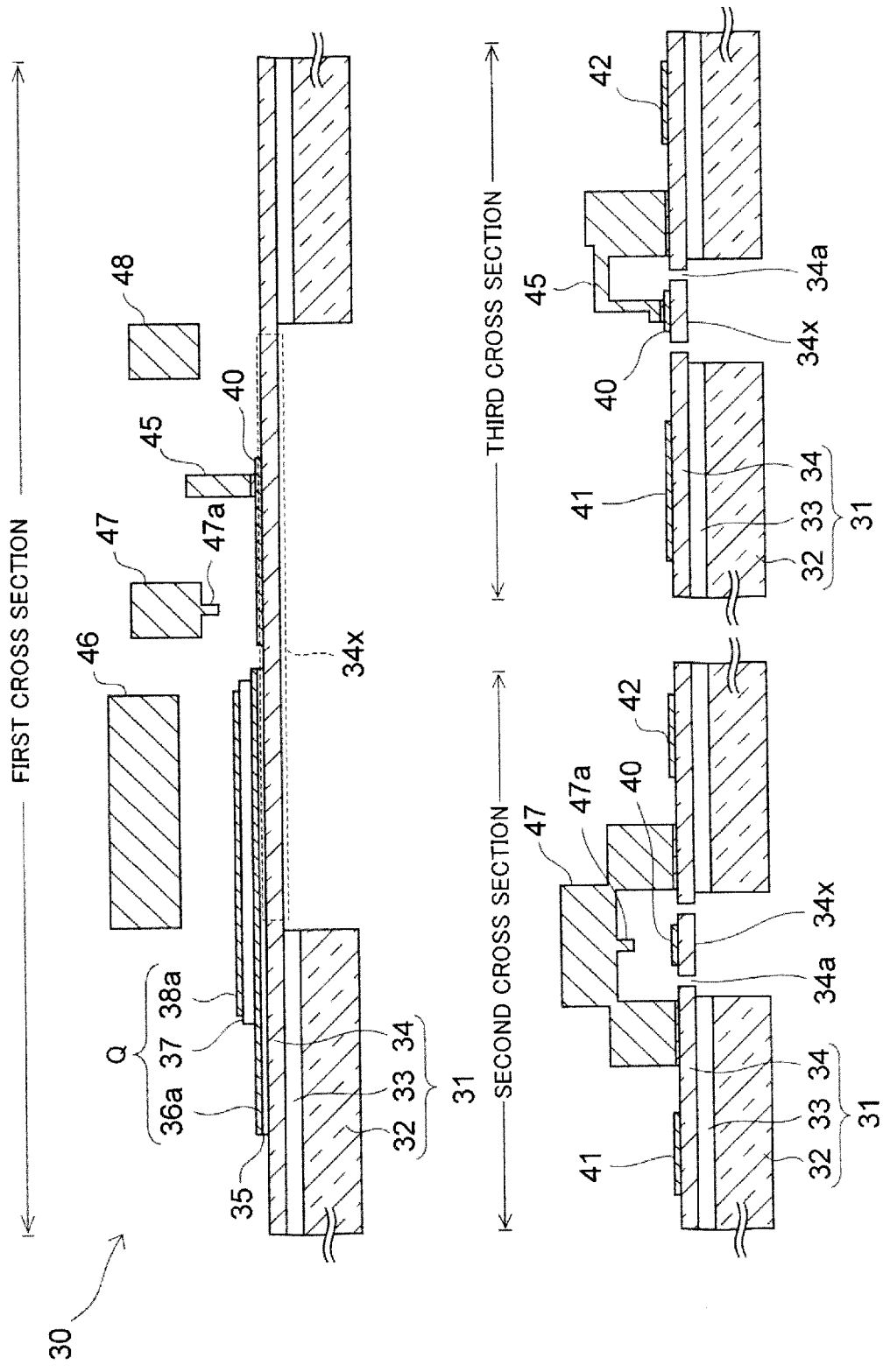

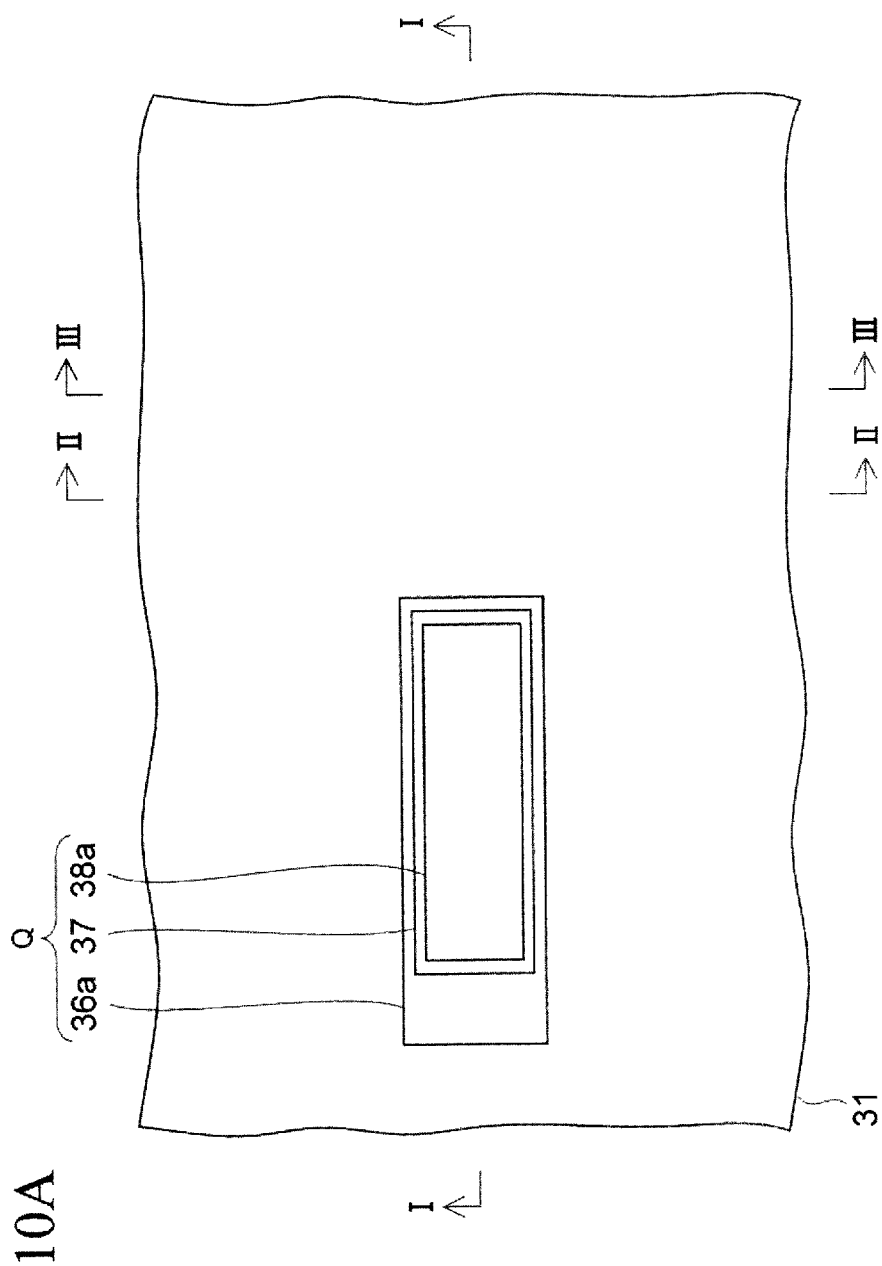

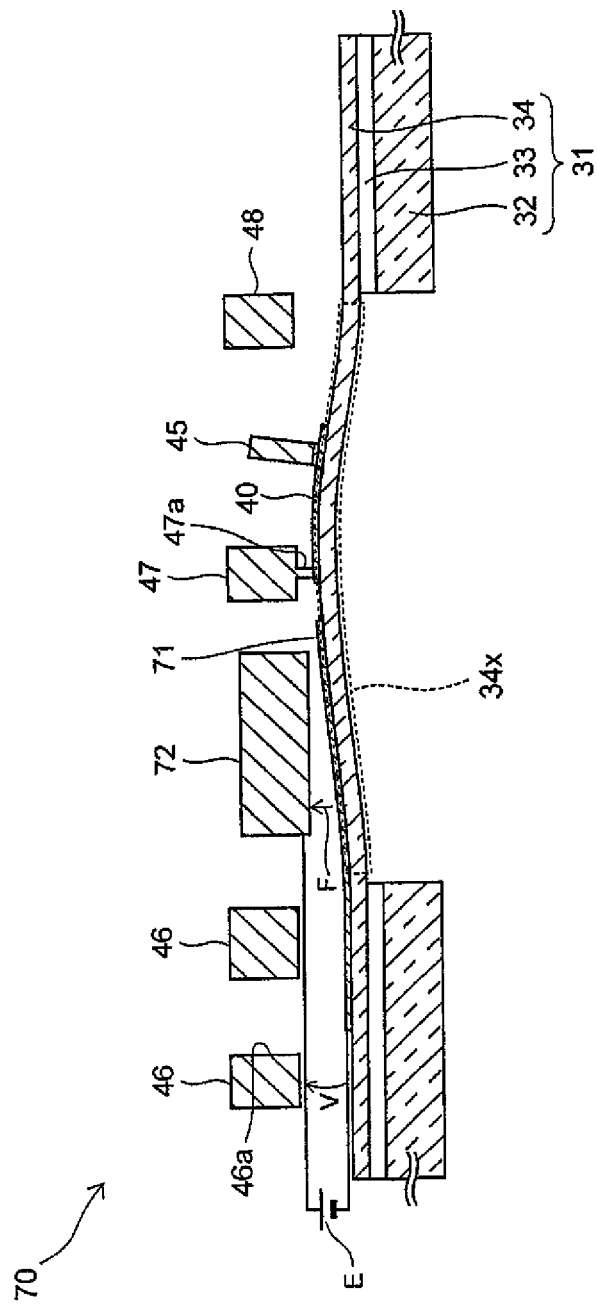

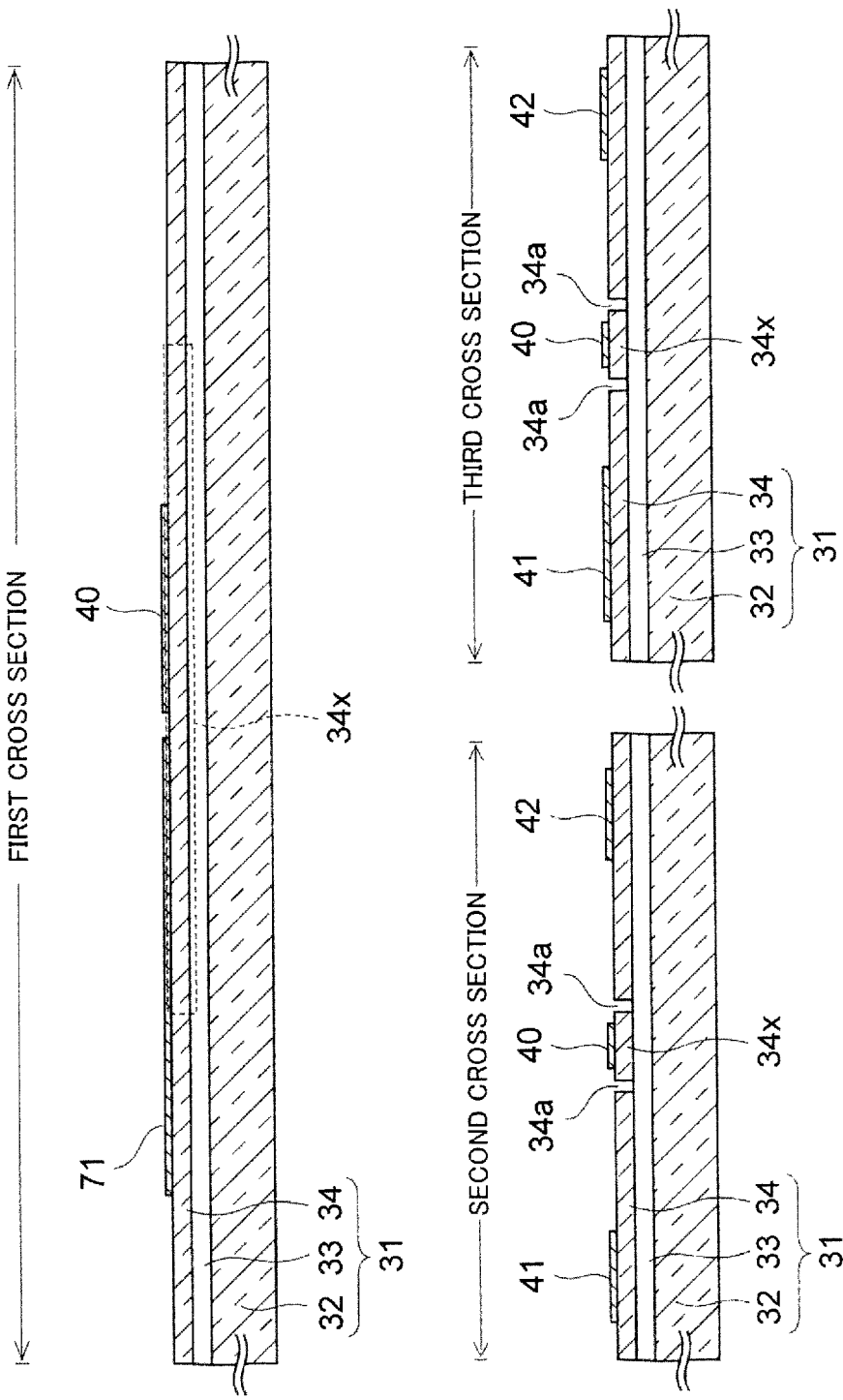

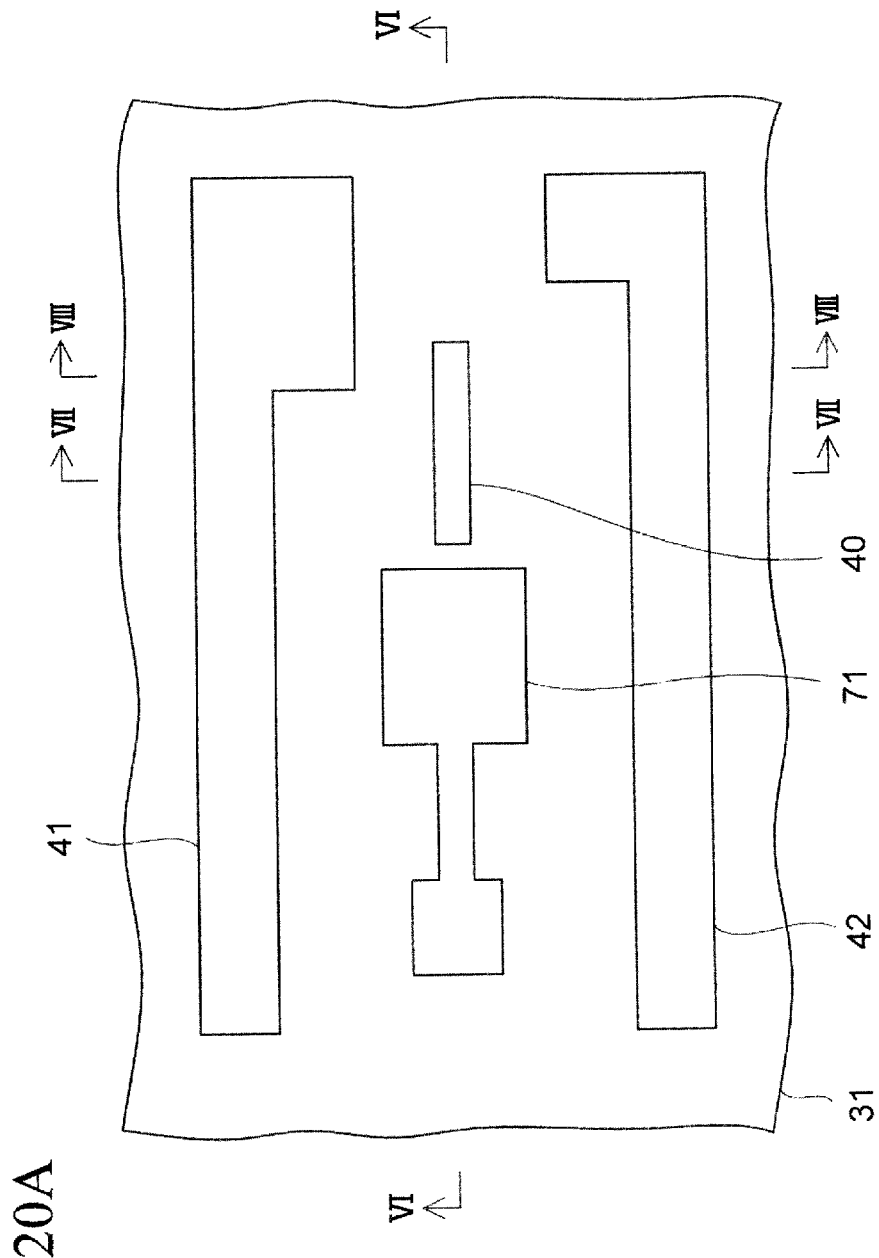

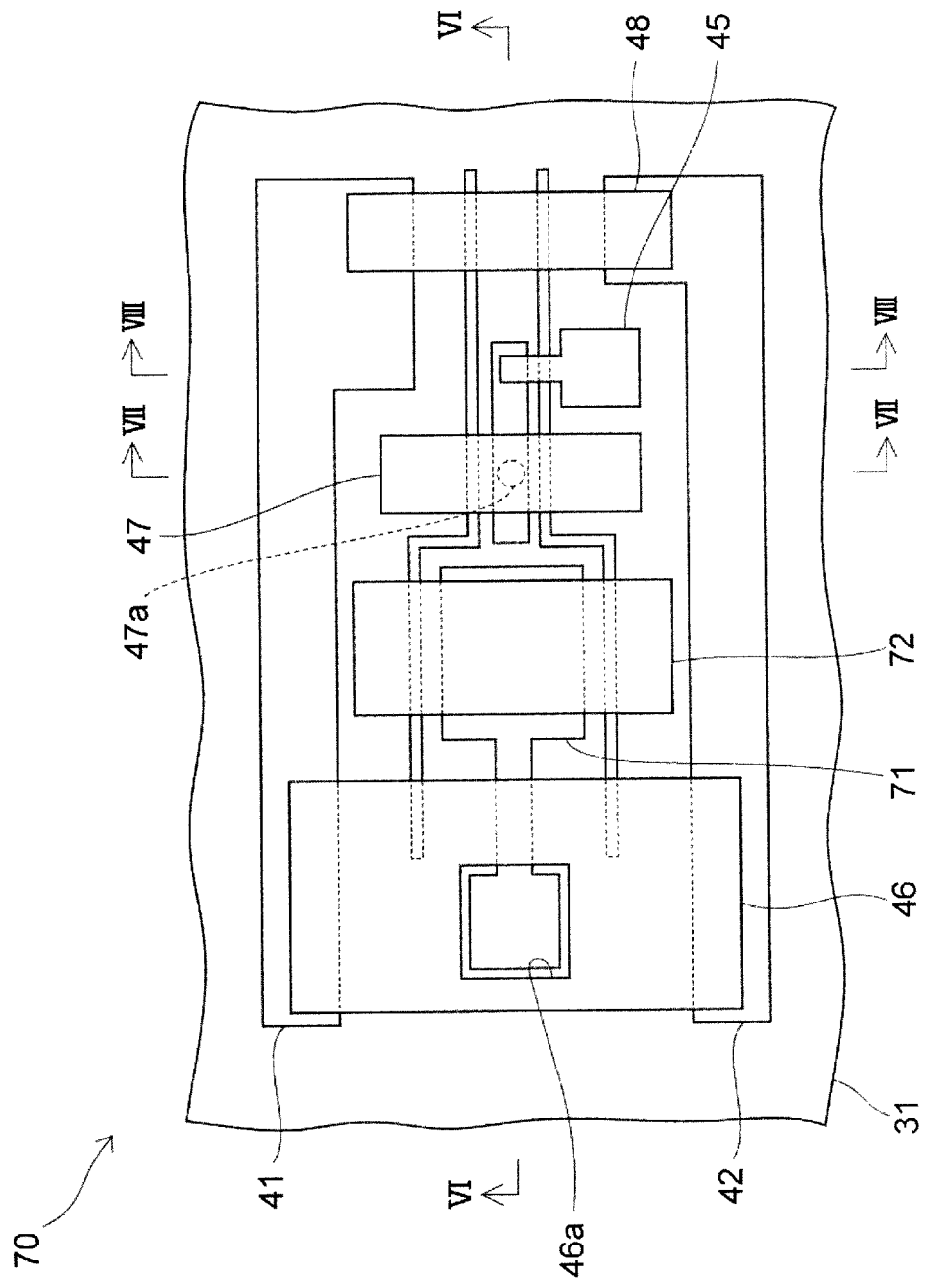

ELECTRIC DEVICE AND METHOD OF MANUFACTURING THE SAME

CROSS-REFERENCE TO RELATED APPLICATION(S)

This application is a division of U.S. patent application Ser. No. 13/613,424, filed on Sep. 13, 2012, which application is based upon and claims the benefit of priority of Japanese Patent Application No. 2011-259968, filed on Nov. 29, 2011, the entire contents of which are incorporated herein by reference.

FIELD

The embodiments discussed herein are related to an electric device and a method for manufacturing the same.

BACKGROUND

In an electric apparatus such as a mobile phone, use of the MEMS (Micro Electro Mechanical System) technology is growing to further miniaturize electric devices mounted thereon. Electric devices made by using the MEMS technology include, for example, a MEMS switch, a micromirror element, an acceleration sensor, and the like.

Among them, the MEMS switch has the following advantageous characteristics over a semiconductor switch: achieving a smaller loss of a signal; having a better insulating characteristic; and being less likely to cause signal distortion. It is preferable to further improve these characteristics of such a MEMS switch.

Technologies relating to the background arts are disclosed in Japanese Laid-open Patent Publication No. 2004-281412, and Japanese Laid-open Patent Publication No. 2007-188866.

SUMMARY

According to one aspect discussed herein, there is provided an electric device including a base member, a beam elastically deformable to bend upward and having an outline partially defined by a slit formed in the base member, a conductive pattern provided on a top surface of the beam, a contact electrode provided above the conductive pattern, the contact electrode coming into contact with the conductive pattern, and a bridge electrode elastically deformable, the bridge electrode connecting the conductive pattern and a portion of the base member outside the outline.

Moreover, according to another aspect discussed herein, there is provided an electric device including a base member, a beam elastically deformable to bend upward and having one end portion and another end portion fixed to the base member, the beam including a first portion close to the one end portion and a second portion close to the other end portion, a conductive pattern provided on a top surface of the second portion of the beam, and a contact electrode provided above the conductive pattern and coming into contact with the conductive pattern, wherein the second portion of the beam is smaller in thickness than the first portion, and the second portion of the beam is smaller in length than the first portion.

Furthermore, according to yet another aspect discussed herein, there is provided a method of manufacturing an electric device including forming a slit in a base member to define part of an outline of a beam by the slit, the beam being elastically deformable to bend upward, forming a conductive pattern on a top surface of the beam, forming a contact electrode above the conductive pattern, the contact electrode coming into contact with the conductive pattern, and forming a bridge electrode elastically deformable and connecting the conductive pattern and a portion of the base member outside the outline.

It is to be understood that both the forgoing general description and the following detailed description are exemplary and explanatory and are not restrictive of the invention.

BRIEF DESCRIPTION OF THE DRAWINGS

FIG. 6 is a cross-sectional view for explaining a switching operation of the electric device according to the first embodiment;

FIG. 7 is a cross-sectional view taken along the line III-III of FIG. 5 in a state where the switch is on;

FIG. 8 is a perspective view of a model used to calculate the spring constants respectively a beam and a bridge electrode;

FIGS. 9A to 9M are each a cross-sectional view of the electric device in the course of manufacturing thereof according to the first embodiment;

FIGS. 10A to 10D are each a plan view of the electric device in the course of manufacturing thereof according to the first embodiment;

FIG. 18 is a cross-sectional view for explaining a switching operation of the electric device according to the fifth embodiment;

FIGS. 19A to 19E are each a cross-sectional view of the electric device in the course of manufacturing thereof according to the fifth embodiment;

FIG. 20A to 20C are each a plan view of the electric device in the course of manufacturing thereof according to the fifth embodiment;

DESCRIPTION OF EMBODIMENTS

Before describing embodiments, preliminary explanation is given for the present embodiments.

Figure 1:
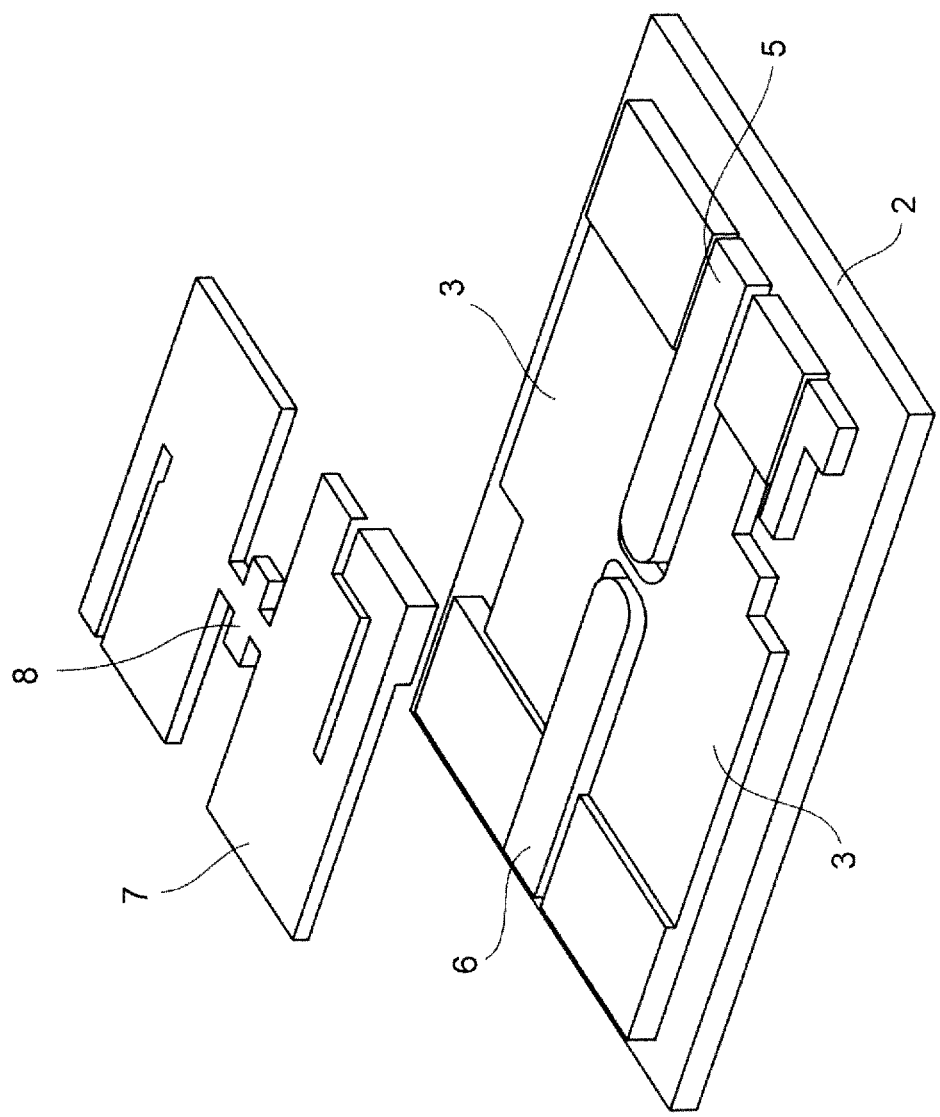
FIG. 1 is an exploded perspective view illustrating an example of a MEMS switch having two contact points.

FIG. 1 is an exploded perspective view illustrating an example of a MEMS switch having two contact points.

This MEMS switch 1 includes a substrate 2, a ground pattern 3, and first and second signal lines 5 and 6.

Furthermore, a contact point portion 8 supported by a movable electrode 7 is provided above the first and second signal lines 5 and 6.

In the MEMS switch 1, when a potential difference is given between the ground pattern 3 and movable electrode 7, electrostatic attraction is generated between these electrodes. Thus, the movable electrode 7 is bent downward, and the contact point portion 8 comes into contact with the first and second signal lines 5 and 6, so that the switch is turned on.

Moreover, the ground pattern 3 is formed to surround the first and second signal lines 5 and 6. The ground pattern 3 and the first and second signal lines 5 and 6 thereby form a coplanar structure. Accordingly, the impedance of each of the first and second signal lines 5 and 6 can be easily adjusted to a desired value by appropriately adjusting a stray capacitance between the ground pattern 3 and a corresponding one of the first and second signal lines 5 and 6.

However, in the MEMS switch 1, there is a case where the contact point portion 8 remains stuck to the first and second signal lines 5 and 6 even when the MEMS switch 1 is turned off from the on state. Such a phenomenon is called sticking and is one of causes of failure of the MEMS switch 1.

Sticking notably occurs when a soft and adhesive material such as gold is used as the material of the contact point portion 8 and the first and second signal lines 5 and 6. Particularly, in this example, there are two contact points in the contact point portion 8 which come into contact respectively with the first and second signal lines 5 and 6. Accordingly, the adhesive force that the contact point portion 8 receives is made greater than that in the case where there is one contact point. Thus, this example results in such a structure that the sticking is likely to occur.

Figure 2:
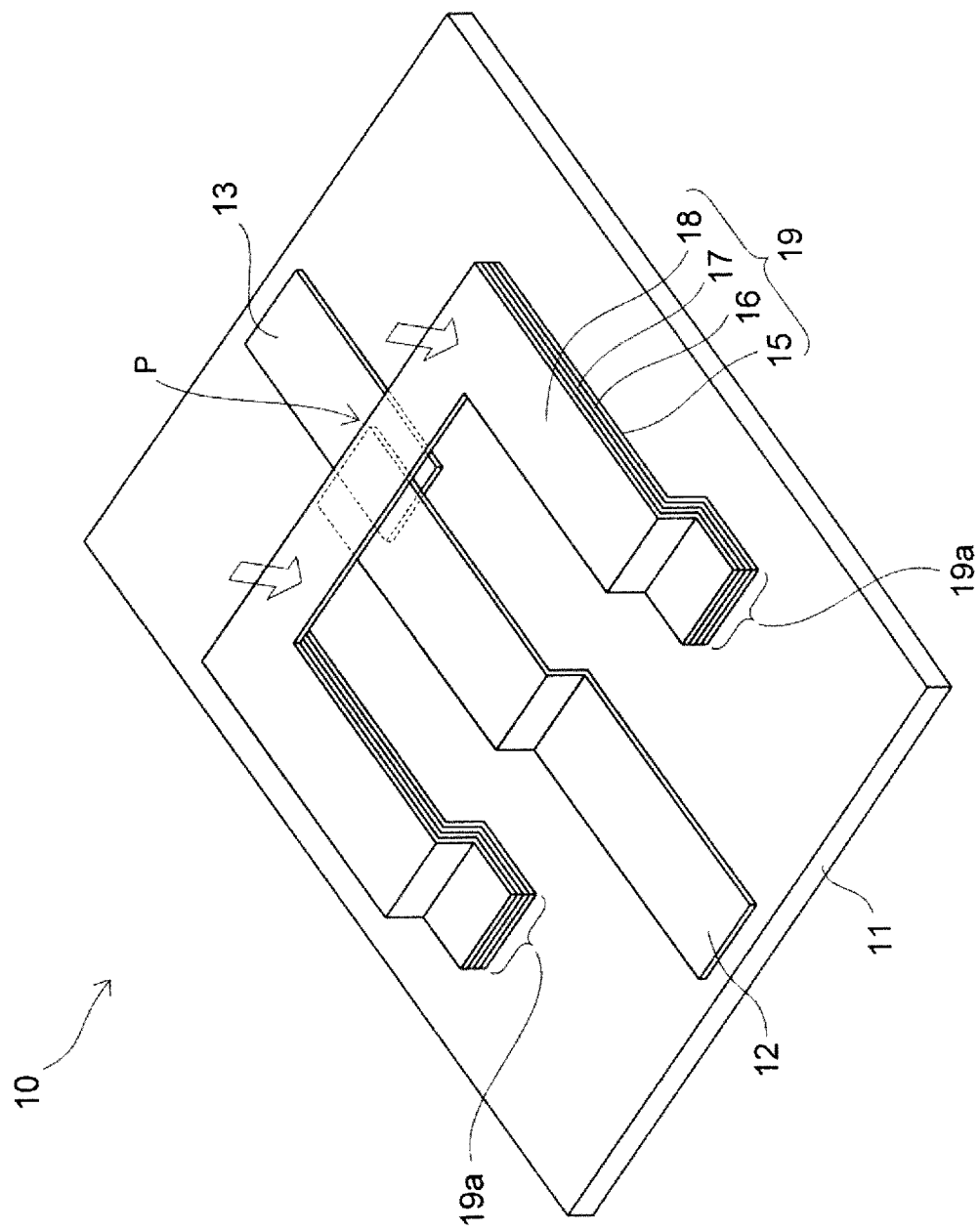
FIG. 2 is a perspective view illustrating an example of a MEMS switch having only one contact point.

Meanwhile, FIG. 2 is a perspective view illustrating an example of a MEMS switch having only one contact point.

This MEMS switch 10 includes a substrate 11, first and second signal lines 12 and 13, and a movable portion 19.

Among them, the movable portion 19 is formed by stacking a lower electrode 15, a piezoelectric film 16, an upper electrode 17, and a metal film 18 in this order. Moreover, the movable portion 19 is provided away from the substrate 11 except for end portions 19a fixed to the substrate 11.

In addition, a part of the first signal line 12 is provided away from the substrate 11 in accordance with the shape of the movable portion 19, and an end portion of the first signal line 12 is connected to the metal film 18.

In the MEMS switch 10 described above, a stress is generated in the piezoelectric film 16 by applying a potential difference between the lower electrode 15 and the upper electrode 17, and the movable portion 19 is thus bent toward the substrate 11 as illustrated by the arrows. Hence, the first signal line 12 and the second signal line 13 come into contact with each other and the switch is turned on.

At this time, there is only one contact point P at which the first signal line 12 and the second signal line 13 come into contact with each other. Accordingly, an adhesive force acting on the first signal line 12 and the second signal line 13 is smaller than that in the case where there are two contact points as in FIG. 1, and sticking is thus less likely to occur.

However, in the MEMS switch 10, the movable portion 19 and the first signal line 12 each have a three-dimensional shape so that the movable portion 19 can be bent downward. Hence, it is difficult to form a ground pattern around the first signal line 12.

Accordingly, a coplanar structure as illustrated in FIG. 1 cannot be achieved, and it thus difficult to set the impedances of the first signal line 12 and the second signal line 13 to desired values.

The embodiments are described below.

First Embodiment

Figure 3:
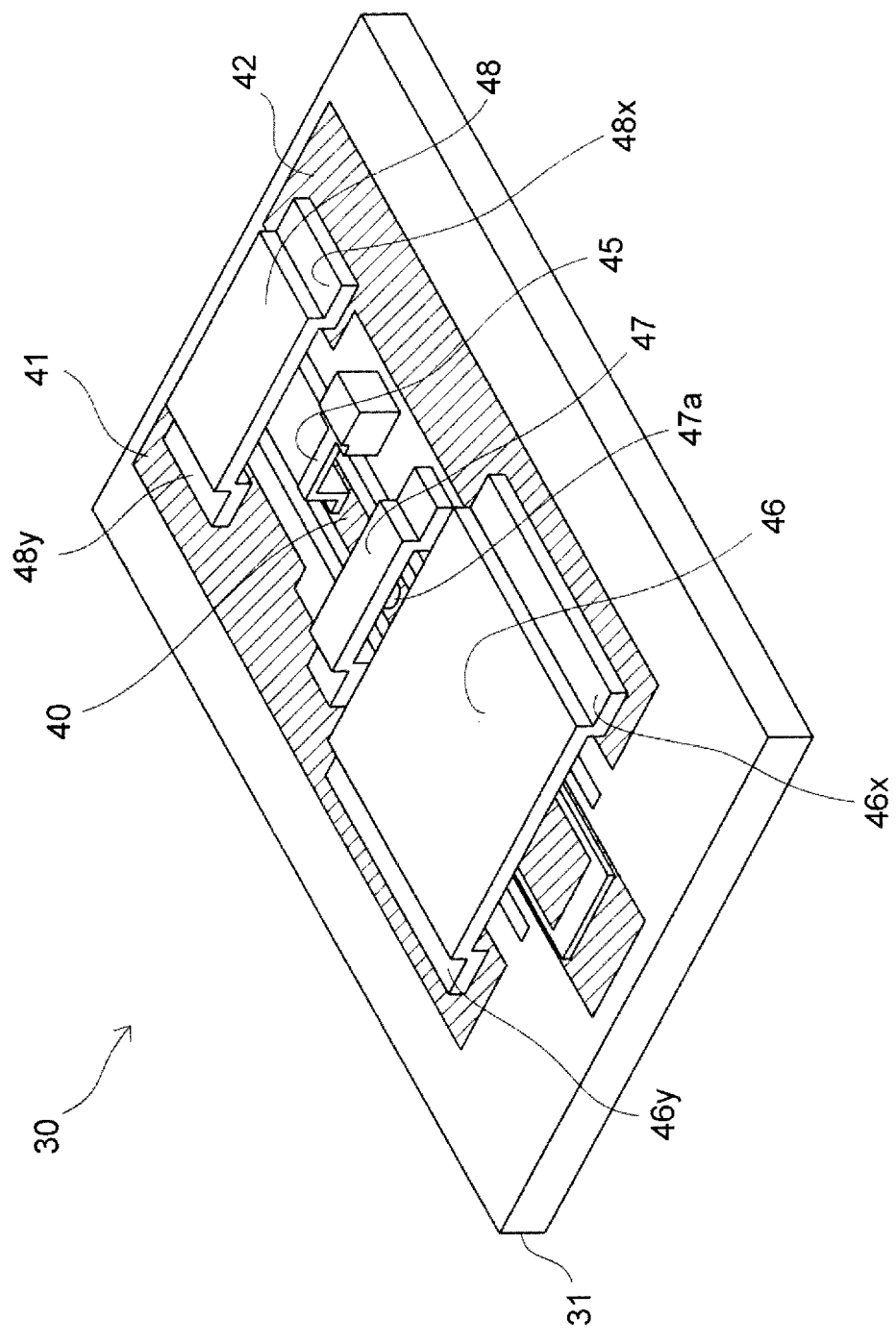
FIG. 3 is a perspective view of an electric device according to a first embodiment.

FIG. 3 is a perspective view of an electric device according to a first embodiment.

This electric device 30 is a MEMS switch and includes a base member 31 such as an SOI (Silicon On Insulator) substrate, a conductive pattern 40 through which an RF (Radio Frequency) signal flows, a bridge electrode 45, and a contact electrode 47. In this electric device, the RF signal is subjected to the switching.

Among them, the bridge electrode 45 has both ends connected respectively to the conductive pattern 40 and the base member 31, and is elastically deformable to bend upward as will be described later.

Moreover, the contact electrode 47 has a single protrusion 47a configured to come into contact with the conductive pattern 40 when the switch is in the on state. The contact electrode 47 functions also as a part of a signal path through which the RF signal flows.

Furthermore, a first ground pattern 41 and a second ground pattern 42 constituting a coplanar structure together with the conductive pattern 40 are provided on the base member 31 around the conductive pattern 40.

End portions 46x and 46y of a bridge-shaped first ground electrode 46 is connected respectively to a top surface of the second ground pattern 42 and a top surface of the first ground pattern 41. In addition, the electric device 30 includes a second ground electrode 48. End portions 48x and 48y of the second ground electrode 48 are also connected respectively to the second ground pattern 42 and the first ground pattern 41.

Further, the first ground pattern 41 and the second ground pattern 42 are maintained at a ground potential by the first ground electrode 46 and the second ground electrode 48.

Figure 4:
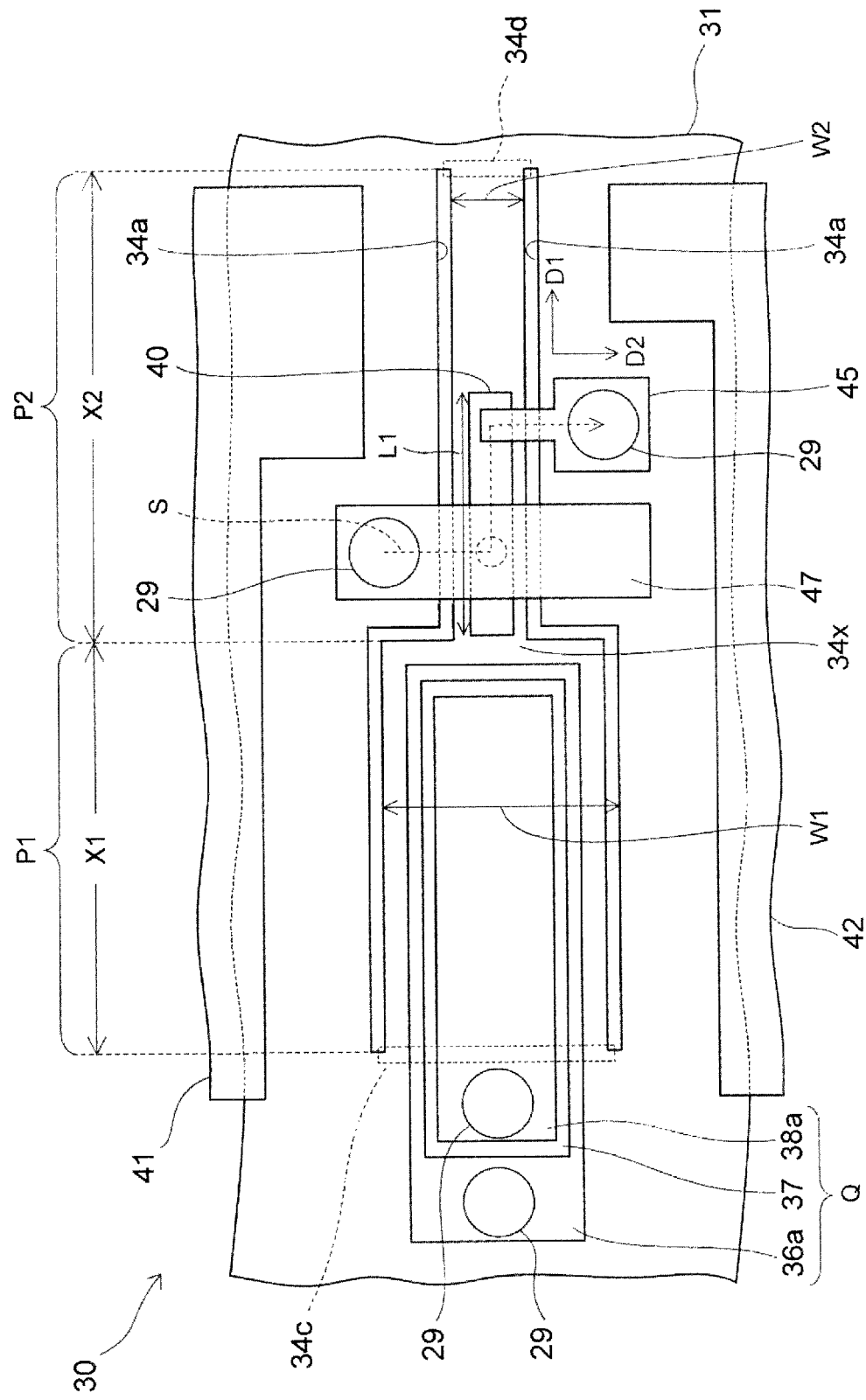
FIG. 4 is an enlarged plan view of the electric device according to the first embodiment.

FIG. 4 is an enlarged plan view of the electric device 30. Note that the first and second ground electrodes 46 and 48 are omitted in FIG. 4 to prevent the drawing from becoming complicated.

As illustrated in FIG. 4, a solder bump functioning as an external connection terminal 29 is provided on a top surface of each of the bridge electrode 45 and the contact electrode 47. The external connection terminal 29 is used to input and output an RF signal S that is subjected to the switching.

Moreover, slits 34a are formed in the base member 31, and a part of an outline of a beam 34x is defined by the slits 34a. The beam 34x has one end portion 34c and the other end portion 34d fixed to the base member 31 and is elastically deformable to bend upward and downward between these end portions.

Furthermore, the beam 34x includes a first portion P1 close to the one end portion 34c and a second portion P2 close to the other end portion 34d. In the present embodiment, the width W1 of the first portion P1 is wider than the width W2 of the second portion P2. Hence, the stiffness of the second portion P2 is made lower than that of the first portion P1, so that the beam 34x can easily elastically deform to bend upward in the first portion P1.

There are no particular limitations on the widths described above. For example, the width W1 of the first portion P1 is 150 μm and the width W2 of the second portion P2 is 30 μm. Furthermore, for example, the length X1 of the first portion P1 is 300 μm and the length X2 of the second portion P2 is 400 μm.

In addition, a piezoelectric element Q is formed in the first portion P1 of the beam 34x.

The piezoelectric element Q is formed by stacking a lower electrode 36a, a piezoelectric film 37, and an upper electrode 38a in this order. Upon application of a voltage, the piezoelectric element Q generates a drive force which bends the beam 34x upward. The voltage is applied to the piezoelectric element Q via the external connection terminals 29 formed respectively on a top surface of the lower electrode 36a and a top surface of the upper electrode 38a.

There are no particular limitations on the materials of the piezoelectric element Q. In the present embodiment, PZT (lead zirconate titanate) is used as the material of the piezoelectric film 37, and platinum is used as the material of the lower electrode 36a and the upper electrode 38a.

Meanwhile, the conductive pattern 40 is formed in the second portion P2 of the beam 34x in a size that is accommodated within the second portion P2.

There are no particular limitations on the extending direction of the conductive pattern 40. In the present embodiment, the conductive pattern 40 is formed to extend in the extending direction D1 of the slits 34a beside the conductive pattern 40. Further, an end portion of the conductive pattern 40 is mechanically connected to a portion of the base member 31 outside the outline of the beam 34x by the bridge electrode 45.

There are no particular limitations on the extending direction D2 of the bridge electrode 45. In the present embodiment, the extending direction D2 is a direction orthogonal to the extending direction D1 of the slits 34a.

Such an extending direction allows the RF signal S flowing through the conductive pattern 40 in the extending direction D1 to be led out in the middle of the conductive pattern 40 via the bridge electrode 45 in the extending direction D2.

The conductive pattern 40 has a function of leading out the RF signal S to a position where no interference with the contact electrode 47 occurs. When the RF signal S is lead out in the middle of the conductive pattern 40 by the bridge electrode 45 as in the above, the length L1 of the conductive pattern 40 which is required to lead out the RF signal S can be made shorter.

Accordingly, the electrical resistance of the conductive pattern 40 is reduced compared to the case where no bridge electrode 45 is provided, and the loss in the RF signal S can be suppressed. Suppression of loss by reducing the electrical resistance can be achieved not only in the case of the RF signal S but also in the case where a DC (Direct Current) signal flows through the conductive pattern 40.

Figure 5:
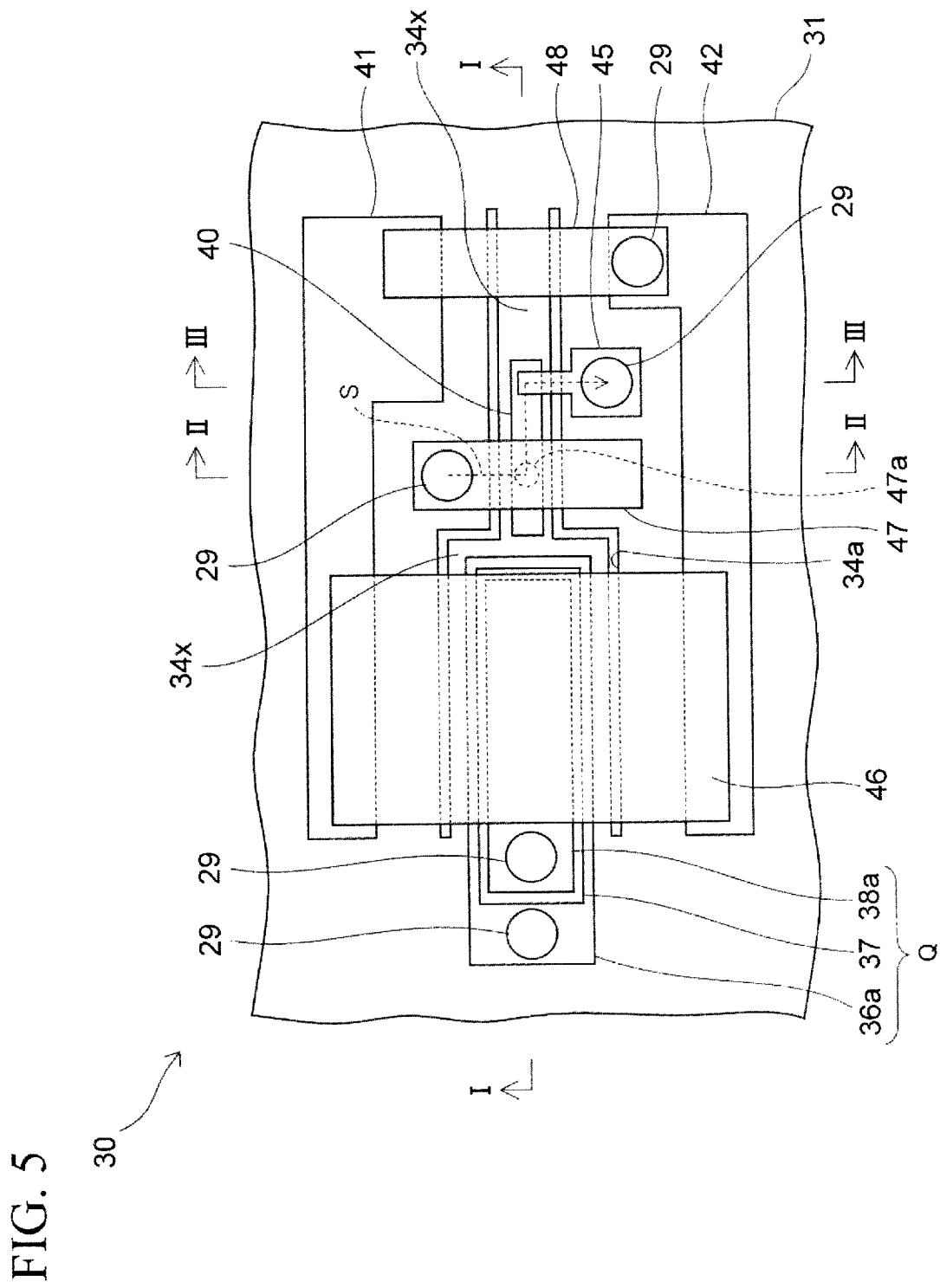
FIG. 5 is an overall plan view of the electric device according to the first embodiment.

FIG. 5 is an overall plan view of the electric device 30.

As illustrated in FIG. 5, the first ground electrode 46 extends above the beam 34x from the first ground pattern 41 and the second ground pattern 42. Similarly, the second ground electrode 48 extends above the beam 34x from the first ground pattern 41 and the second ground pattern 42.

The external connection terminal 29 for grounding the first ground pattern 41 and the second ground pattern 42 is provided on the top surface of the second ground electrode 48.

The first ground pattern 41 and the second ground pattern 42 form the coplanar structure together with the conductive pattern 40. Hence, the impedances of the paths through which the RF signal S flows can be adjusted by adjusting the interval between the first ground pattern 41 and conductive pattern 40, and the interval between the second ground pattern 42 and conductive pattern 40.

Next, a switching operation of the electric device 30 is described.

FIG. 6 is a cross-sectional view for explaining the switching operation of the electric device 30 and corresponds to a cross-section taken along the line I-I of FIG. 5. In FIG. 6, the external connection terminals 29 are omitted.

As illustrated in FIG. 6, the base member 31 is an SOI substrate formed by stacking a silicon oxide film 33 and a silicon film 34 on a silicon substrate 32 in this order.

In the base member 31, the silicon substrate 32 and the silicon oxide film 33 are removed in a portion under the beam 34x. Accordingly, the beam 34x does not receive a straining force of the silicon oxide film 33 and thus can elastically deform to bend upward and downward.

Moreover, a thermal oxide film is formed as an underlying insulating film 35 on the silicon film 34 and the aforementioned piezoelectric element Q is formed on the underlying insulating film 35.

In actual usage, a direct current power supply E is connected between the lower electrode 36a and the upper electrode 38a of the piezoelectric element Q, and a drive voltage V of about 10 V is applied between these electrodes. The piezoelectric film 37 is thereby made to contract in an in-plane direction by the piezoelectric effect.

The beam 34x is thereby bent upward and the conductive pattern 40 comes into contact with the protrusion 47a of the contact electrode 47. The electric device 30 is thus turned on. The raised amount of the beam 34x due to bending is about 1 μm in a portion where the beam 34x is most bent.

Note that the electric device 30 can be turned of by stopping the application of the drive voltage V.

FIG. 7 is a cross-sectional view taken along the line III-III of FIG. 4 in the state where the switch is on. Note that the external connection terminal 29 is omitted in FIG. 7.

As illustrated in FIG. 7, when the switch is turned on and the beam 34x is bent, the bridge electrode 45 connected to the conductive pattern 40 is also bent. Accordingly, the movement of the beam 34x is not restricted by the bridge electrode 45.

FIG. 8 is a perspective view of a model used to calculate the spring constants respectively of the beam 34x and the bridge electrode 45.

The beam 34x was configured as follows. The length X1+X2 was 700 μm, the width W was 30 μm, the thickness t1 was 15 μm, and the material of the beam 34x was silicon. Moreover, the end portions 34c and 34d of the beam 34x were fixed ends.

Meanwhile, the bridge electrode 45 was configured as follows. The length BW1 was 80 μm, the width BP1 was 30 μm, the thickness $t_2$ was 15 μm, and the material of the bridge electrode 45 was gold. Moreover, one end portion of the bridge electrode 45 was a fixed end, and the other end portion thereof was a free end.

The spring constants were calculated by using such a model. As a result, the spring constant of the beam 34x was 1605.8 N/m, while the spring constant of the bridge electrode 45 was 34 N/m. From this result, it is found that the spring constant of the bridge electrode 45 is sufficiently smaller than the spring constant of the beam 34x.

Accordingly, the movement of the beam 34x is not restricted by the bridge electrode 45 as described in FIG. 7. Hence, the drive voltage V for driving the beam 34x is substantially the same as that in the case where there is no bridge electrode 45, and the bridge electrode 45 can be driven at the low drive voltage V.

In the electric device 30 of the present embodiment described above, the RF signal S flowing through the conductive pattern 40 is led out to the outside via the bridge electrode 45 as illustrated in FIG. 4. Accordingly, the length L1 of the conductive pattern 40 can be made small. Thus, it is possible to reduce the electric resistance of the conductive pattern 40, and to suppress the loss in the RF signal S due to the conductive pattern 40.

Moreover, the width W1 of the first portion P1 of the beam 34x is wider than the width W2 of the second portion P2. Accordingly, it is possible to form the piezoelectric element Q in a large region of the first portion P1 and thereby increase the driving force generated by the piezoelectric element Q.

Furthermore, the stiffness of the second portion P2 is made lower than that of the first portion P1 by reducing the width W2 of the second portion P2. Accordingly, it is possible to reduce the drive voltage V applied to the piezoelectric element Q to bend the beam 34x upward.

In addition, as illustrated in FIG. 5, the first ground electrode 46 set to the ground potential is provided beside the contact electrode 47, and hence the contact electrode 47 and the first ground electrode 46 form the coplanar structure. Accordingly, the impedance of the path through which the RF signal S flows can be easily adjusted by adjusting the interval between the first ground electrode 46 and the contact electrode 47. Therefore, the impedance match with an external device is easily achieved.

Similarly, the second ground electrode 48 forms the coplanar structure together with the bridge electrode 45. Accordingly, the impedance of the path can be adjusted by adjusting the interval between the second ground electrode 48 and the bridge electrode 45.

Moreover, only one protrusion 47a is provided in the contact electrode 47. Hence, the adhesive force between the contact electrode 47 and the conductive pattern 40 can be made smaller than the case where a plurality of protrusions 47a are provided. It is thus possible to suppress sticking in which the contact electrode 47 remains stuck to the conductive pattern 40.

Next, a method of manufacturing the electric device 30 is described.

FIGS. 9A to 9M are each a cross-sectional view of the electric device 30 in the course of manufacturing thereof according to the present embodiment.

In FIGS. 9A to 9M, the same elements as those described above are denoted by the same reference numerals and description thereof are omitted. Moreover, in each of FIGS. 9A to 9M, a first cross section corresponds to a cross section taken along the line I-I of FIG. 5 and a second cross section corresponds to a cross section taken along the line II-II of FIG. 5. Furthermore, a third cross section corresponds to a cross section taken along the line III-III of FIG. 5.

The electric device 30 is manufactured as follows by using a MEMS technology.

Figure 9A:
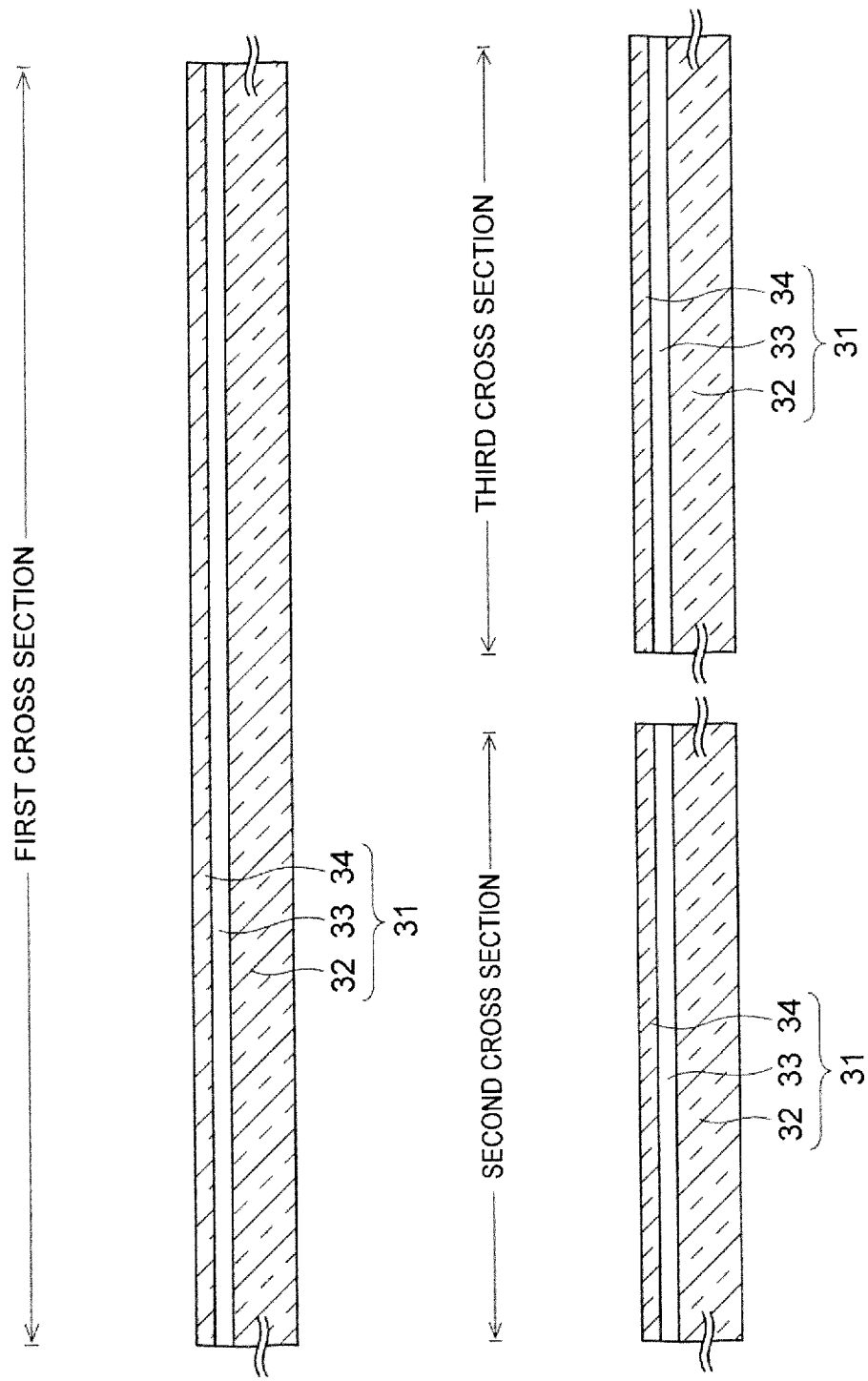

First, as illustrated in FIG. 9A, an SOI substrate is prepared as the base member 31.

The thickness of the silicon substrate 32 in the base member 31 is about 525 μm and the thickness of the silicon oxide film 33 is about 4 μm. Moreover, the thickness of the silicon film 34 is about 15 μm.

The silicon film 34 serves as an underlying layer of the bridge electrode 45 described above. Accordingly, in order to prevent the RF signal S flowing through the bridge electrode 45 from flowing into the silicon film 34, the resistivity of the silicon film 34 is preferably set as high as possible, for example to 100 Ωcm or more, by controlling impurities in the silicon film 34.

Figure 9B:
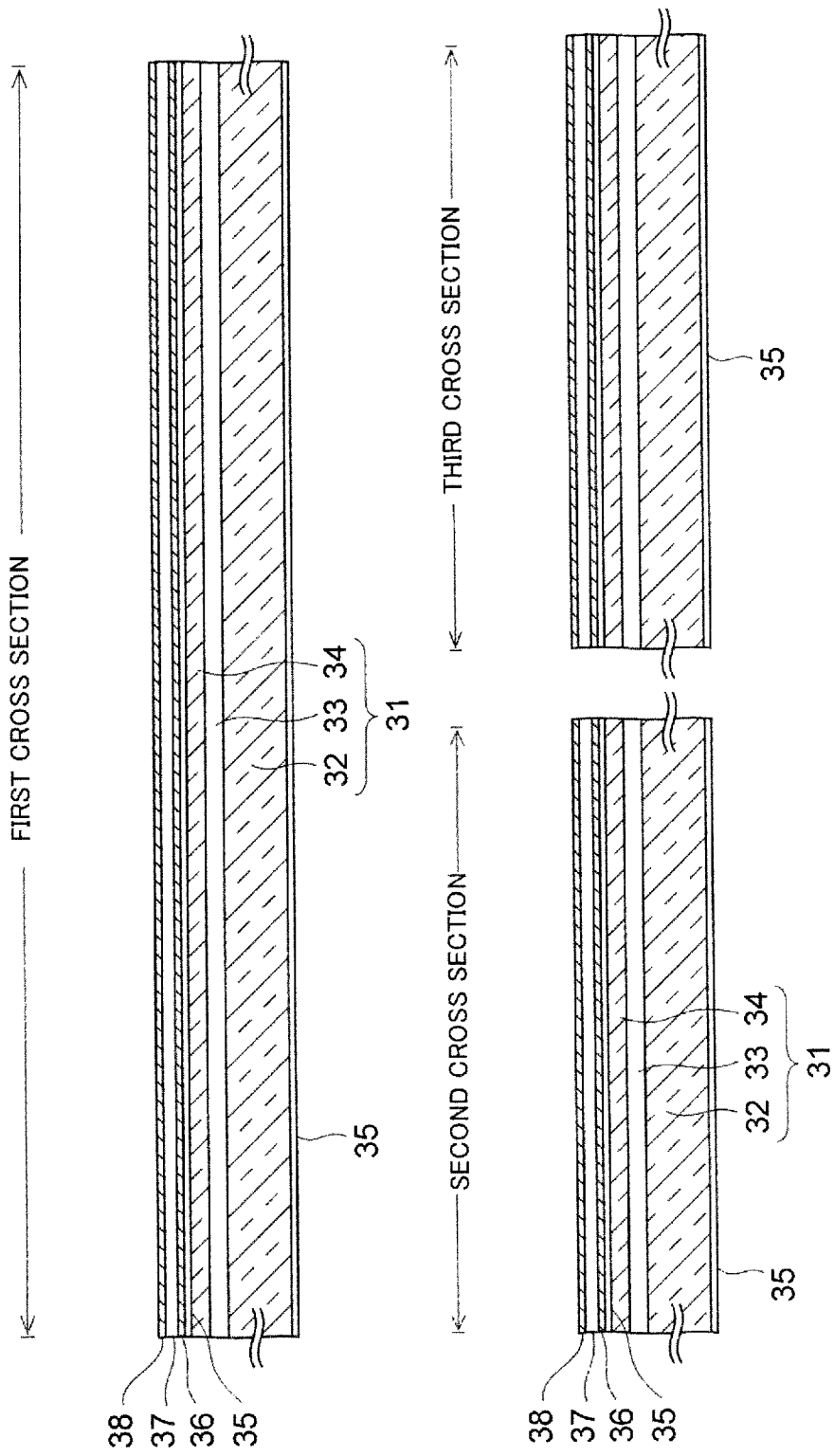

Next, steps performed to obtain a cross-sectional structure illustrated in FIG. 9B are described.

First, a thermal oxidation film is formed to a thickness of about 500 nm as the underlying insulating film 35 by thermally oxidizing a surface of the silicon film 34. The thermal oxidation occurs also in a back surface of the silicon substrate 32 and the underlying insulating film 35 is thereby formed also in the back surface.

Then, a titanium film having a thickness of about 50 nm and a platinum film having a thickness of about 200 nm are formed in this order on the underlying insulating film 35 by sputtering. These stacked films function as a first conductive film 36. The titanium film in the first conductive film 36 serves as a tight adhesion film.

Next, a PZT film is formed as the piezoelectric film 37 on the first conductive film 36 by a sol-gel method. In the sol-gel method, formation of a PZT coating film and baking thereof are performed a plurality of times until the thickness of the piezoelectric film 37 reaches about 1 μm. The substrate temperature during baking is about 450° C.

Then, a platinum film is formed to a thickness of about 200 nm on the piezoelectric film 37 as a second conductive film 38 by sputtering.

Thereafter, the piezoelectric film 37 is subjected to RTA (Rapid Thermal Anneal) at the substrate temperature of about 650° C. and PZT in the piezoelectric film 37 is crystallized. The piezoelectric characteristic of the piezoelectric film 37 is thereby improved.

Next, as illustrated in FIG. 9C, the second conductive film 38 is patterned by ion milling and the upper electrode 38a is thereby formed.

Then, the piezoelectric film 37 is wet-etched by using a buffered hydrofluoric acid solution as an etchant and an unillustrated resist pattern as a mask, and the piezoelectric film 37 is thereby patterned.

Next, the first conductive film 36 is patterned by ion milling and the lower electrode 36a is thereby formed.

The piezoelectric element Q formed by stacking the lower electrode 36a, the piezoelectric film 37, and the upper electrode 38a in this order is formed by performing the steps described above.

Thereafter, the thermal oxidation films formed as the underlying insulating films 35 are removed by wet etching by using the buffered hydrofluoric acid solution as an etchant. Hence, the underlying insulating film 35 remains only in a portion under the piezoelectric element Q. Note that the piezoelectric element Q is masked by an unillustrated resist pattern in the wet etching and the resist pattern is removed after the wet etching is completed.

FIG. 10A is a plan view after the completion of this step. In the FIG. 9C described above, the first cross section corresponds to a cross section taken along the line I-I of FIG. 10A and the second cross section corresponds to a cross section taken along the line II-II of FIG. 10A. Moreover, the third cross section of FIG. 9C corresponds to a cross section taken along the line III-III of FIG. 10A.

Figure 10B:
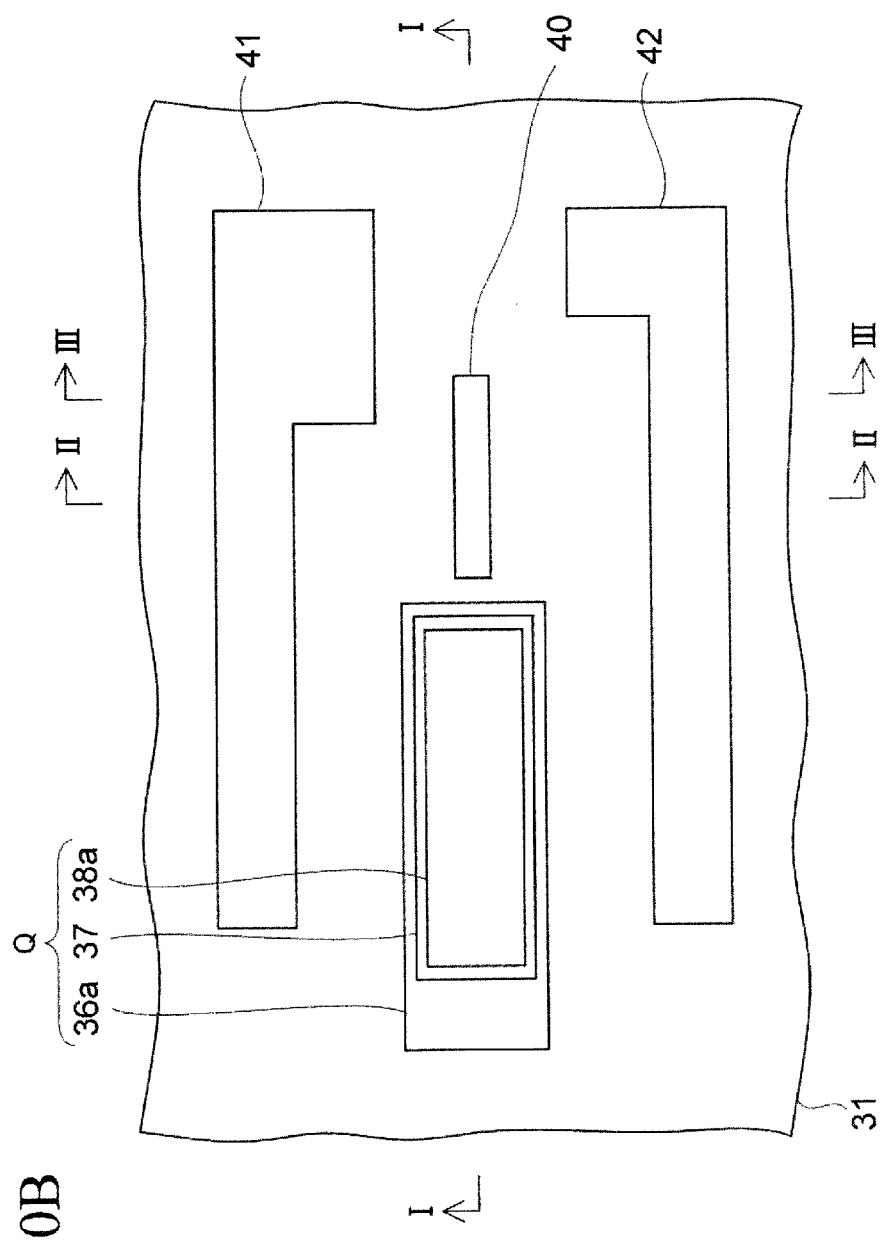

Note that, the underlying insulating film 35 is omitted in FIG. 10A. The same applies to FIGS. 10B to 10D to be described later.

As illustrated in FIG. 10A, the lower electrode 36a, the piezoelectric film 37, and the upper electrode 38a each have a rectangular shape in a plan view.

Figure 9D:
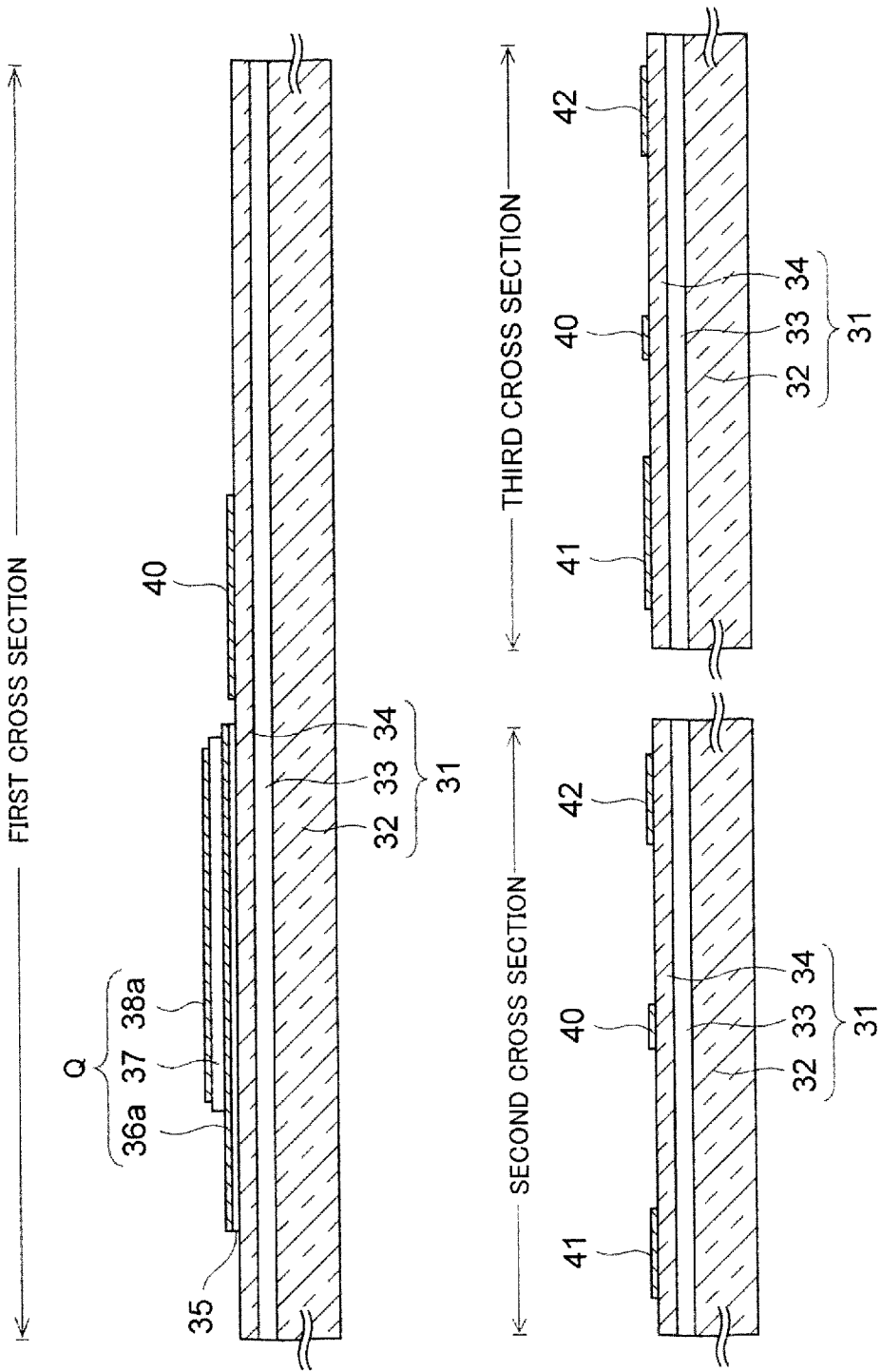

Next, as illustrated in FIG. 9D, a titanium film having a thickness of about 50 nm and a gold film having a thickness of about 500 nm are formed in this order on portions of the silicon film 34 which are away from the piezoelectric element Q, as the conductive pattern 40 and the first and second ground patterns 41 and 42 by sputtering.

The titanium film and the gold film are patterned into shapes of the conductive pattern 40 and the first and second ground patterns 41 and 42 by a liftoff method using an unillustrated resist pattern. Moreover, the titanium film formed in this step serves as a tight adhesion film.

FIG. 10B is a plan view after the completion of this step. In FIG. 9D described above, the first cross section corresponds to a cross section taken along the line I-I of FIG. 10B and the second cross section corresponds to a cross section taken along the line II-II of FIG. 10B. Moreover, the third cross section of FIG. 9D corresponds to a cross section taken along the line III-III of FIG. 10B.

As illustrated in FIG. 10B, the conductive pattern 40 is formed to have an elongated shape in a plan view and the first ground pattern 41 and the second ground pattern 42 are formed respectively on both sides of the conductive pattern 40.

Figure 9E:
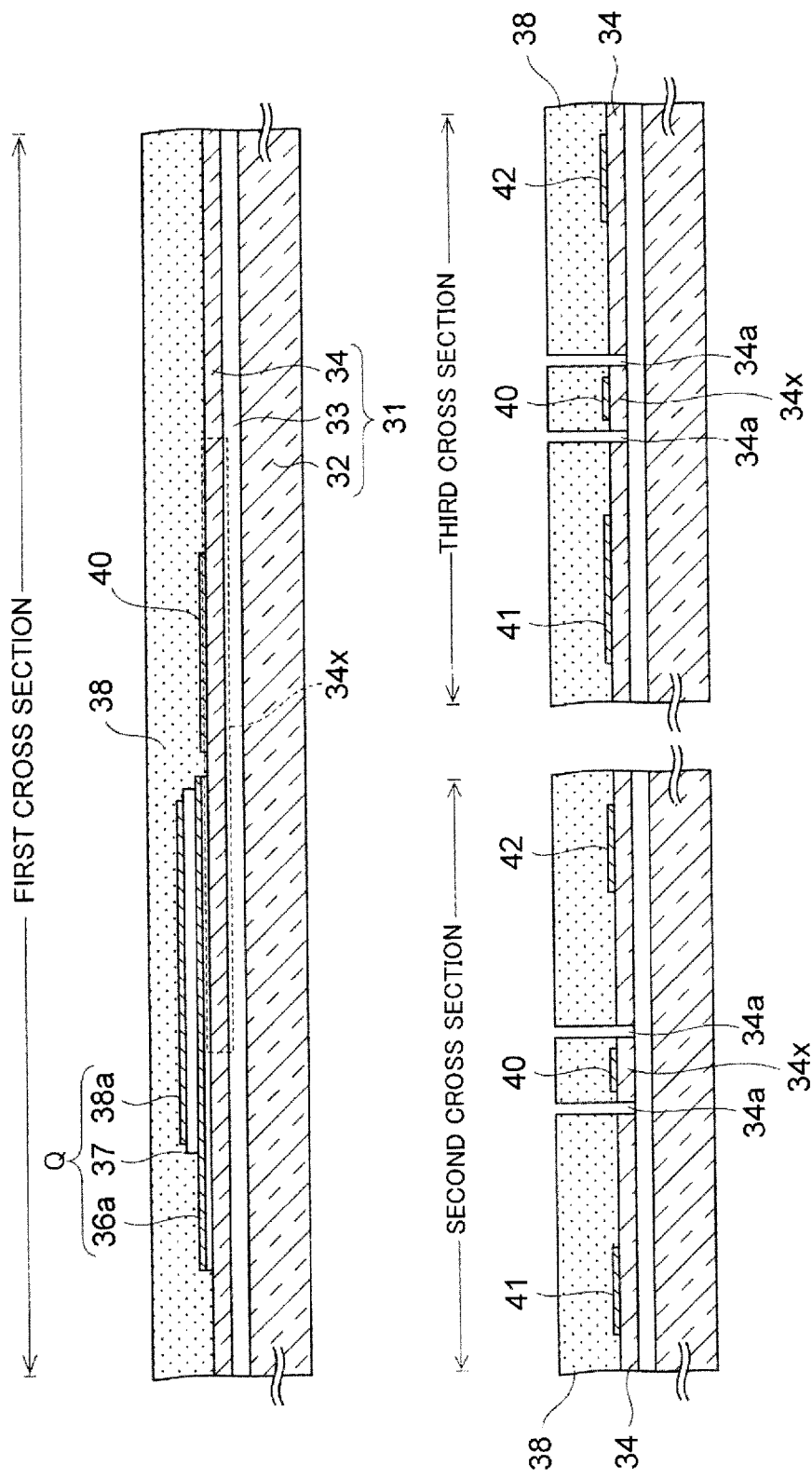

Then, as illustrated in FIG. 9E, a photoresist is applied onto the entire top surface of the base member 31 and a first resist pattern 38 is formed by exposing and developing the photoresist. Thereafter, the silicon film 34 is dry-etched by using the first resist pattern 38 as a mask and the slits 34a having a width of about 2 μm are thus formed in the silicon film 34.

Deep-RIE (Deep Reactive Ion Etching) allowing a high anisotropy of etching is preferably employed as the dry etching. In the Deep-RIE, supplying $SF_6$ and $C_4F_8$ alternately in an etching atmosphere causes etching and side wall protection achieved by deposits to proceed alternately and the side walls of the slits 34a can be formed perpendicular to the top surface of the base member 31.

Thus, a portion of the silicon film 34 is defined as the beam 34x by forming the slits 34a.

Thereafter, the first resist pattern 38 is removed.

Figure 10C:
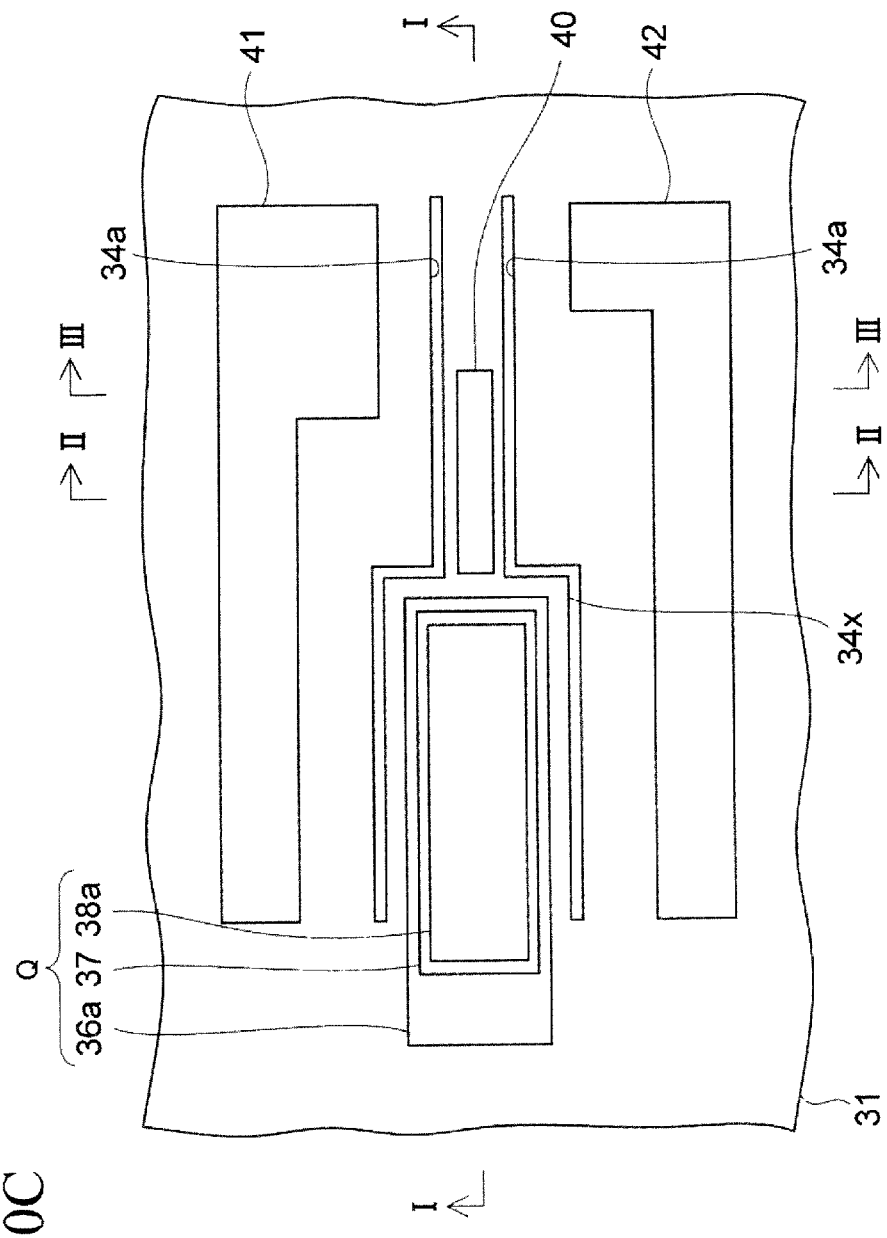

FIG. 10C is a plan view after the completion of this step. In FIG. 9E described above, the first cross section corresponds to a cross section taken along the line I-I of FIG. 10C and the second cross section corresponds to a cross section taken along the line II-II of FIG. 10C. Moreover, the third cross section of FIG. 9E corresponds to a cross section taken along the line III-III of FIG. 10C.

As illustrated in FIG. 10C, two slits 34a are formed and the piezoelectric element Q and the conductive pattern 40 are provided between the slits 34a.

Figure 9F:
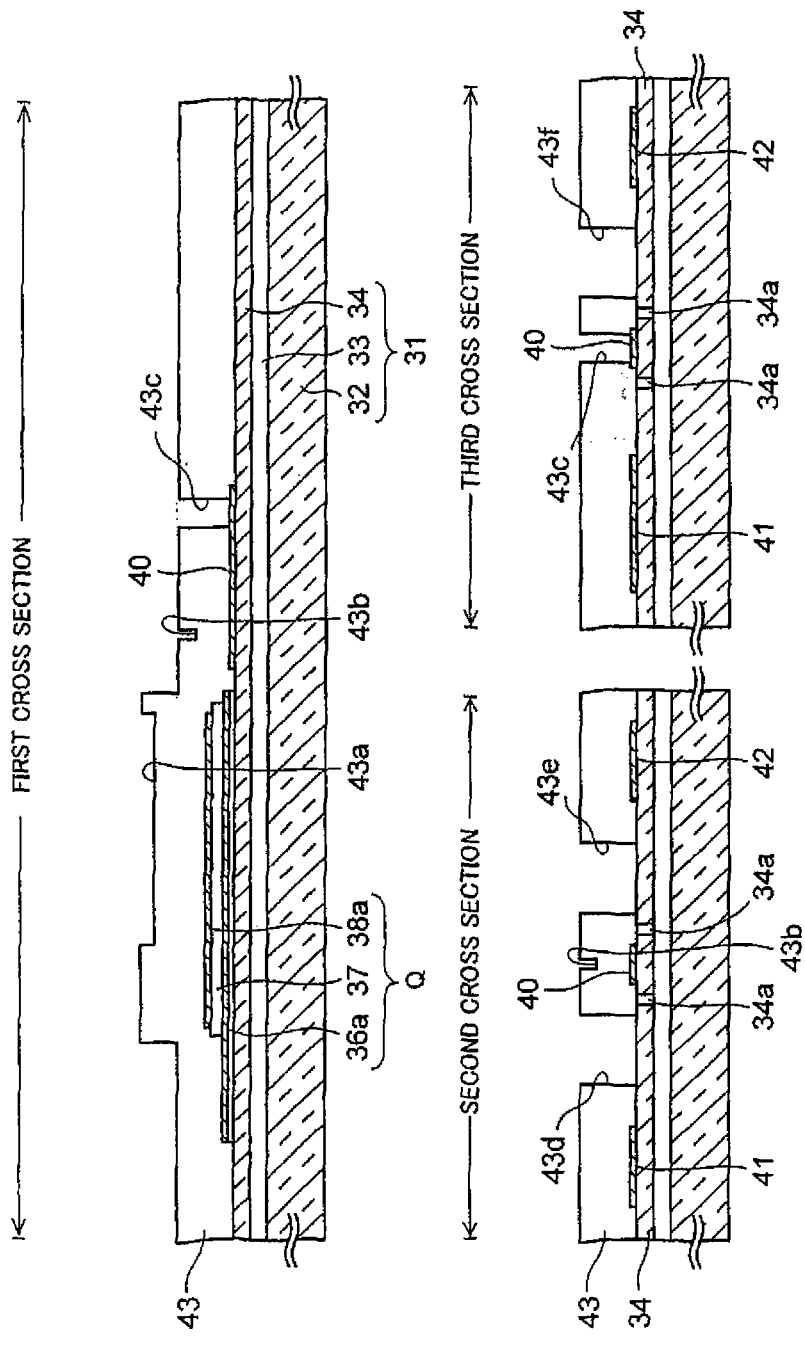

Subsequently, as illustrated in FIG. 9F, a silicon oxide film is formed to a thickness of about 5 μm on the entire top surface of the base member 31 as a sacrificial insulating film 43 by a plasma CVD method.

Then, first and second recessed portions 43a and 43b and first to fourth openings 43c to 43f are formed in the sacrificial insulating film 43 away from each other by photolithography and etching.

Among these, the second recessed portion 43b is formed to be deeper than the first recessed portion 43a and the first to fourth opening portions 43c to 43f are formed to be deeper than any of the first and second recessed portions 43a and 43b.

The photolithograph and etching are each performed a plurality of times to form the recessed portions and the openings which are different in depth as described above.

There are no particular limitations on the depth of each of the recessed portions and the opening portions. In the present embodiment, the depth of the first recessed portion 43a is about 1.7 μm and the depth of the second recessed portion 43b is about 3.7 μm. Moreover, the depth of each the first to fourth openings 43c to 43f is about 5 μm which is the same as the thickness of the sacrificial insulating film 43.

Figure 9G:
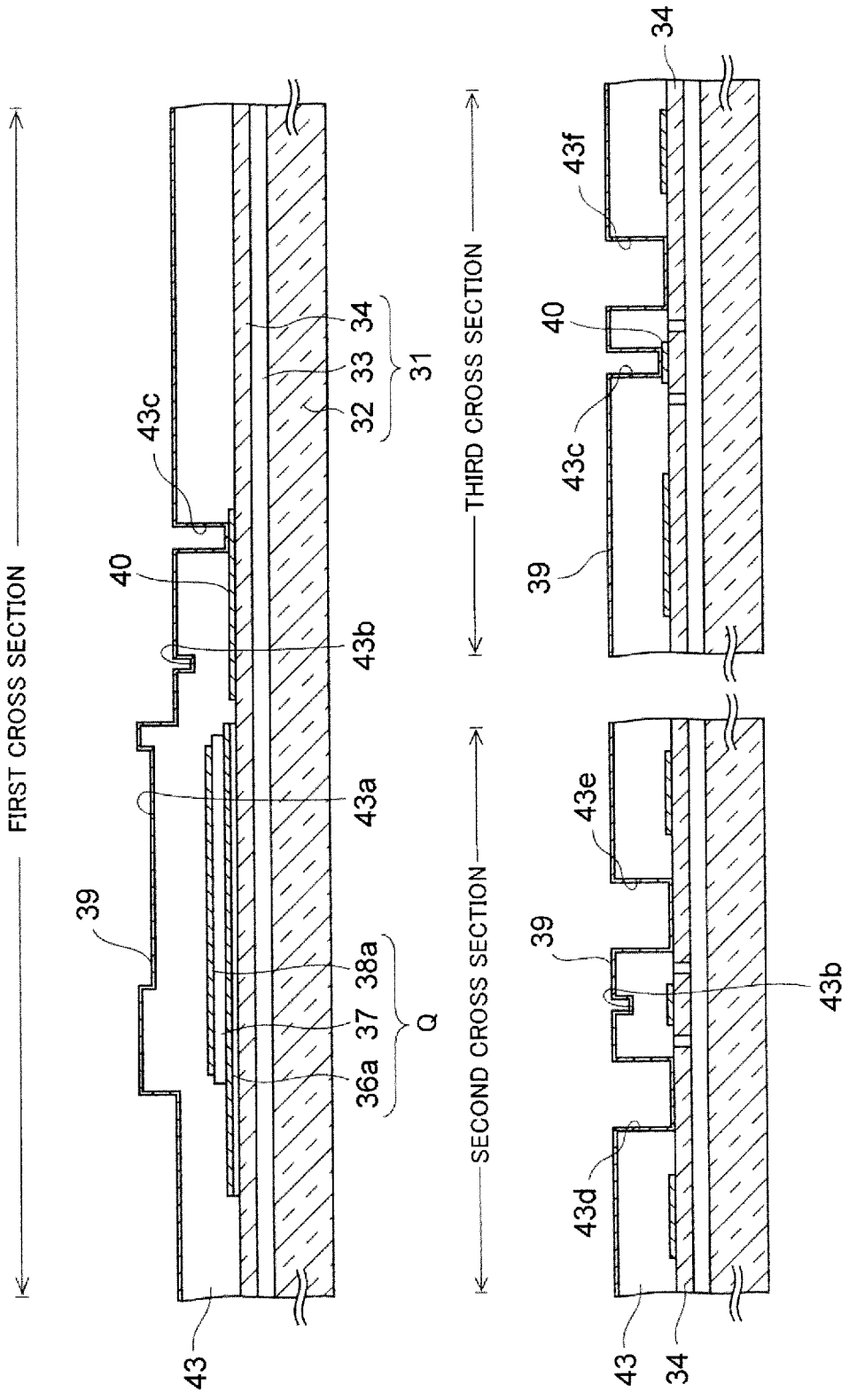

Next, as illustrated in FIG. 9G, a molybdenum film having a thickness of about 50 nm and a gold film having a thickness of about 500 nm are formed in this order on a top surface of the sacrificial insulating film 43, inner surfaces of the first and second recessed portions 43a and 43b, and inner surfaces of the first to fourth openings 43c to 43f, as a seed layer 39 by sputtering.

Next, steps performed to obtain a cross-sectional structure illustrated in FIG. 9H are described.

First, a photoresist is applied onto the seed layer 39 and a second resist pattern 52 is formed by exposing and developing the photoresist. The second resist pattern 52 includes a window 52a overlapping the first opening 43c and the fourth opening 43f described above.

Then, a gold film is grown to a thickness of about 3 μm in the window 52a by electroplating with the seed layer 39 used as a power feeding layer. This gold film functions as the bridge electrode 45.

As illustrated in circles of dotted lines in the third cross section, the second resist pattern 52 is formed in portions of side surfaces of the first opening 43c and the fourth opening 43f where no bridge electrode 45 is formed. Accordingly, no gold film grows in these portions.

Thereafter, the second resist pattern 52 is removed.

Figure 9I:
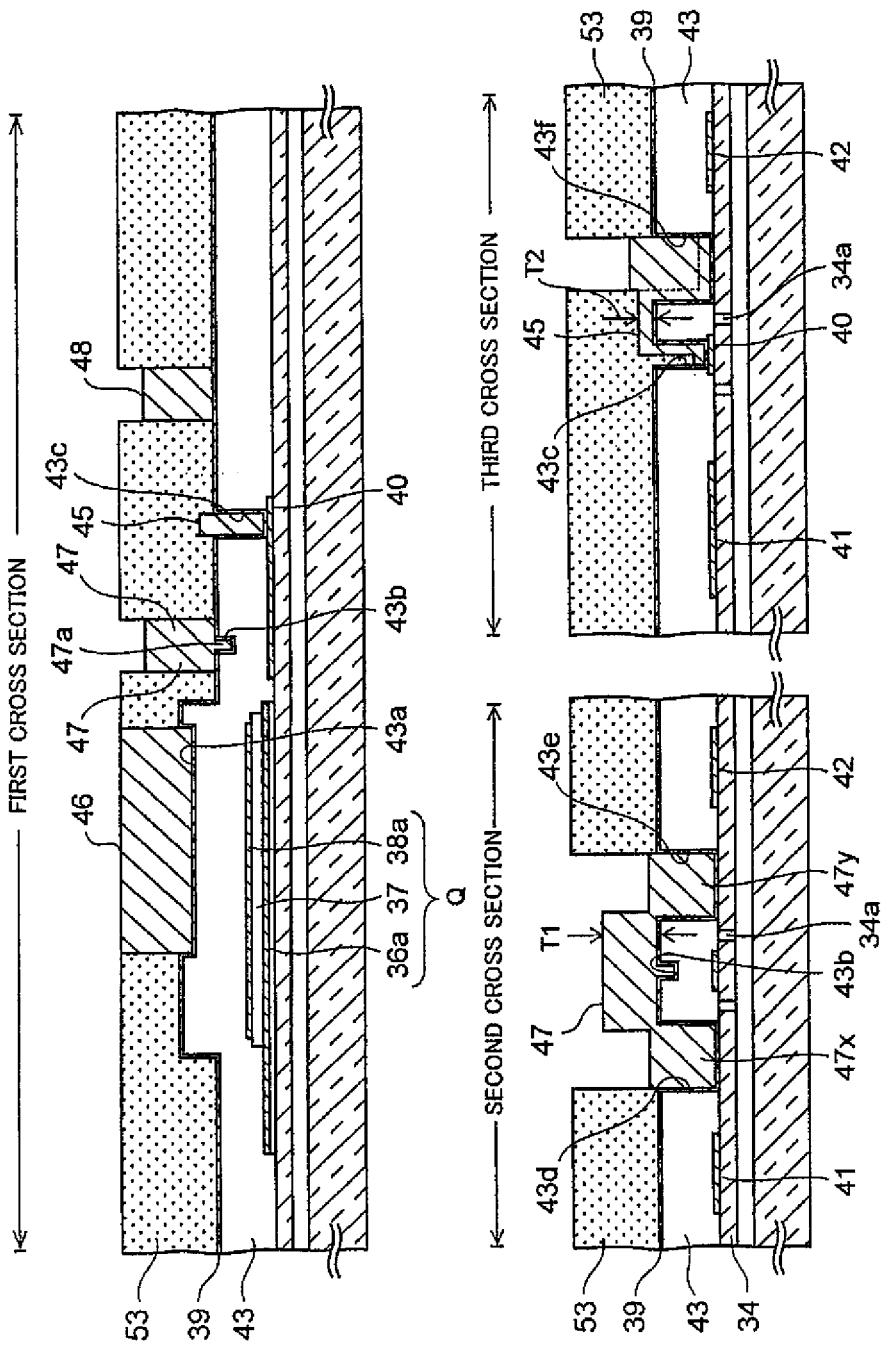

Next, as illustrated in FIG. 9I, a photoresist is applied onto the seed layer 39 again and a third resist pattern 53 is formed by exposing and developing the photoresist.

Then, a gold film is grown on the seed layer 39 in a portion not cover with the third resist pattern 53 by electroplating with the seed layer 39 used as an power feeding layer. This gold film functions as the first ground electrode 46, the contact electrode 47, and the second ground electrode 48.

As illustrated in the first cross section, the first ground electrode 46 is formed in the first recessed portion 43a and the distance between the first ground electrode 46 and the upper electrode 38a can be adjusted by adjusting the depth of the first recessed portion 43a.

Meanwhile, the protrusion 47a reflecting the second recessed portion 43b is formed in the contact electrode 47.

Moreover, as illustrated in the third cross section, a portion of the bridge electrode 45 which is formed outside the fourth opening 43f is covered with the third resist pattern 53. Accordingly, the film thickness of this portion is not increased by the newly-formed gold film and the flexibility of the bridge electrode 45 is thus maintained.

Furthermore, a portion of the bridge electrode 45 which is formed in the fourth opening 43f is increased in film thickness by the newly-formed gold film and the strength of this portion is thus increased.

In addition, as illustrated in the second cross section, portions of the contact electrode 47 which are formed in the second opening 43d and the third opening 43e function respectively as a first anchor 47x and a second anchor 47y fixing the bridge-shaped contact electrode 47 to the silicon film 34.

There are no particular limitations on the thickness of the contact electrode 47. In the present embodiment, the thickness T1 of the contact electrode 47 in a portion above the slits 34a is set to about 20 μm by setting the thickness of the gold film formed in this step to about 20 μm.

Note that the thickness T2 of the bridge electrode 45 covered with the third resist pattern 53 as described above is about 3 μm in a portion above the slits 34a and is smaller than the thickness T1 of the contact electrode 47.

Figure 10D:
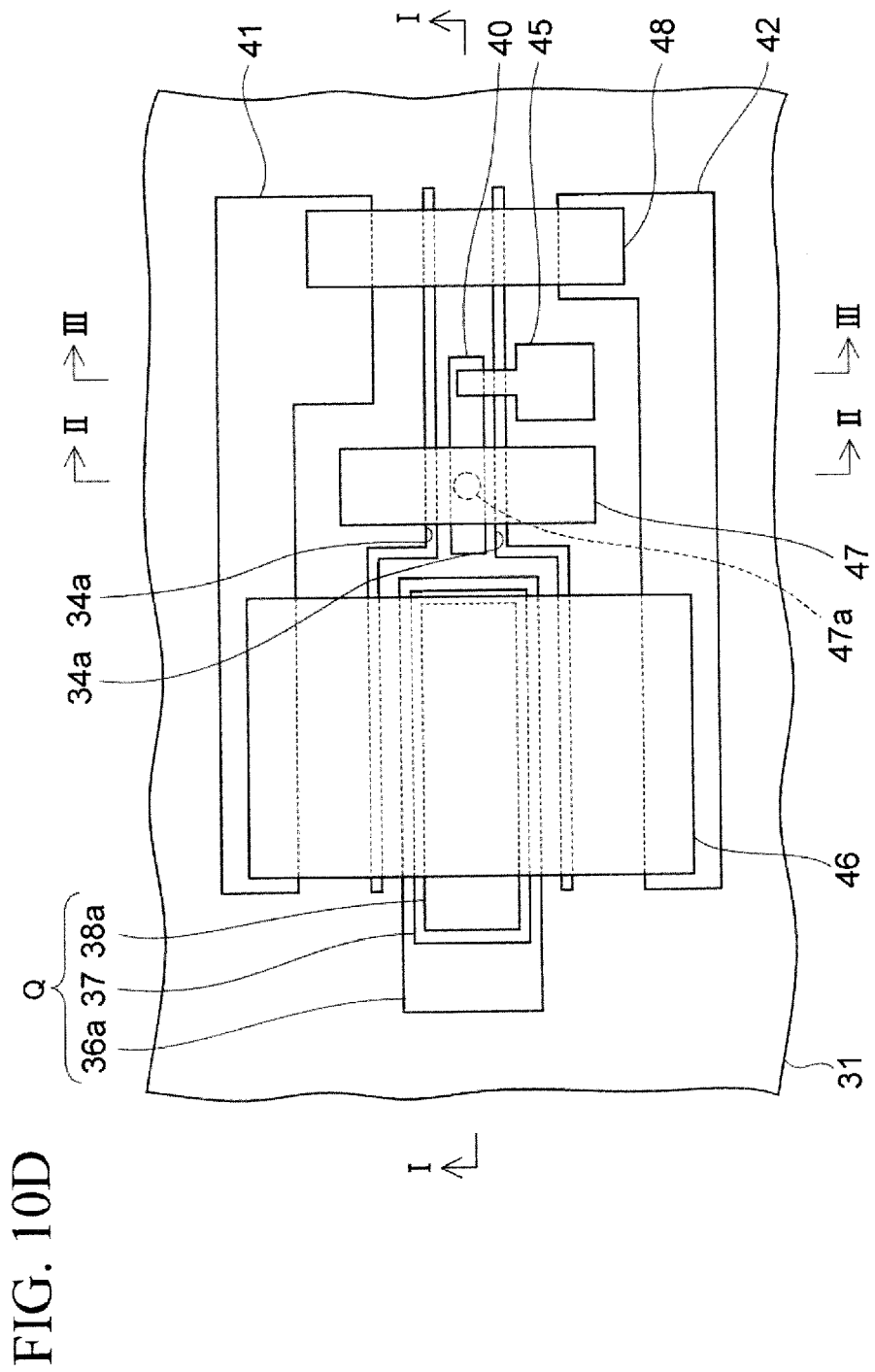

FIG. 10D is a plan view after the completion of this step. In FIG. 9I described above, the first cross section corresponds to a cross section taken along the line I-I of FIG. 10D and the second cross section corresponds to a cross section taken along the line II-II of FIG. 10D. Moreover, the third cross section of FIG. 9I corresponds to a cross section taken along the line III-III of FIG. 10D.

Figure 9J:
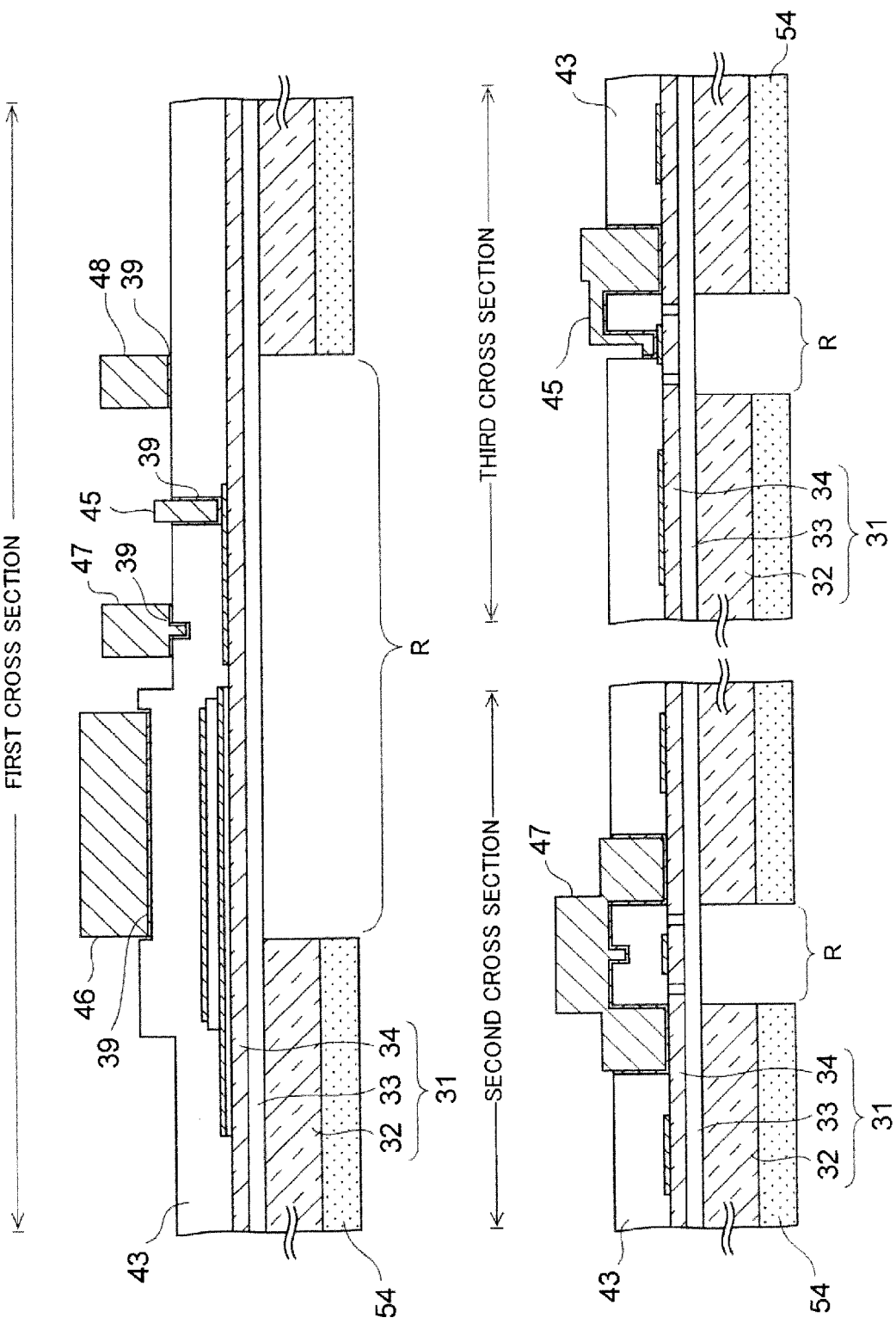

Next, steps performed to obtain a cross-sectional structure illustrated in FIG. 9J are described.

First, the seed layer 39 exposed on the top surface of the sacrificial insulating film 43 is removed by wet etching with a mixed solution of iodine and potassium iodide used as an etchant.

Then, a photoresist is applied to a back surface of the silicon substrate 32 and a fourth resist pattern 54 is formed by exposing and developing the photoresist.

Then, the silicon substrate 32 is dry-etched by Deep-RIE with the fourth resist pattern 54 used as a mask and a partial region R of the silicon substrate 32 is removed. There are no particular limitations on an etching gas used in the dry etching. In the present embodiment, $SF_6$ and $C_4F_8$ are alternately supplied into an etching atmosphere as the etching gas, Before the fourth resist pattern 54 is formed, the thermal oxidation film remaining on the back surface of the silicon substrate 32 may be removed in advance by using the hydrofluoric acid solution to prevent the thermal oxidation film from functioning as a mask for the dry etching in this step.

Next, as illustrated in FIG. 9K, the silicon oxide film 33 in the partial region R is removed by dry etching using $CF_4$ gas as an etching gas, with the fourth resist pattern 54 used as a mask again. Hence, a back surface of the silicon film 34 is exposed in the partial region R.

Thereafter, the fourth resist pattern 54 is removed.

Figure 9L:
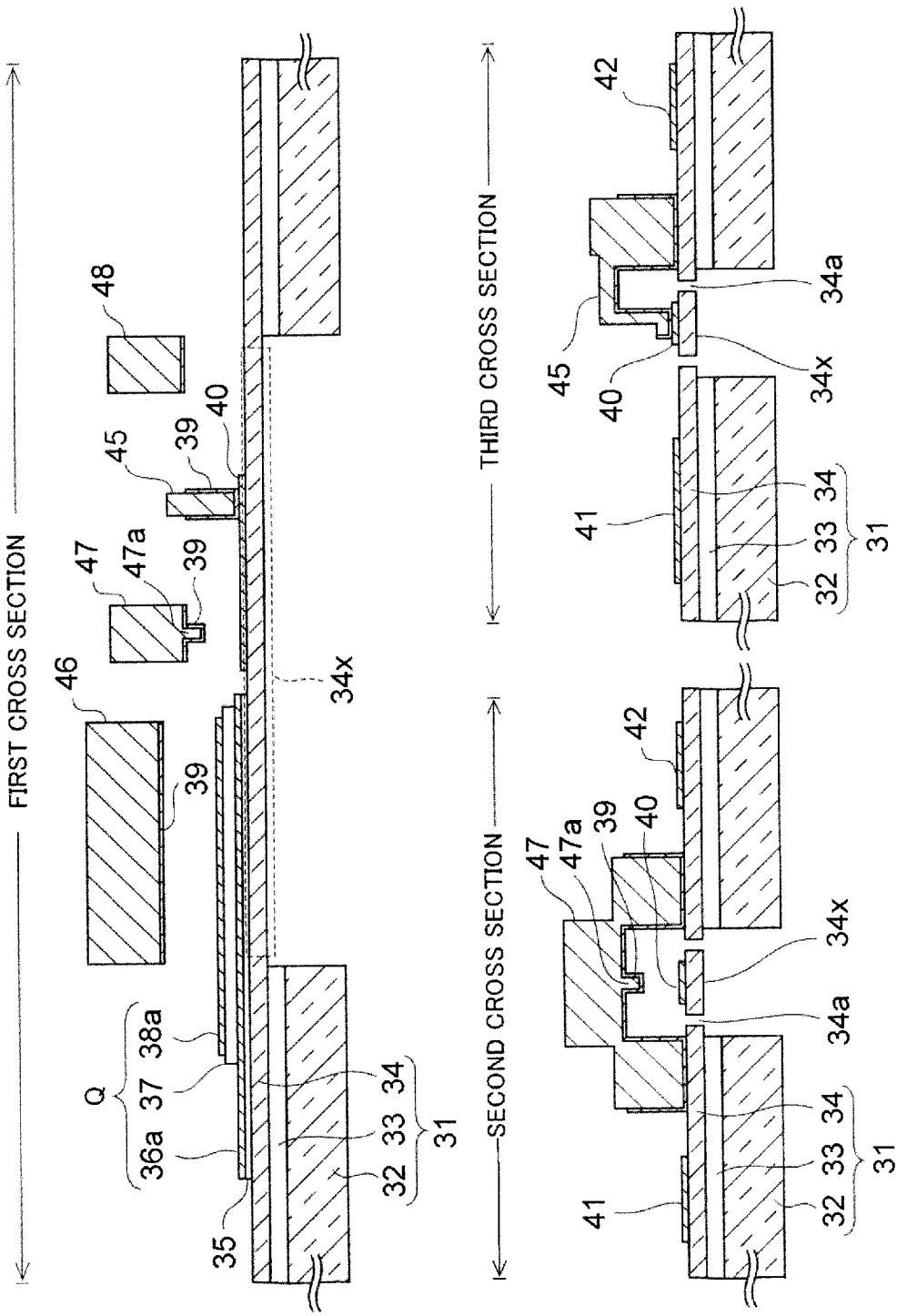

Then, as illustrated in FIG. 9L, the sacrificial insulating film 43 is removed by etching using hydrofluoric acid vapor.

Hence, the beam 34x is released from the restraining force of the silicon oxide film 33 and can thereby elastically deform.

Thereafter, as illustrated in FIG. 9M, only the molybdenum film in the seed layer 39 remaining under the contact electrode 47 is removed by wet etching with a mixed solution of phosphoric acid, acetic acid, and nitric acid used as an etchant.

As a result of this etching, the gold film with low resistance is exposed in the protrusion 47a of the contact electrode 47. Accordingly, it is possible to reduce the contact resistance between the conductive pattern 40 and the contact electrode 47 when the beam 34x elastically deforms to bend upward.

The distance between the protrusion 47a and the conductive pattern 40 after the completion of this step is about 0.3 μm.

The basic structure of the electric device 30 according the present embodiment is thus completed. Hereafter, a step of bonding solder bumps to required portions of the electric device 30 as the external connection terminals 29 (see FIG. 4) is performed. However, details of this step are omitted.

Figure 11:
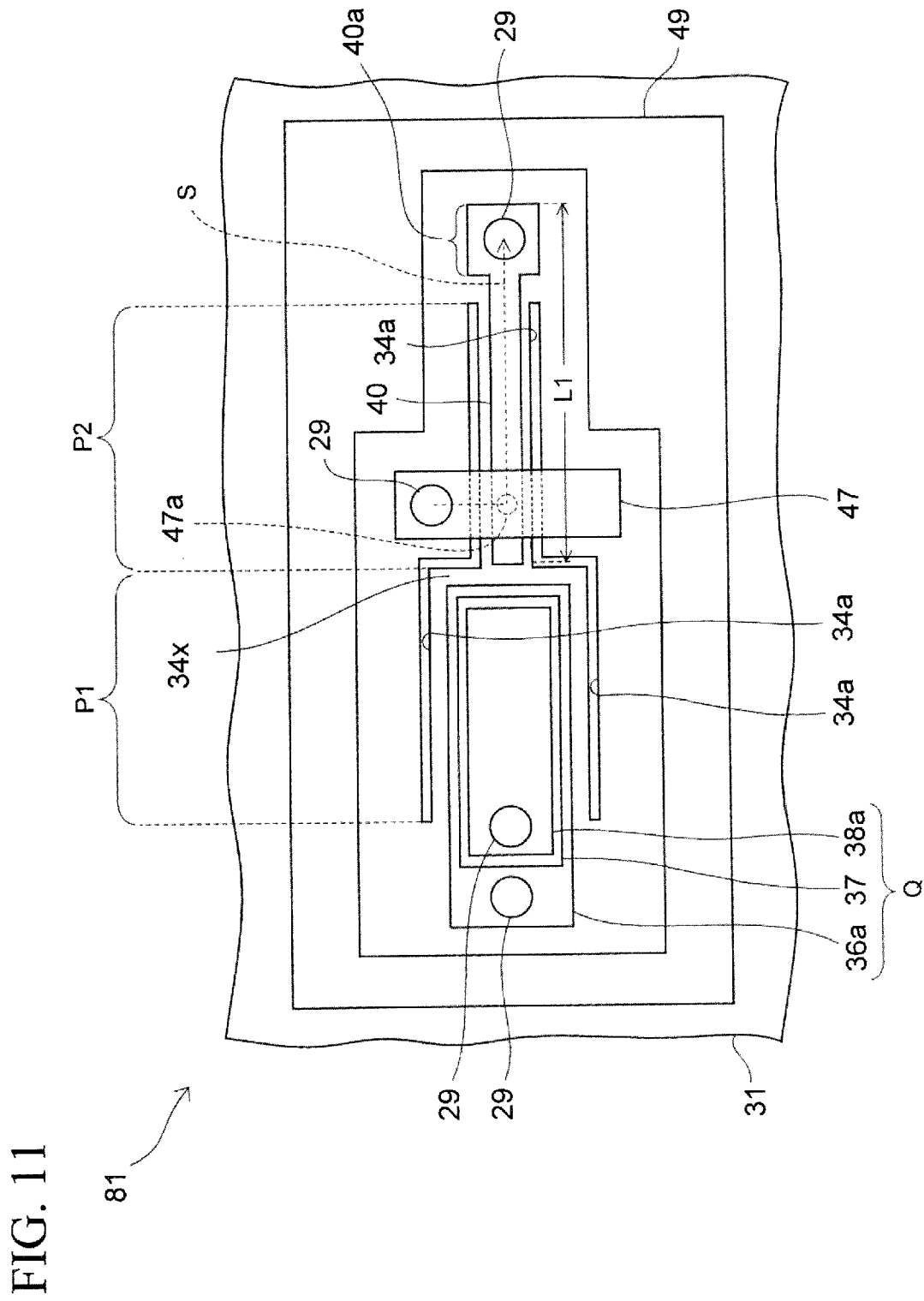
FIG. 11 is a plan view of an electric device according to a comparative example of the first embodiment.

Next, description is given of a comparative example of the present embodiment,

FIG. 11 is a plan view of an electric device 81 according to the comparative example. In FIG. 11, the same elements as those in the present embodiment are denoted by the same reference numerals used in the present embodiment and description thereof is omitted below.

As illustrated in FIG. 11, the electric device 81 is a MEMS switch of such a type that the beam 34x is bent by the piezoelectric element Q. The electric device 81 includes a ground pattern 49 forming a coplanar structure together with the conductive pattern 40 described above.

The electric device 81 is different from the present embodiment in that there is no bridge electrode 45, first ground electrode 46, or second ground electrode 48 illustrated in FIG. 5.

Since there is no bridge electrode 45, the RF signal S flowing through the conductive pattern 40 cannot be led out to the outside across the slit 34a. Hence, there is a need to provide a pad 40a at a terminal end of the conductive pattern 40 and to extract the RF signal S from the pad 40a.

As a result, the conductive pattern 40 extends over the entire length of the second portion P2 of the beam 34x and the length L1 of the conductive pattern 40 thus is longer than that in the present embodiment. The electrical resistance of the conductive pattern 40 thereby increases and a loss occurs in the RF signal S.

Reducing the electrical resistance by increasing the film thickness of conductive pattern 40 is conceivable. However, when the film thickness is increased, a strong tensile stress occurs in the conductive pattern 40 due to gold which is the material of the conductive pattern 40. Accordingly, the beam 34x warps upward even when the switch is set to the off state and the distance between the protrusion 47a and the conductive pattern 40 cannot be sufficiently maintained.

Meanwhile, when the line width of the conductive pattern 40 is increased to reduce the electric resistance of the conductive pattern 40, the width of the beam 34x the second portion P2 also needs to be increased. Accordingly, the stiffness of the second portion P2 increases and the drive voltage required to bend the beam 34x thereby increases.

Moreover, in the electric device 81, no first ground electrode 46 (see FIG. 5) is provided beside the contact electrode 47. Accordingly, the impedance of the signal path of the RF signal S cannot be adjusted by adjusting the distance between the contact electrode 47 and the first ground electrode 46.

Second Embodiment

As will be described below, an electric device of a second embodiment is such a MEMS switch that a drive voltage can be reduced compared to that of the first embodiment.

Figure 12:
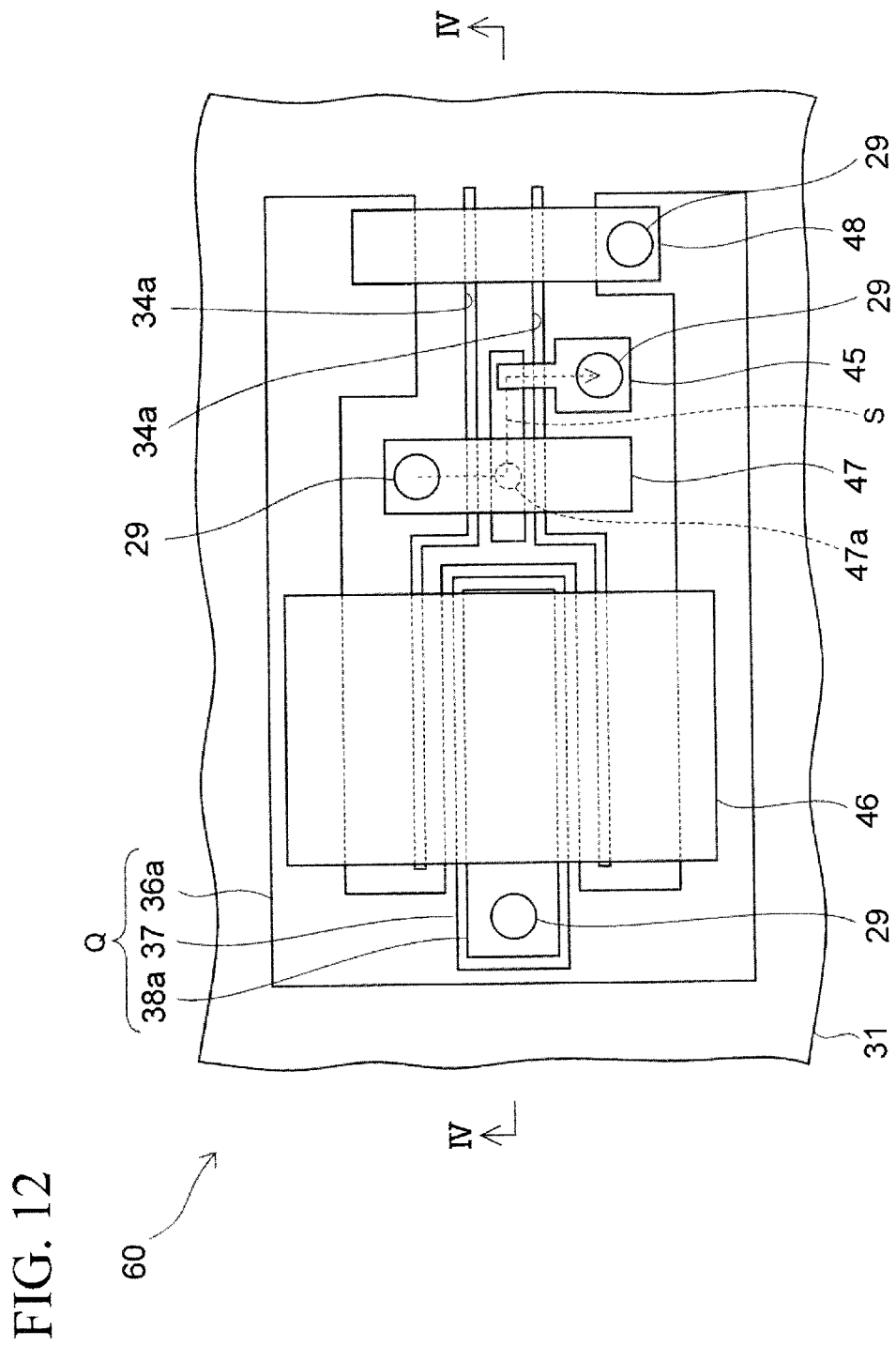
FIG. 12 is a plan view of an electric device according to a second embodiment.

FIG. 12 is a plan view of the electric device 60 according to the present embodiment. In FIG. 12, the same elements as those described in the first embodiment are denoted by the same reference numerals used in the first embodiment and description thereof is omitted below.

As illustrated in FIG. 12, in the present embodiment, a lower electrode 36a extends to portions where the first and second ground patterns 41 and 42 (see FIG. 5) are formed in the first embodiment. The lower electrode 36a is configured to also function as the first and second ground patterns 41 and 42.

Figure 13:
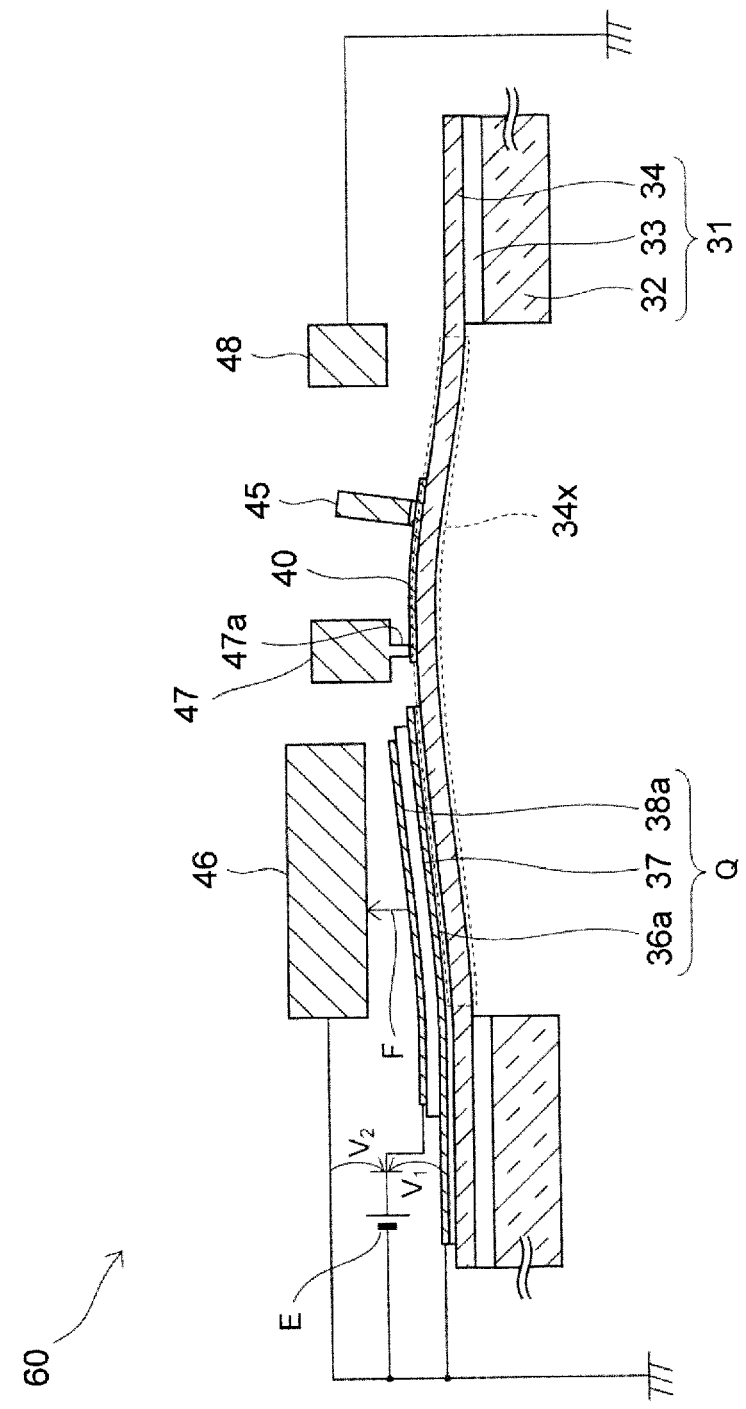
FIG. 13 is a cross-sectional view for explaining an operation of the electric device according to the second embodiment.

FIG. 13 is a cross-sectional view for explaining an operation of the electric device 60 and corresponds to a cross section taken along the line IV-IV of FIG. 12.

As illustrated in FIG. 13, in order to turn the electric device 30 on, a direct current power supply E having a voltage value of about 7 V is connected to an upper electrode 38a and the lower electrode 36a is set to a ground potential.

This causes a first drive voltage $V_1$ to be applied between the lower electrode 36a and the upper electrode 38a, and a second drive voltage $V_2$ to be applied between the upper electrode 38a and a first ground electrode 46.

When the two drive voltages $V_1$ and $V_2$ are used in this manner, a piezoelectric element Q is driven by the first drive voltage $V_1$ and, in addition, an electrostatic attraction F occurs between the upper electrode 38a and the first ground electrode 46 by the second drive voltage $V_2$. Therefore, the beam 34x is bent also by this electrostatic attraction F.

Accordingly, the beam 34x is bent sufficiently even when the first drive voltage $V_1$ applied to the piezoelectric element Q is reduced. Thus, the drive voltage required for switching can be reduced compared to that in the first embodiment.

Although the values of the first drive voltage $V_1$ and the second drive voltage $V_2$ are the same since the single direct current power supply E is used, the present embodiment is not limited to this configuration. For example, the first and second drive voltages $V_1$ and $V_2$ may have different values by separately applying voltages to the lower electrode 36a, the upper electrode 38a, and the first ground electrode 46 with a plurality of direct current power supplies E.

Furthermore, instead of reducing the drive voltage as described above, the voltage value of the direct current power supply E may be set to about 10 V which is the same value as the drive voltage V in the first embodiment. This causes both of the electrostatic attraction F and the drive force of the piezoelectric element Q to act on a protrusion 47a, and the protrusion 47a is thus pressed strongly against a conductive pattern 40. Accordingly, even when a film of an organic materials and the like is formed on a surface of the protrusion 47a due to long-term usage, this film is broken by turning the switch on. Hence, an increase in on resistance due to the film is prevented, and the life of the electric device 60 can be made longer.

Third Embodiment

In a third embodiment, description is given of an electric device which can be made smaller than that in the first embodiment.

Figure 14:
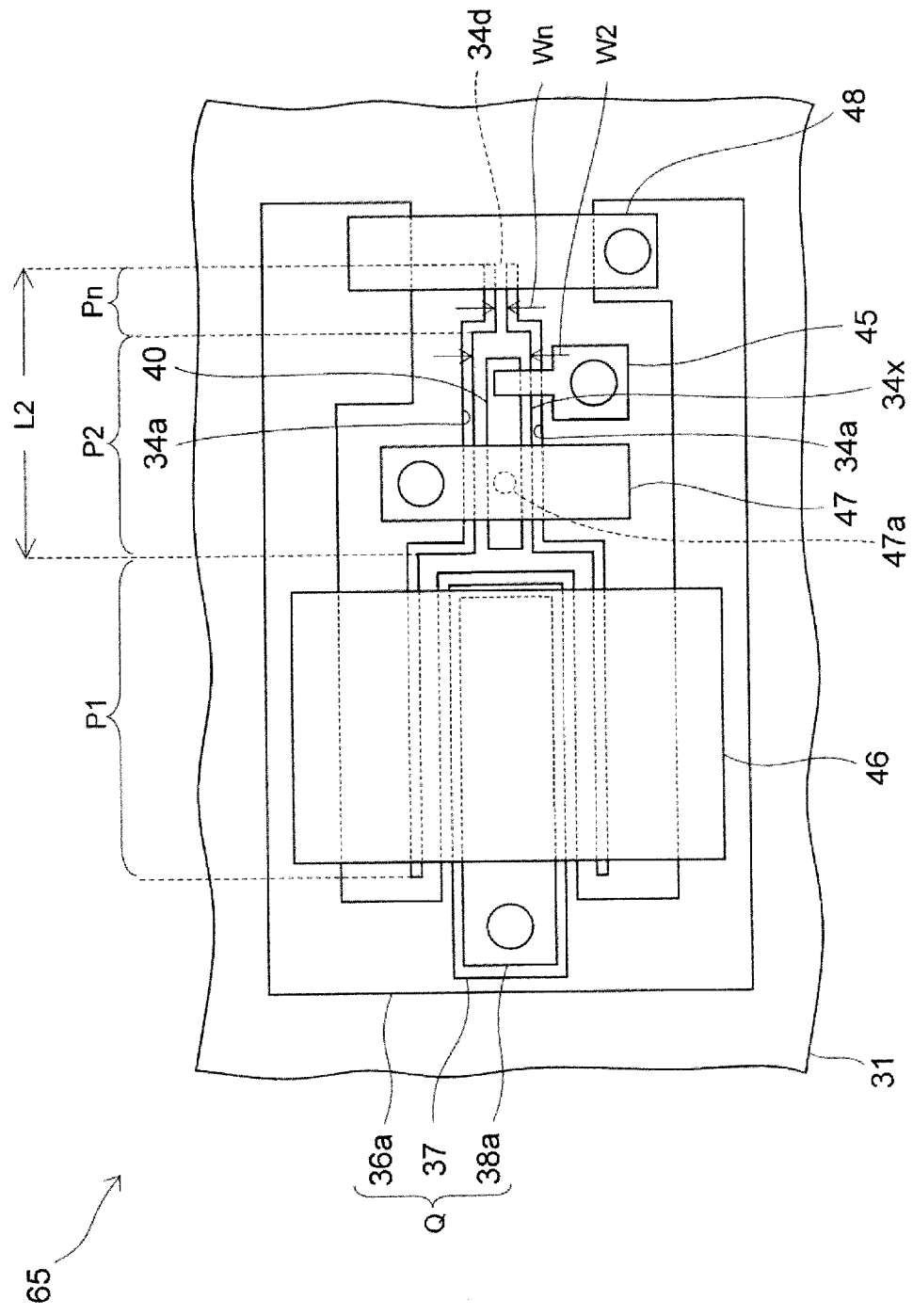
FIG. 14 is a plan view of an electric device according to a third embodiment.

FIG. 14 is a plan view of the electric device 65 according to the present embodiment. In FIG. 14, the same elements as those described in the first embodiment are denoted by the same reference numerals used in the first embodiment and description thereof is omitted below.

The electric device 65 is a MEMS switch and includes a narrow portion Pn in an end portion 34d of a beam 34x, the narrow portion Pn having a width Wn narrower than the width W2 of a second portion P2.

The stiffness of the narrow portion Pn having the narrow width Wn is lower than that of the second portion P2. Accordingly, even when a length L2 which is a total length of the second portion P2 and the narrow portion Pn is reduced, the second portion P2 can easily elastically deform to bend upward by a drive force of a piezoelectric element Q. Hence, the device can be made smaller.

Fourth Embodiment

An electric device of a fourth embodiment is a MEMS switch whose life can be made longer as described below.

Figure 15:
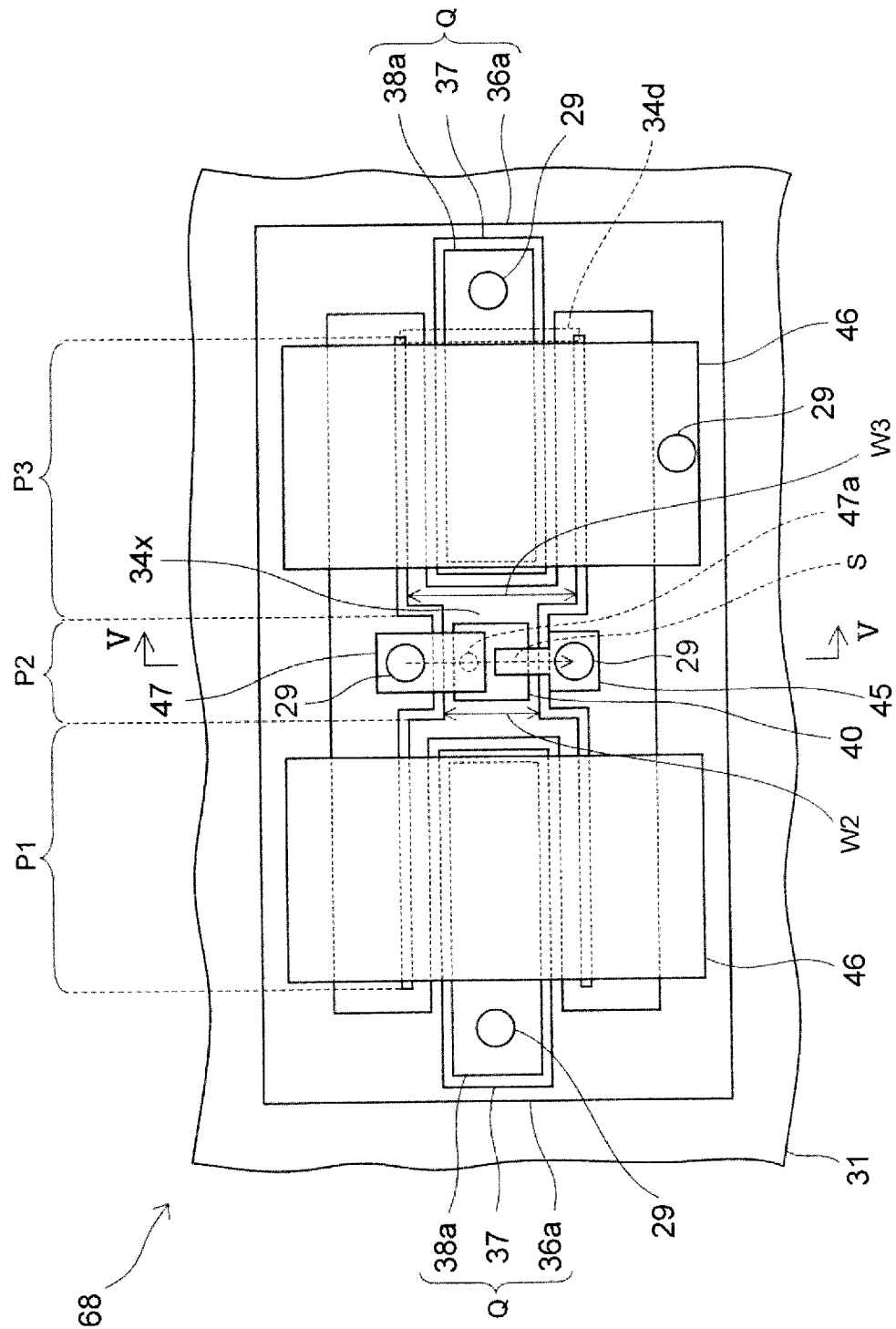
FIG. 15 is a plan view of an electric device according to a fourth embodiment.

FIG. 15 is a plan view of the electric device 68 according to the present embodiment. In FIG. 15, the same elements as those described in the first embodiment are denoted by the same reference numerals used in the first embodiment and description thereof is omitted below.

In the electric device 68, a third portion P3 having a width W3 wider than the width W2 of a second portion P2 is formed in a portion of a beam 34x closer to the other end portion 34d than the second portion P2. A piezoelectric element Q is provided also in this third portion P3.

The shape of the beam 34x in the third portion P3 is similar to the shape of the beam 34x in a first portion P1. Making the width W3 wider than the width W2 of the second portion P2 allows the piezoelectric element Q to be formed in a large region of the third portion P3, and thereby increase the drive force of the piezoelectric element Q.

Moreover, a conductive pattern 40 is formed to have a substantially square shape in a plan view, and a bridge electrode 45 and a contact electrode 47 are disposed above the conductive pattern 40. In the present embodiment, the bridge electrode 45 and the contact electrode 47 are arranged in a line along a signal path of an RF signal S.

Figure 16:
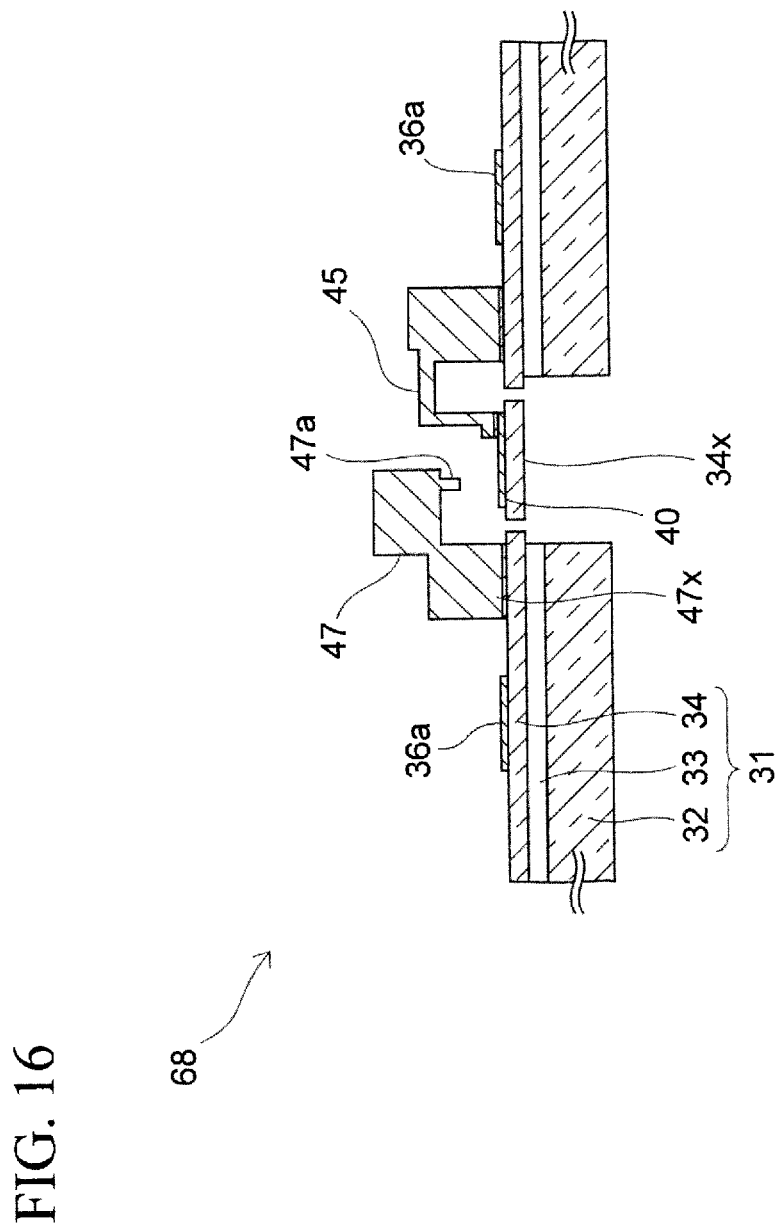
FIG. 16 is a cross-sectional view taken along the line V-V of FIG. 15.

FIG. 16 is a cross-sectional view taken along the line V-V of FIG. 15.

In the first embodiment, the first anchor 47x and the second anchor 47y (see FIG. 9I) fixing the contact electrode 47 to the silicon film 34 are formed. However, in the present embodiment, only a first anchor 47x is formed, and an end portion of the contact electrode 47 close to a protrusion 47a is a free end.

In the electric device 68 described above, the two piezoelectric elements Q are formed as illustrated in FIG. 15. Accordingly, the protrusion 47a of the contact electrode 47 is pressed more strongly against the conductive pattern 40 than in the case where there is only one piezoelectric element Q. As described in the second embodiment, such an increase in pressing force suppresses an increase in on resistance due to long-term usage of the electric device. Hence, the life of the electric device can be made longer in the present embodiment.

Fifth Embodiment

In each of the first to fourth embodiments, description is given of the electric device in which the beam 34x is driven by the piezoelectric element Q.

In contrast, in the present embodiment, description is given of an electric device in which a beam 34x is driven by an electrostatic attraction.

Figure 17:
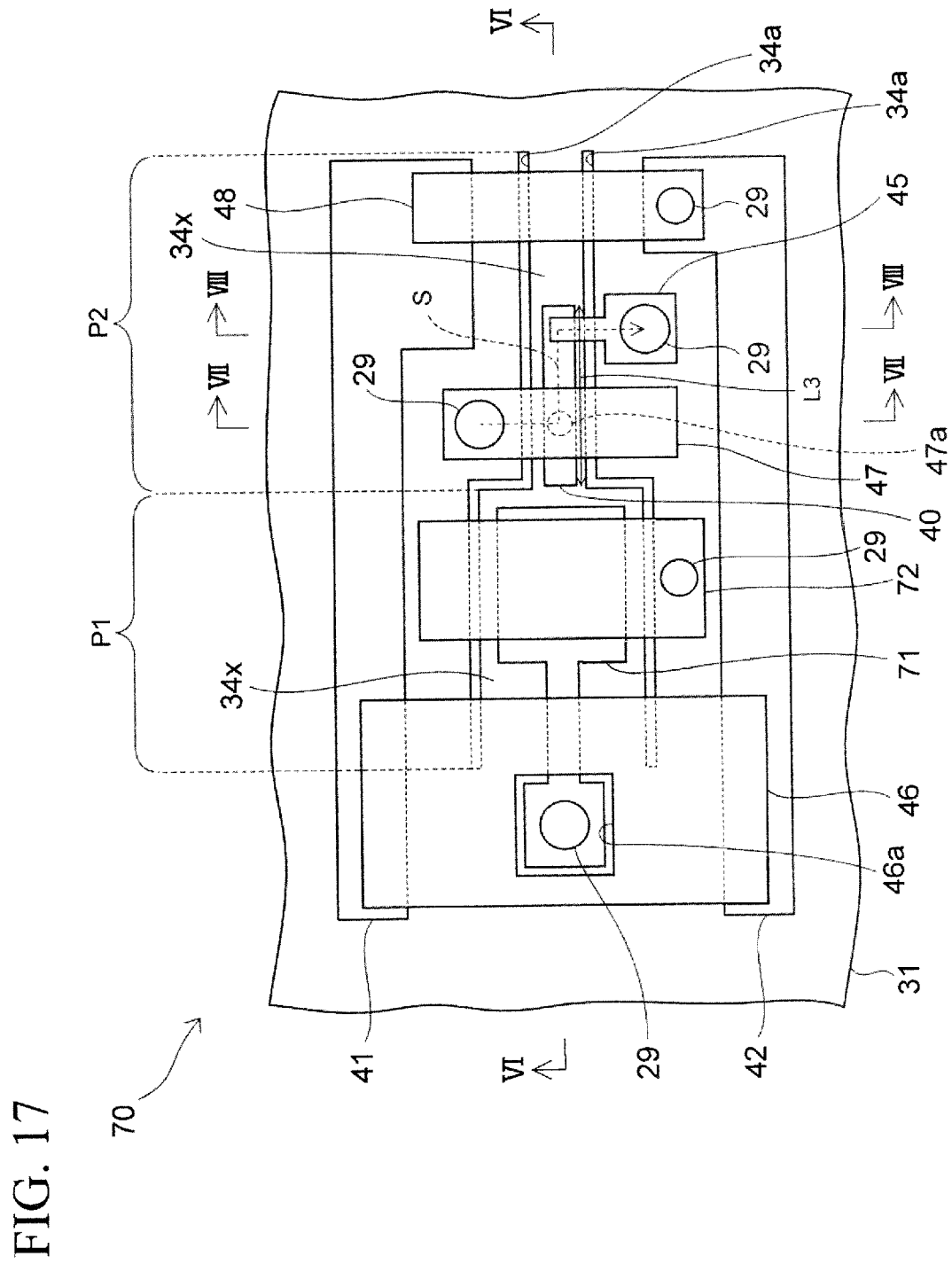
FIG. 17 is a plan view of an electric device according to a fifth embodiment.

FIG. 17 is a plan view of the electric device 70 according to the present embodiment. In FIG. 17, the same elements as those described in the first to fourth embodiments are denoted by the same reference numerals used in these embodiments and description thereof is omitted below.

The electric device 70 is a MEMS switch and includes a first drive electrode 71 on a top surface of the beam 34x in a first portion P1 and also includes a second drive electrode 72 above the first drive electrode 71.

Furthermore, a solder bump is bonded to the top surface of the first drive electrode 71 as an external connection terminal 29, and an opening 46a from which the external connection terminal 29 is exposed is formed in a first ground electrode 46.

Next, a switching operation of the electric device 70 is described.

FIG. 18 is a cross-sectional view for explaining the switching operation of the electric device 70 and corresponds to a cross section taken along the line VI-VI of FIG. 17.

In actual usage, a direct current power supply E is connected between the first drive electrode 71 and the second drive electrode 72, and a drive voltage V of about 10 V is applied between these electrodes to generate an electrostatic attraction F between these electrodes. The beam 34x is thereby bent upward and a protrusion 47a of a contact electrode 47 comes into contact with a conductive pattern 40. The electric device 70 is thus turned on. Note that the electric device 70 can be turned off by stopping the application of the drive voltage V.

In the present embodiment described above, no piezoelectric element Q of the first embodiment is formed as illustrated in FIG. 17. Thus, a formation step of the piezoelectric element Q is unnecessary, and cost reduction of the electric device 70 can be achieved.

Furthermore, as in the first embodiment, an RF signal S is led out to the outside from a middle of the conductive pattern 40 via a bridge electrode 45. Accordingly, it is possible to reduce the length L3 of the conductive pattern 40 and thereby suppress a loss in the RF signal S.

Further, the first ground electrode 46 and a second ground electrode 48 form a coplanar structure together with the bridge electrode 45 and the contact electrode 47. Accordingly, as in the first embodiment, the impedances of paths through which the RF signal S flows can be easily adjusted.

Next, a method of manufacturing the electric device 70 is described.

FIGS. 19A to 19E are each a cross-sectional view of the electric device 70 in the course of manufacturing thereof according to the present embodiment.

In FIGS. 19A to 19E, the same elements as those described in the first to fourth embodiments are denoted by the same reference numerals used in these embodiments and description thereof are omitted.

In each of FIGS. 19A to 19E, a first cross section corresponds to a cross section taken along the line VI-VI of FIG. 17 and a second cross section corresponds to a cross section taken along the line VII-VII of FIG. 17. Moreover, a third cross section corresponds to a cross section taken along the line VIII-VIII of FIG. 17.

The electric device 70 is manufactured as follows by using a MEMS technology.

Figure 19A:
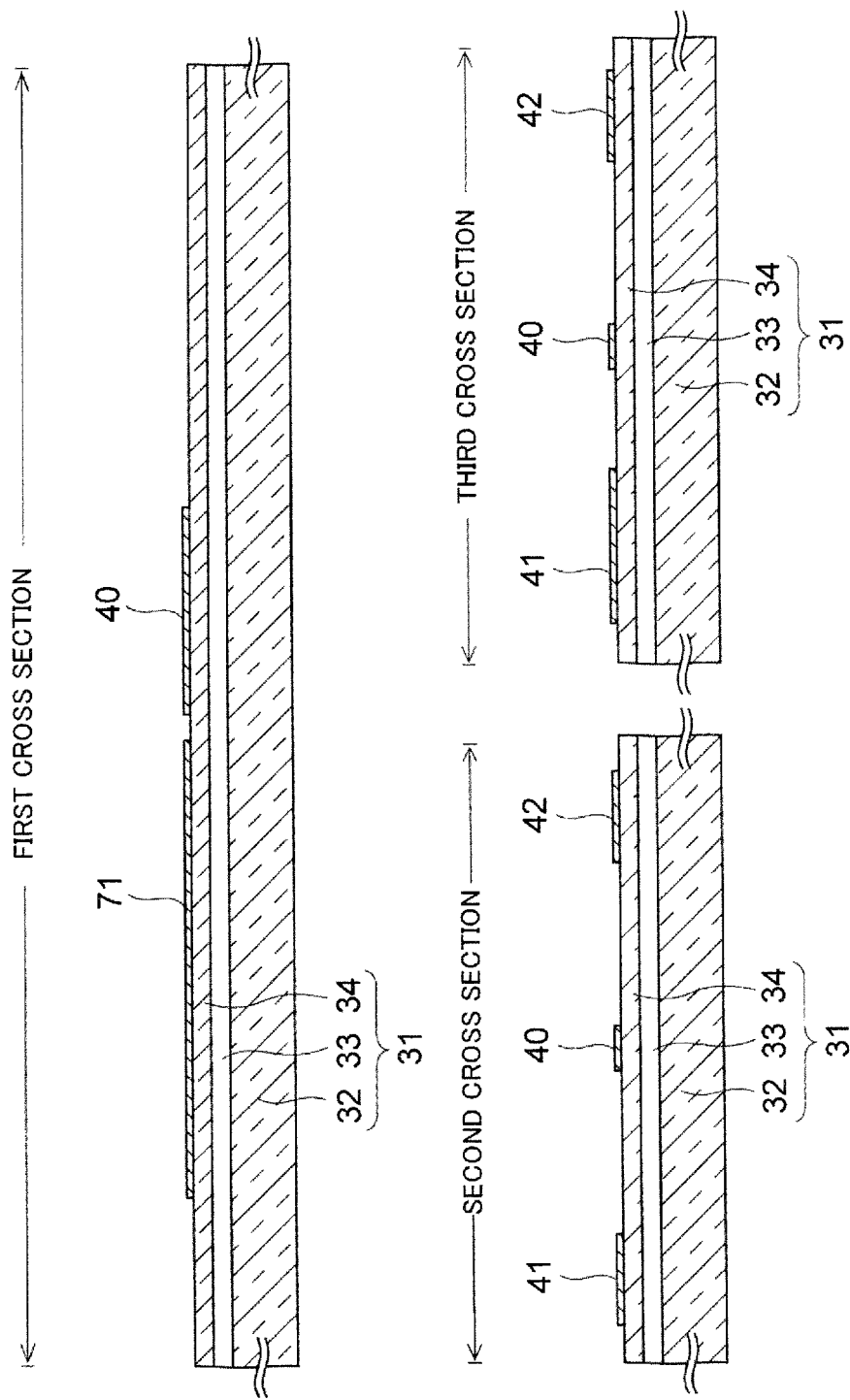

First, a base member 31, which may be an SOI substrate, is prepared as illustrated in FIG. 19A. Then, a titanium film and a gold film are formed in this order on a silicon film 34 of the base member 31 by sputtering. Thereafter, these films are patterned by a lift-off method and the conductive pattern 40, first and second ground patterns 41 and 42, and the first drive electrode 71 are thereby formed.

There are no particular limitations on the thicknesses of the titanium film and the gold film. In the present embodiment, the titanium film is formed to have a thickness of about 50 nm and a gold film is formed to have a thickness of about 500 nm.

FIG. 20A is a plan view after the completion of this step. In FIG. 19A described above, the first cross section corresponds to a cross section taken along the line VI-VI of FIG. 20A and the second cross section corresponds to a cross section taken along the line VII-VII of FIG. 20A. Moreover, the third cross section of FIG. 19A corresponds to a cross section taken along the line VIII-VIII of FIG. 20A.

Next, as illustrated in FIG. 19B, slits 34a each having a width of about 2 μm are formed in the silicon substrate 34 by dry etching. Part of the silicon film 34 is defined as the beam 34x by the slits 34a.

Since a method of forming the slits 34a is the same as that described in the first embodiment with reference to FIG. 9E, description thereof is omitted.

Figure 20B:
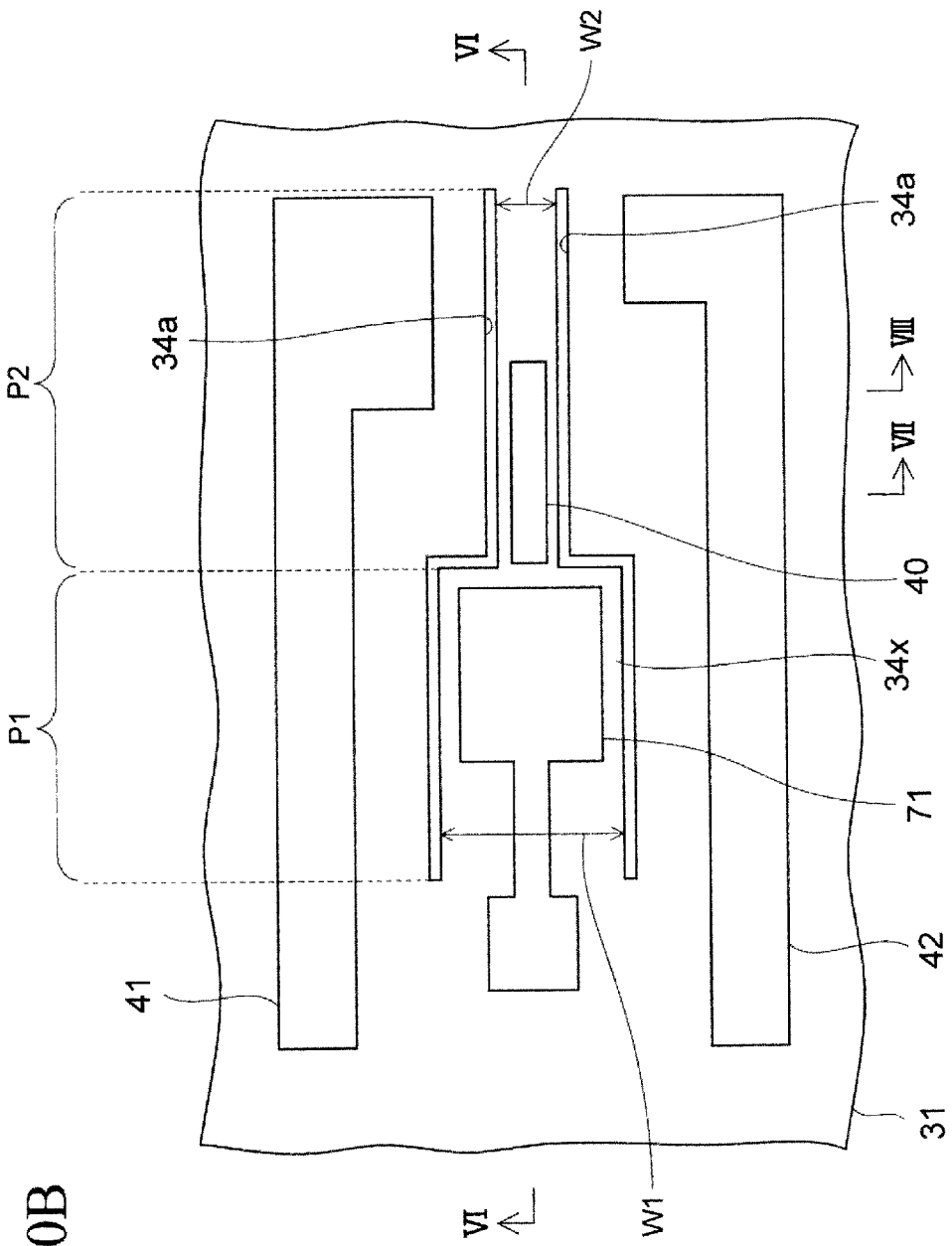

FIG. 20B is a plan view after the completion of this step. In FIG. 19B described above, the first cross section corresponds to a cross section taken along the line VI-VI of FIG. 20B and the second cross section corresponds to a cross section taken along the line VII-VII of FIG. 20B. Moreover, the third cross section of FIG. 19B corresponds to a cross section taken along the line VIII-VIII of FIG. 20B.

As illustrated in FIG. 20B, the beam 34x having an outline partially defined by the slits 34a includes the first portion P1 and a second portion P2. The conductive pattern 40 is formed to be small enough accommodated within the second portion P2 out of these portions.

Part of the first drive electrode 71 is formed in the first portion P1.

Moreover, as in the first embodiment, the first portion P1 is formed such that the width W1 thereof is wider than the width W2 of the second portion P2.

Figure 19C:
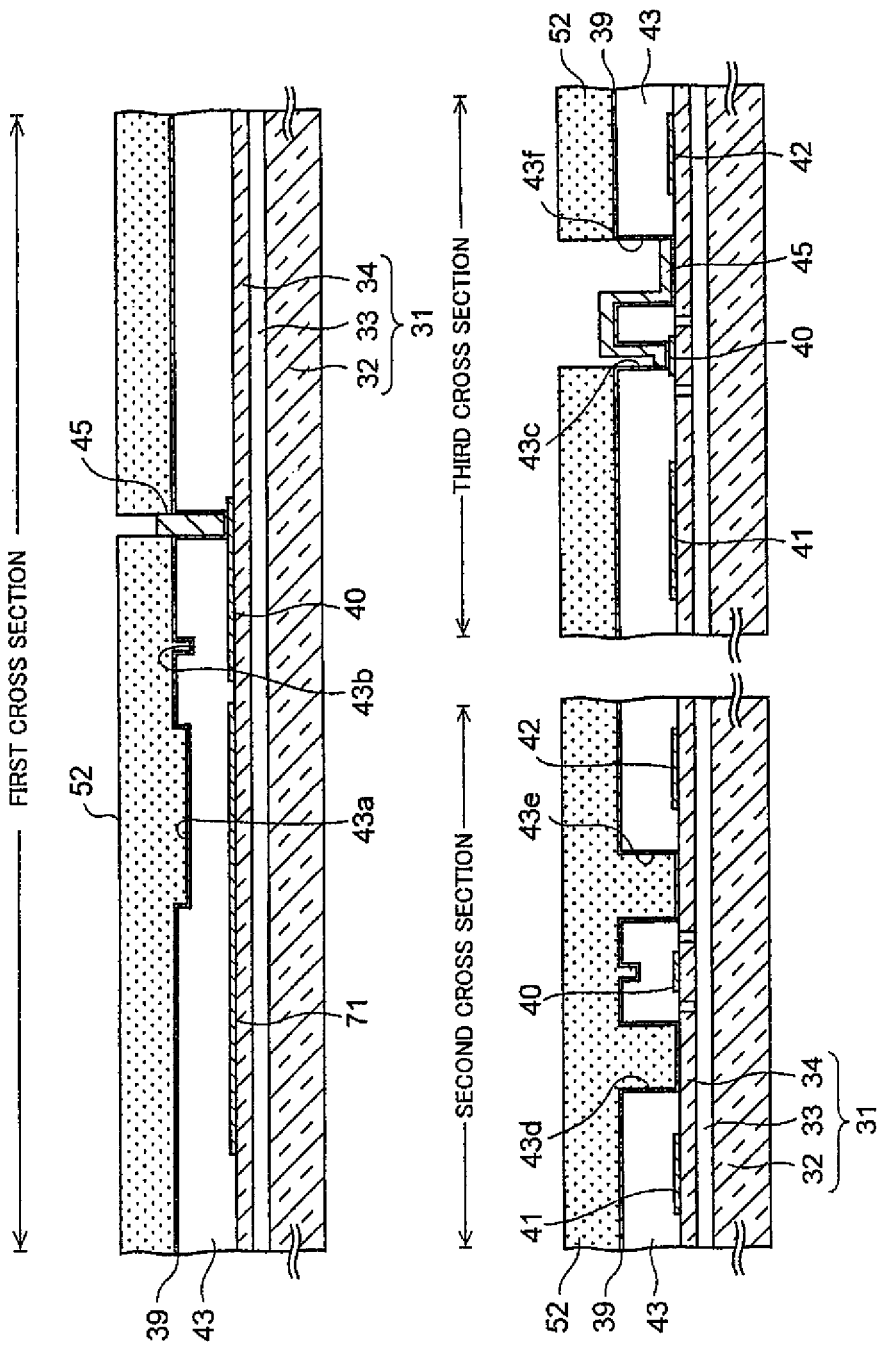

Next, as illustrated in FIG. 19C, a sacrificial insulating film 43 and the bridge electrode 45 are formed on the base member 31 by following the steps of FIG. 9F to 9H of the first embodiment. As described in the first embodiment, the bridge electrode 45 is formed by electroplating in which a seed layer 39 is used as a power feeding layer.

Figure 19D:
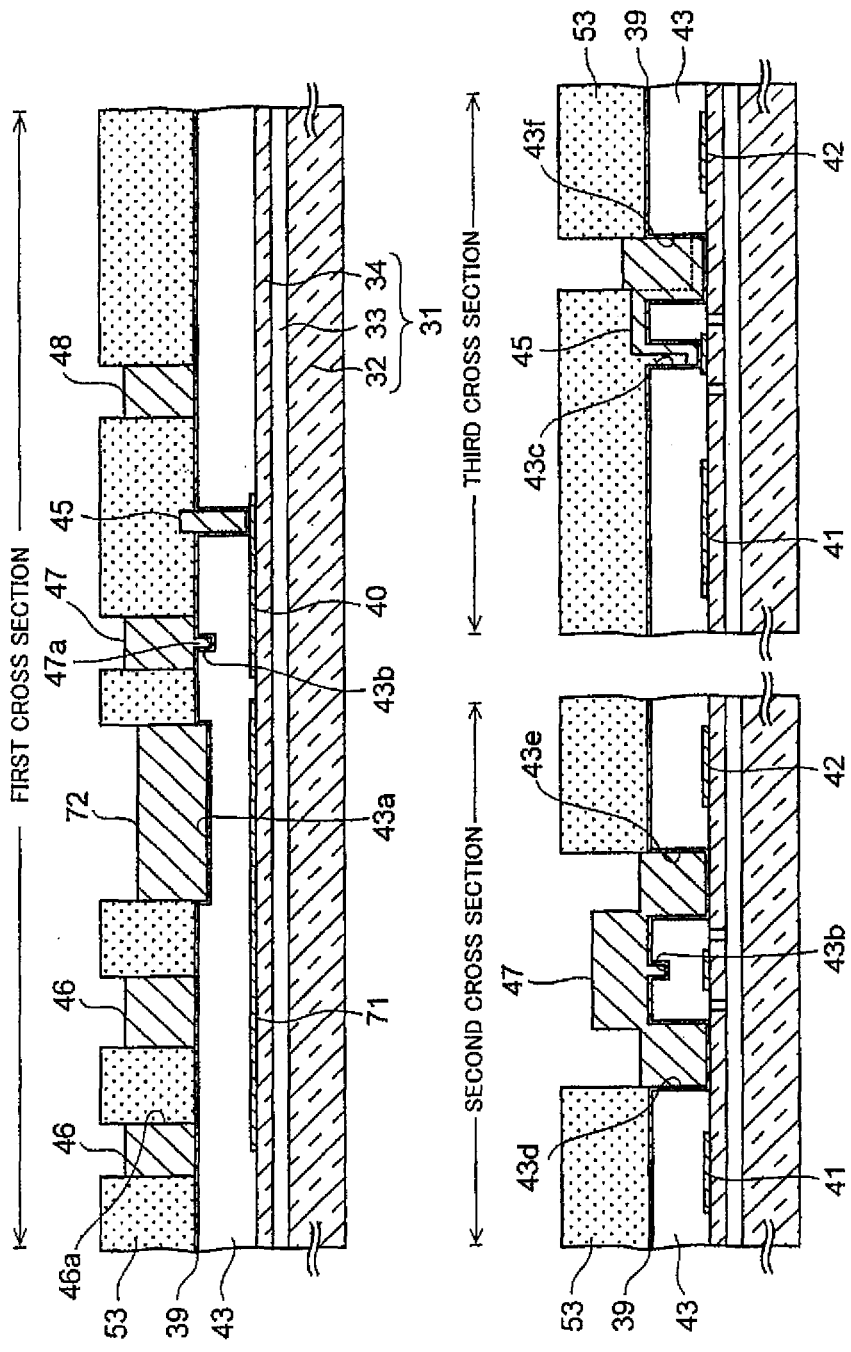

Subsequently, as illustrated in FIG. 19D, a third resist pattern 53 is formed on the seed layer 39.

Then, a gold film is grown on a portion of the seed layer 39 which is not covered with the third resist pattern 53, by electroplating with the seed layer 39 used as a power feeding layer. The gold film functions as the first ground electrode 46, the contact electrode 47, the second ground electrode 48, and the second drive electrode 72.

There are no particular limitations on the thickness of the gold film. In the present embodiment, the gold film is formed to a thickness of about 20 μm. Moreover, in the first ground electrode 46 thus formed, the opening 46a is formed with the third resist pattern 53 functioning as a mask for plating.

Figure 19E:
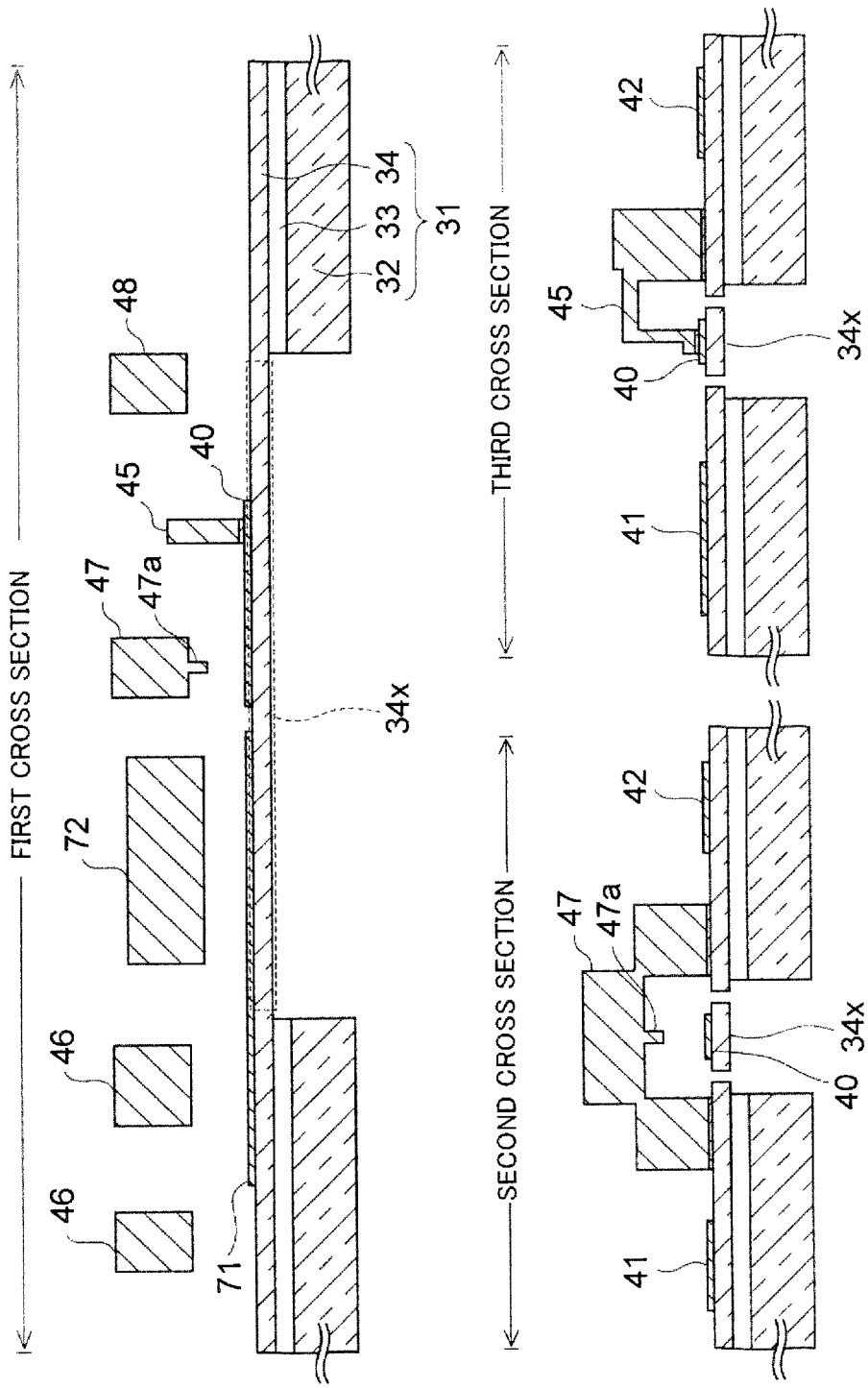

Thereafter, the steps of FIGS. 9J to 9L described in the first embodiment are performed and the beam 34x elastically deformable to bend upward and downward is thereby formed as illustrated in FIG. 19E.

FIG. 20C is a plan view after the completion of this step. In FIG. 19E described above, the first cross section corresponds to a cross section taken along the line VI-VI of FIG. 20C and the second cross section corresponds to a cross section taken along the line VII-VII of FIG. 20C. Moreover, the third cross section of FIG. 19E corresponds to a cross section taken along the line VIII-VIII of FIG. 20C.

The basic structure of the electric device 70 according the present embodiment is thus completed.

Hereafter, a step of bonding solder bumps as the external connection terminals 29 (see FIG. 17) to portions such as the top surface of the first drive electrode 71 exposed from the opening portion 46a is performed. However, details of this step are omitted.

Next, description is given of a comparative example of the present embodiment.

Figure 21:
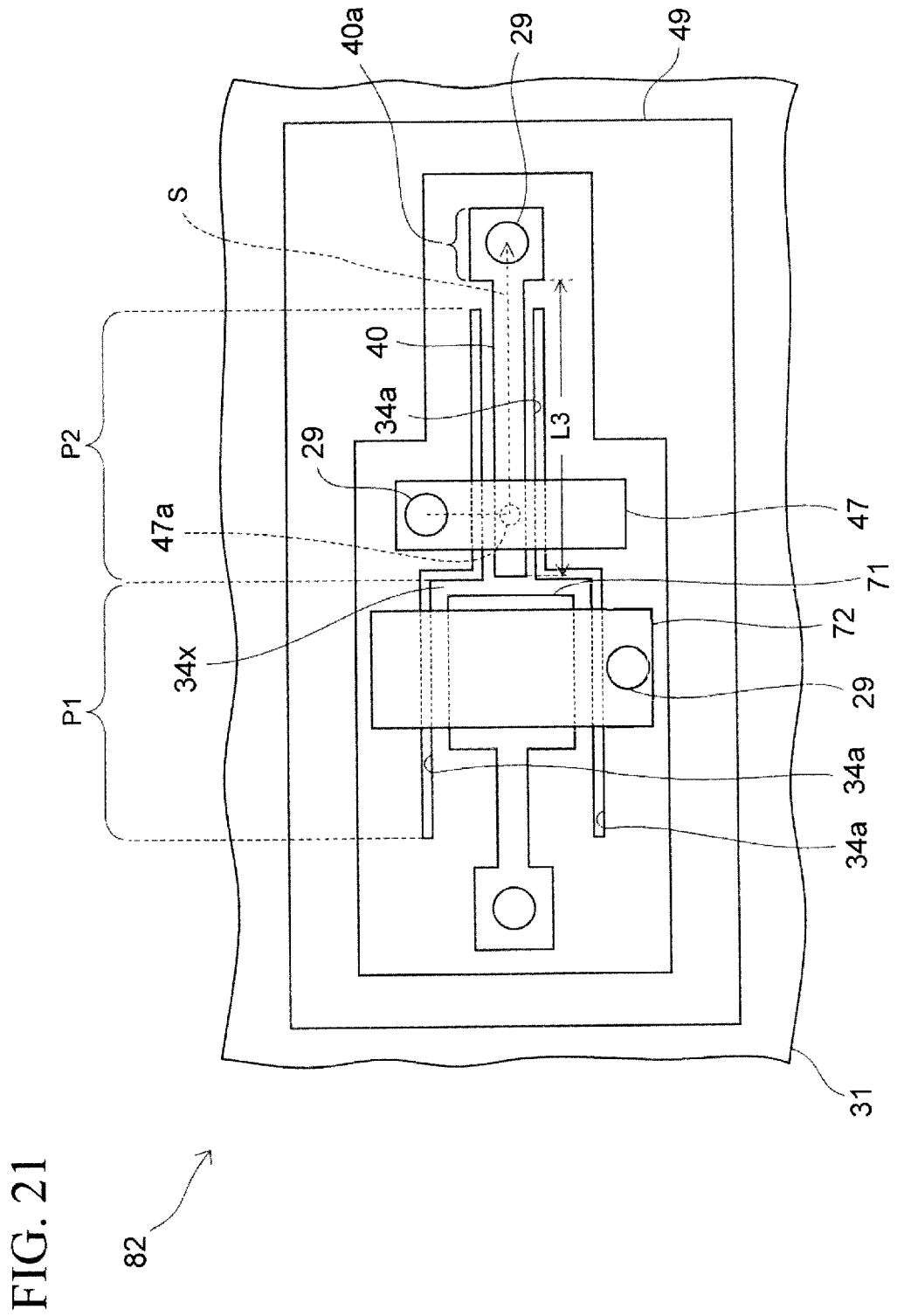
FIG. 21 is a plan view of an electric device according to a comparative example of the fifth embodiment.

FIG. 21 is a plan view of an electric device 82 according to the comparative example. In FIG. 21, the same elements as those in the present embodiment are denoted by the same reference numerals used in the present embodiment and description thereof is omitted below.

As illustrated in FIG. 21, the electric device 82 is a MEMS switch of such a type that the beam 34x is bent by an electrostatic attraction generated between the first drive electrode 71 and the second drive electrode 72. Moreover, the electric device 82 includes a ground pattern 49 forming a coplanar structure together with the conductive pattern 40 described above.

However, the electric device 82 is different from the present embodiment in that there is no bridge electrode 45, first ground electrode 46, and second ground electrode 48 illustrated in FIG. 17.

Since there is no bridge electrode 45, the RE signal S flowing through the conductive pattern 40 cannot be led out to the outside across the slit 34a in the electric device 82. Hence, there is a need to provide a pad 40a at a terminal end of the conductive pattern 40 and lead out the RE signal S from the pad 40a.

Accordingly, the conductive pattern 40 extends over the entire length of the second portion P2 of the beam 34x, and the length L3 of the conductive pattern 40 thus is longer than that in the present embodiment. The electrical resistance of the conductive pattern 40 thereby increases and a loss occurs in the RF signal S.

Sixth Embodiment

In each of the first to fifth embodiments, the length of the conductive pattern 40 is reduced by providing the bridge electrode 45, and the loss of the RE signal is thereby suppressed.

In a sixth embodiment, description is given of an electric device which does not require bridge electrode 45.

Figure 22:
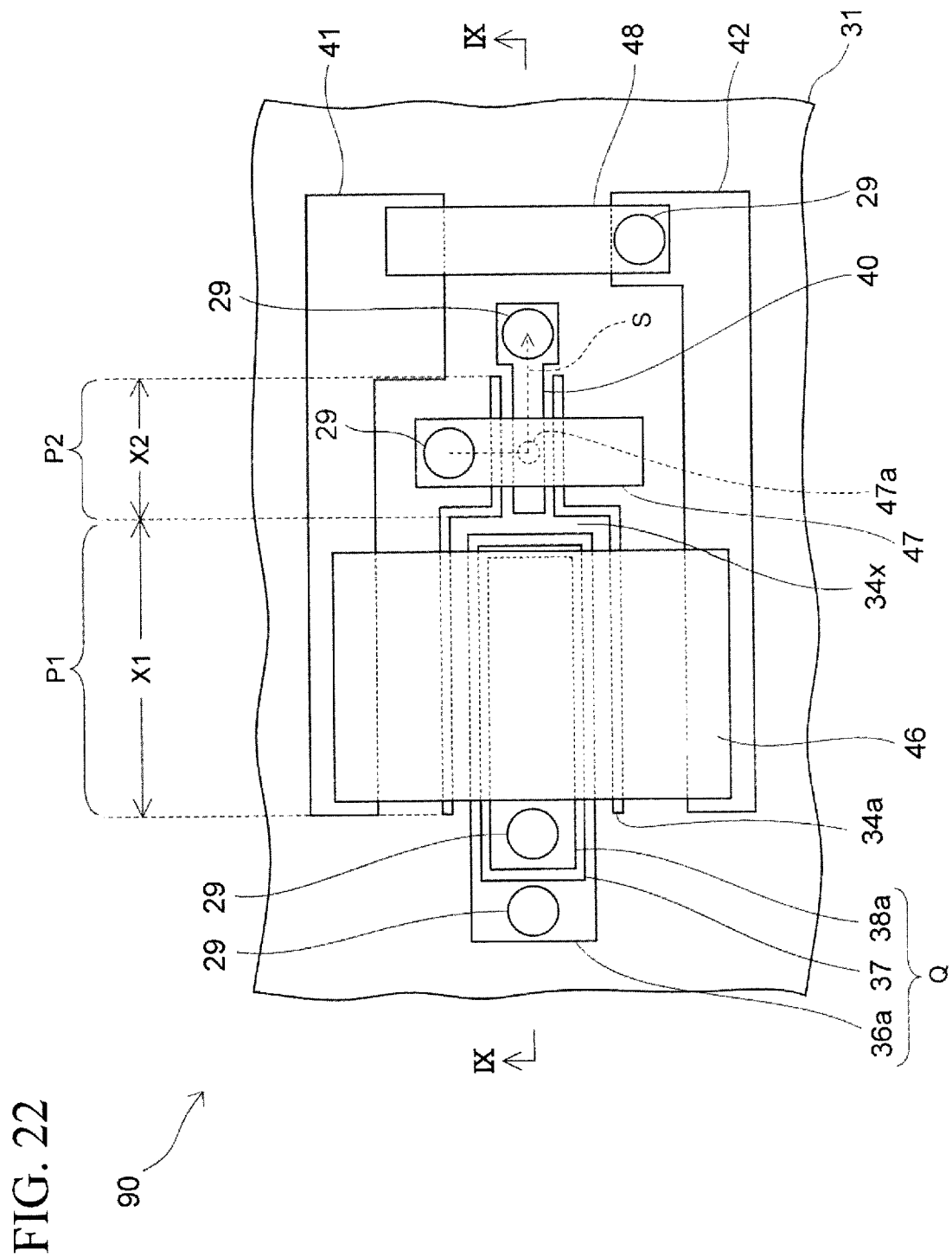
FIG. 22 is a plan view of an electric device according to a sixth embodiment.

FIG. 22 is a plan view of an electric device 90 according to the sixth embodiment. In FIG. 22, the same elements as those described in the first to fifth embodiments are denoted by the same reference numerals used in these embodiments and description thereof is omitted below.

The electric device 90 is a MEMS switch in which a beam 34x is bent by a drive force of a piezoelectric element Q as in the first embodiment, but is different from the first embodiment in that there is no bridge electrode 45 (see FIG. 5).

Figure 23:
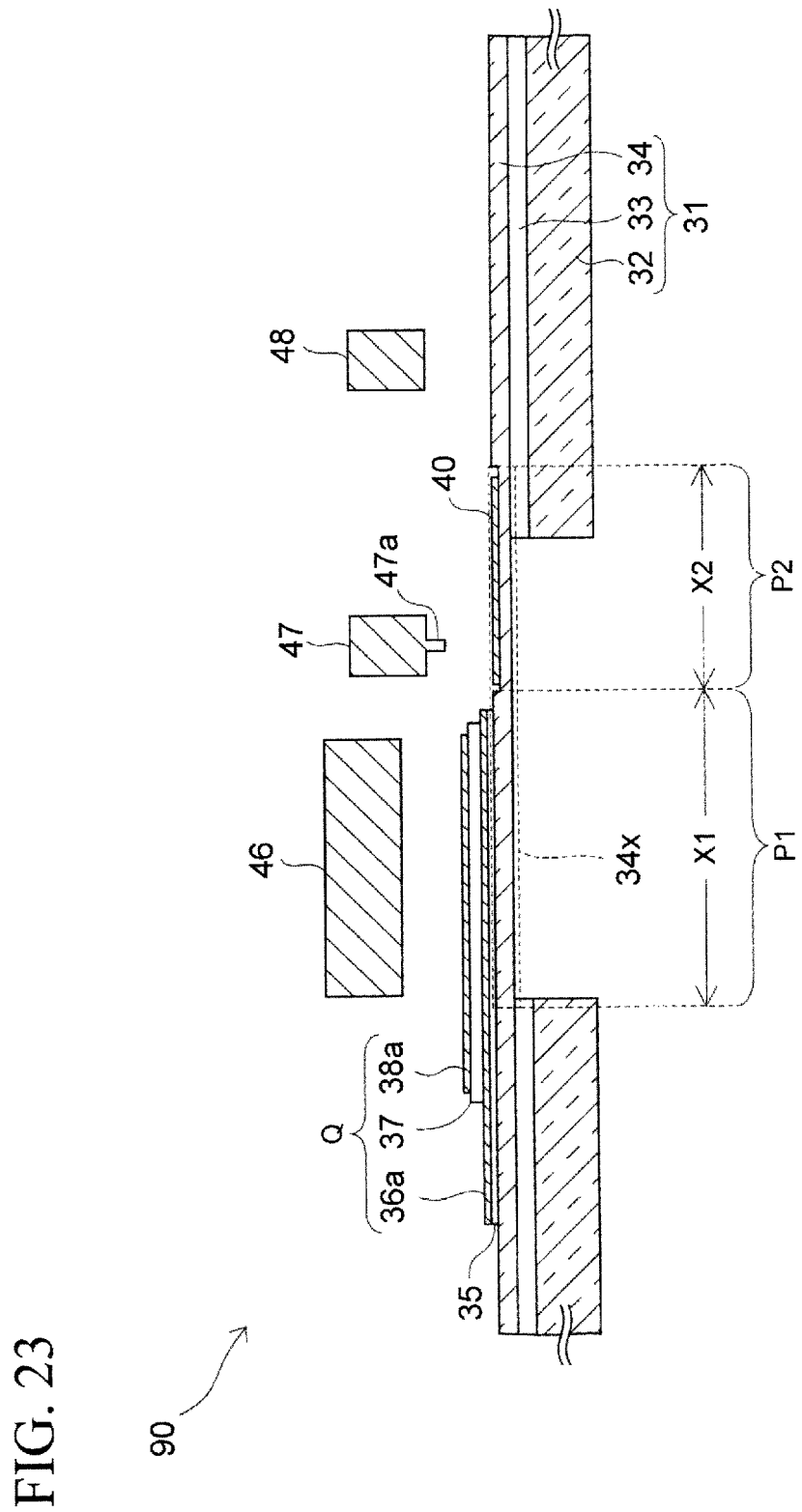
FIG. 23 is a cross-sectional view taken along the line IX-IX of FIG. 22.

FIG. 23 is a cross-sectional view taken along the line IX-IX of FIG. 22.

As illustrated in FIG. 23, in the present embodiment, the thickness of the beam 34x is made smaller in a second portion P2 than in a first portion P1, and thereby the stiffness of the second portion P2 is made lower than that of the first portion P1.

By making the stiffness lower in this manner, the length X2 of the second portion P2 required to maintain the flexibility of the beam 34x can be made smaller than the length X1 of the first portion P1. As a result, the length of a conductive pattern 40 formed in the second portion P2 can be made smaller than that in the first embodiment. Hence, a loss in the RF signal S due to the electrical resistance of the conductive pattern 40 can be suppressed even when the RF signal S is not lead out by the bridge electrode 45 (see FIG. 5).

There are no particular limitations on a method of reducing the thickness of the beam 34x in the second portion P2.

Figure 24:
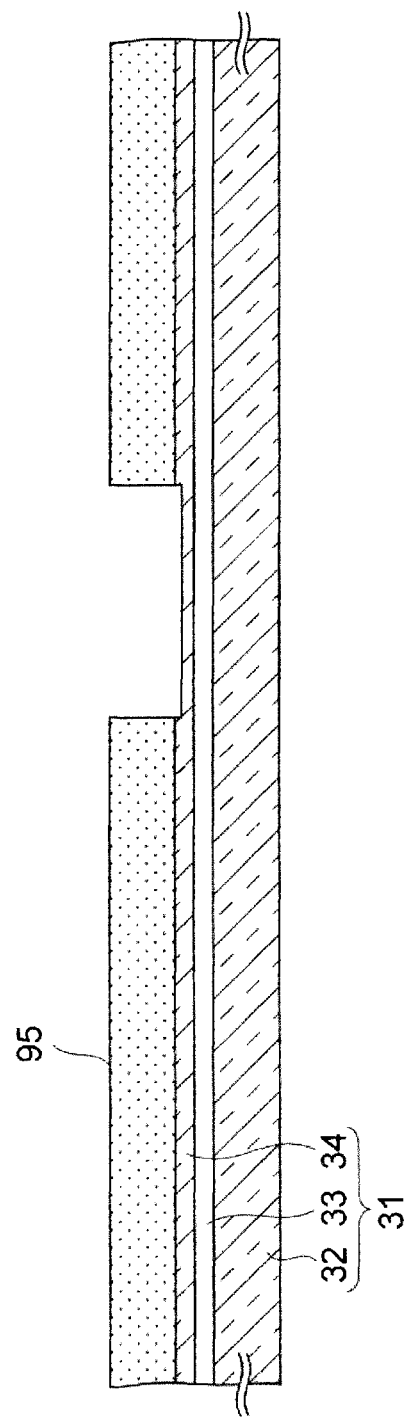
FIG. 24 is a cross-sectional view illustrating an example of a method of reducing the thickness of a beam in the sixth embodiment.

FIG. 24 is a cross-sectional view illustrating an example of a method of reducing the thickness.

In this method, a fourth resist pattern 95 is formed on a surface of a base member 31 before the step of FIG. 9A in the first embodiment. Then, a silicon film 34 is half-etched by RIE using a $SF_6$ gas as an etching gas, with the fourth resist pattern 95 used as a mask, and the thickness of a portion the silicon film 34 corresponding to the second portion P2 is thereby reduced to about 10 µm.

Thereafter, the steps of FIGS. 9B to 9M described in the first embodiment are performed, and a basic structure of the electric device 90 illustrated in FIG. 23 is thereby completed.

Description has been given above of the electric device 90 of such a type that the beam 34x is bent by the piezoelectric element Q. However, the present embodiment is not limited to this type.

Figure 25:
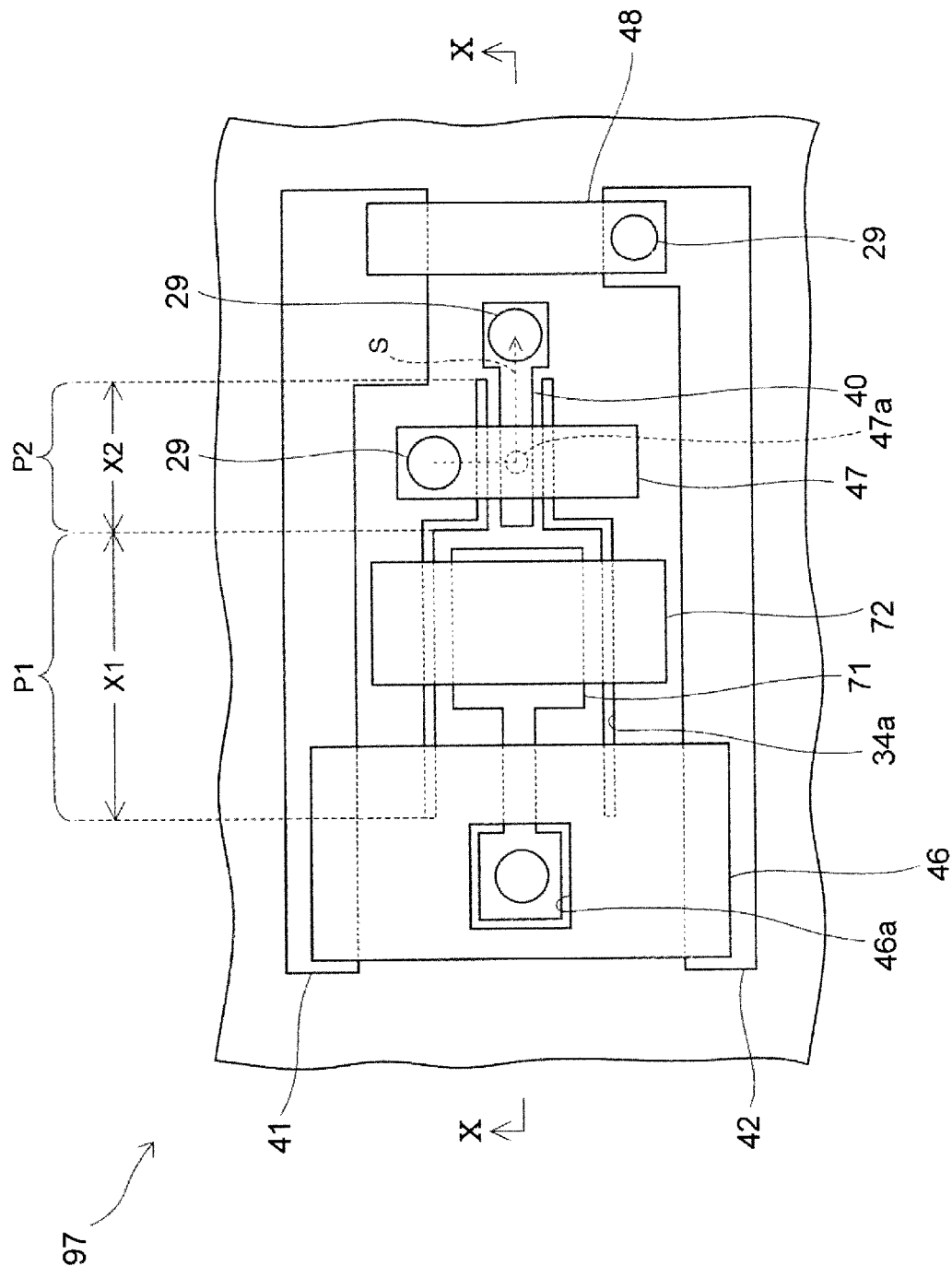
FIG. 25 is a plan view illustrating another example of the electric device according to the sixth embodiment.
Figure 26:
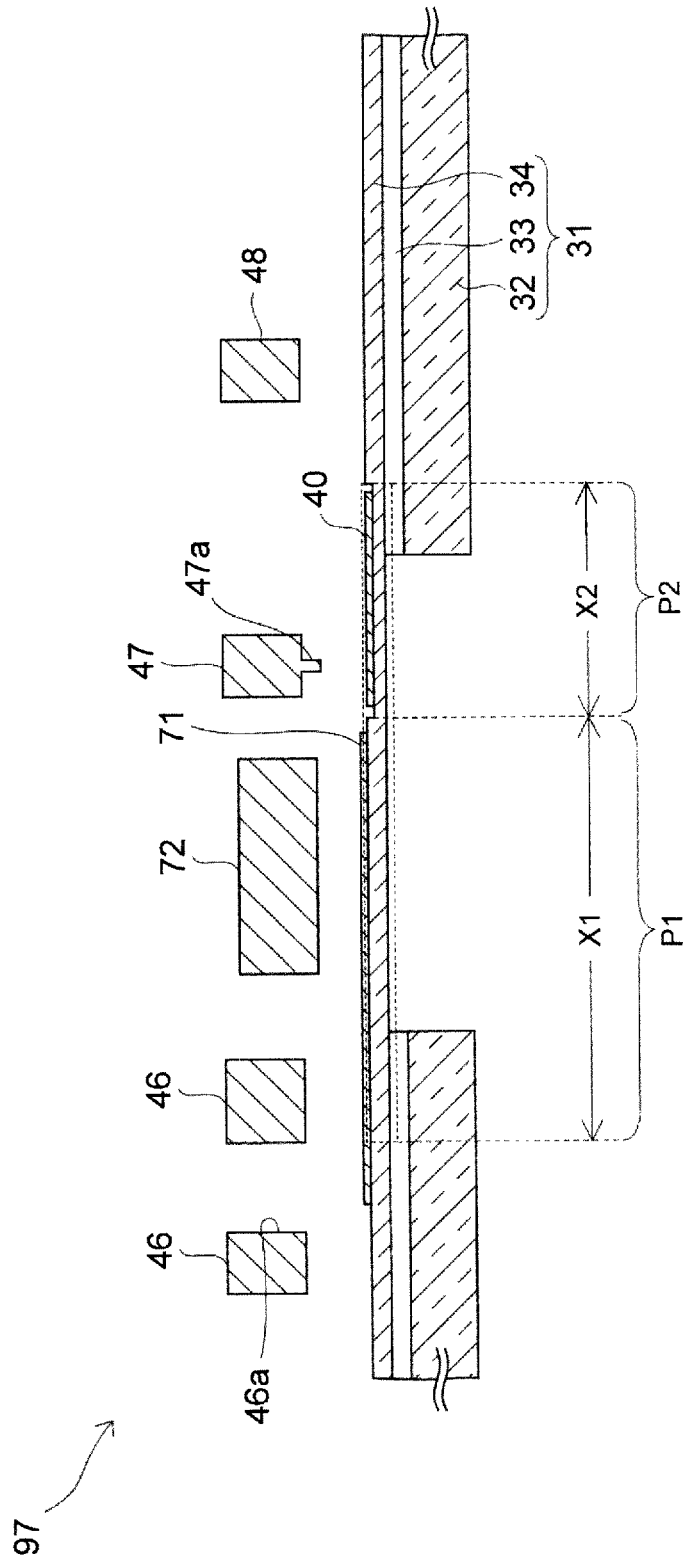
FIG. 26 is a cross-sectional view taken along the line X-X of FIG. 25.

FIG. 25 is a plan view of an electric device 97 of such a type that the beam 34x is bent by the electrostatic attraction. FIG. 26 is a cross-sectional view taken along the line X-X of FIG. 25. In FIGS. 25 and 26, the same elements as those described in the first to fifth embodiments are denoted by the same reference numerals used in these embodiments and description thereof is omitted below.

In the electric device 97, as in the fifth embodiment, the beam 34x is bent by an electrostatic attraction generated between a first drive electrode 71 and a second drive electrode 72 and the switch is thereby turned on.

As illustrated in FIG. 26, also in the electric device 97, the length X2 of the second portion P2 can be made smaller than the length X1 of the first portion P1 by making the thickness of the beam 34x smaller in the second portion P2 than in the first portion P1. This makes it possible to suppress the loss in the RF signal S due to the electrical resistance of the conductive pattern 40 without the bridge electrode 45, as in the electric device 90 (see FIG. 23) described above.

All examples and conditional language provided herein are intended for the pedagogical purpose of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention has been described in detail, it should be understood that the various changes, substitutions, and alterations could be made hereto without departing from the spirit and scope of the invention.

What is claimed is:

1. An electric device comprising:
   a base member;
   a beam elastically deformable to bend upward and having an outline partially defined by a slit formed in the base member;
   a conductive pattern provided on a top surface of the beam;
   a contact electrode provided above the conductive pattern, the contact electrode coming into contact with the conductive pattern;
   a bridge electrode elastically deformable, the bridge electrode connecting the conductive pattern and a portion of the base member outside the outline;
   a ground pattern formed in a portion of the base member outside the outline; and
   a ground electrode extending above the beam from the ground pattern,
   wherein the beam has one end and another end, the one end and the other end being both fixed to the base member, and the beam includes a first portion close to the one end portion and a second portion close to the other end portion,
   wherein a width of the first portion is wider than a width of the second portion and
   wherein the other end portion is provided with a narrow portion having a width narrower than the width of the second portion.

2. An electric device comprising:
   a base member;
   a beam elastically deformable to bend upward and having an outline partially defined by a slit formed in the base member;
   a conductive pattern provided on a top surface of the beam;
   a contact electrode provided above the conductive pattern, the contact electrode coming into contact with the conductive pattern;
   a bridge electrode elastically deformable, the bridge electrode connecting the conductive pattern and a portion of the base member outside the outline;

a ground pattern formed in a portion of the base member outside the outline; and a ground electrode extending above the beam from the ground pattern, wherein the beam has one end and another end, the one end and the other end being both fixed to the base member, and the beam includes a first portion close to the one end portion and a second portion close to the other end portion, wherein a width of the first portion is wider than a width of the second portion, wherein the first portion of the beam is provided with a piezoelectric element formed by stacking a lower electrode, a piezoelectric film, and an upper electrode in this order, and wherein the ground electrode is located above the upper electrode.

3. An electric device comprising:

a base member;

a beam elastically deformable to bend upward and having an outline partially defined by a slit formed in the base member;

a conductive pattern provided on a top surface of the beam;

a contact electrode provided above the conductive pattern, the contact electrode coming into contact with the conductive pattern;

a bridge electrode elastically deformable, the bridge electrode connecting the conductive pattern and a portion of the base member outside the outline;

a ground pattern formed in a portion of the base member outside the outline; and a ground electrode extending above the beam from the ground pattern, wherein the beam has one end and another end, the one end and the other end being, both fixed to the base member, and the beam includes a first portion close to the one end portion and a second portion close to the other end portion, wherein a width of the first portion is wider than a width of the second portion, and wherein an extending direction of the bridge electrode is orthogonal to an extending direction of the slit under the bridge electrode.

4. The electric device according to claim 3, wherein an extending direction of the conductive pattern is orthogonal to the extending direction of the bridge electrode.

5. An electric device comprising:

a base member;

a beam elastically deformable to bend upward and having an outline partially defined by a slit formed in the base member;

a conductive pattern provided on a top surface of the beam;

a contact electrode provided above the conductive pattern, the contact electrode coming into contact with the conductive pattern;

a bridge electrode elastically deformable, the bridge electrode connecting the conductive pattern and a portion of the base member outside the outline;

a ground pattern formed in a portion of the base member outside the outline; and a ground electrode extending above the beam from the ground pattern, wherein the beam has one end and another end, the one end and the other end being both fixed to the base member, and the beam includes a first portion close to the one end portion and a second portion close to the other end portion, wherein a width of the first portion is wider than a width of the second portion, and wherein the base member is an SOI (Silicon On Insulator) substrate in which a silicon oxide film and a silicon film are formed on a silicon substrate in that order, and the beam is a portion of the silicon film, and is formed by removing the silicon substrate and the silicon oxide film under the beam.

6. An electric device comprising:

a base member;

a beam elastically deformable to bend upward and having an outline partially defined by a slit formed in the base member;

a conductive pattern provided on a top surface of the beam;

a contact electrode provided above the conductive pattern, the contact electrode coming into contact with the conductive pattern;

a bridge electrode elastically deformable, the bridge electrode connecting the conductive pattern and a portion of the base member outside the outline;

a ground pattern formed in a portion of the base member outside the outline; and a ground electrode extending above the beam from the ground pattern, wherein the beam has one end and another end, the one end and the other end being both fixed to the base member, and the beam includes a first portion close to the one end portion and a second portion close to the other end portion, wherein a width of the first portion is wider than a width of the second portion an wherein the contact electrode has a single protrusion coming into contact with the conductive pattern.

7. An electric device comprising:

a base member;

a beam elastically deformable to bend upward and having an outline partially defined by a slit formed in the base member;

a conductive pattern provided on a top surface of the beam;

a contact electrode provided above the conductive pattern, the contact electrode coming into contact with the conductive pattern; and a bridge electrode elastically deformable, the bridge electrode connecting the conductive pattern and a portion of the base member outside the outline, wherein the beam has one end and another end, the one end and the other end being both fixed to the base member, and the beam includes a first portion close to the one end portion and a second portion close to the other end portion, and wherein a width of the first portion is wider than a width of the second portion.

* * * * *